United States Patent
Ito et al.

(10) Patent No.: US 7,493,531 B2
(45) Date of Patent: Feb. 17, 2009

(54) SEMICONDUCTOR MEMORY DEVICE AND REFRESH PERIOD CONTROLLING METHOD

(75) Inventors: Yutaka Ito, Tokyo (JP); Takeshi Hashimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 416 days.

(21) Appl. No.: 11/152,762

(22) Filed: Jun. 15, 2005

(65) Prior Publication Data

US 2005/0281112 A1 Dec. 22, 2005

(30) Foreign Application Priority Data

Jun. 18, 2004 (JP) .............................. 2004-181734

(51) Int. Cl.
*G06F 11/00* (2006.01)
*H03M 13/00* (2006.01)

(52) U.S. Cl. ........................................ 714/708; 714/754

(58) Field of Classification Search ................. 714/708, 714/754
See application file for complete search history.

(56) References Cited

U.S. PATENT DOCUMENTS

| | | | | |
|---|---|---|---|---|
| 4,648,073 A | * | 3/1987 | Kenney | 365/149 |
| 4,672,583 A | * | 6/1987 | Nakaizumi | 365/222 |
| 4,935,900 A | | 6/1990 | Ohsawa | |
| 5,265,102 A | * | 11/1993 | Saito | 714/743 |
| 6,154,408 A | | 11/2000 | Yuh | |
| 6,199,139 B1 | * | 3/2001 | Katayama et al. | 711/106 |
| 6,201,733 B1 | * | 3/2001 | Hiraki et al. | 365/185.08 |
| 6,384,448 B1 | | 5/2002 | Forbes | |
| 6,560,725 B1 | * | 5/2003 | Longwell et al. | 714/54 |
| 6,667,925 B2 | | 12/2003 | Kobayashi et al. | |
| 6,697,992 B2 | * | 2/2004 | Ito et al. | 714/763 |
| 6,707,745 B2 | | 3/2004 | Mizugaki | |
| 6,735,726 B2 | * | 5/2004 | Muranaka et al. | 714/708 |
| 6,950,364 B2 | * | 9/2005 | Kim | 365/222 |
| 7,051,260 B2 | * | 5/2006 | Ito et al. | 714/754 |
| 7,171,605 B2 | * | 1/2007 | White | 714/763 |
| 7,193,918 B2 | * | 3/2007 | Harrand et al. | 365/222 |
| 7,216,198 B2 | | 5/2007 | Ito et al. | |
| 2002/0004921 A1 | * | 1/2002 | Muranaka et al. | 714/704 |
| 2004/0221098 A1 | | 11/2004 | Ito et al. | |

FOREIGN PATENT DOCUMENTS

JP 64-032489 7/1987

(Continued)

OTHER PUBLICATIONS

Patent Abstract, TW 00550567, Sep. 2003, 1 pg.

(Continued)

*Primary Examiner*—Joseph D Torres
(74) *Attorney, Agent, or Firm*—Foley & Lardner LLP

(57) ABSTRACT

Disclosed is a memory device including an error rate measurement circuit and a control circuit. The error rate measurement circuit, carrying a BIST circuit, reads out and writes data for an area for monitor bits every refresh period to detect an error rate (error count) with the refresh period. The control circuit performs control for elongating and shortening the refresh period so that a desired error rate will be achieved. The BIST circuit issues an internal command and an internal address and drives the DRAM from inside. The BIST circuit writes and reads out desired data, compares the monitor bits to expected values (error decision) and counts the errors.

8 Claims, 57 Drawing Sheets

FOREIGN PATENT DOCUMENTS

| | | |
|---|---|---|
| JP | 11-213659 | 8/1999 |
| JP | 2002-025299 A | 1/2002 |
| JP | 2002-025299 A | 2/2002 |
| JP | 2002-056671 A | 2/2002 |
| JP | 2002-056671 A | 2/2002 |
| JP | 2004-152378 A | 5/2004 |
| JP | 2004-152378 A | 5/2004 |
| WO | WO 9107756 A * | 5/1991 |

OTHER PUBLICATIONS

Patent Abstract, TW 00548648, Aug. 2003, 1 pg.

Y. Katayama et al., Fault-Tolerant Refresh Power Reduction of DRAMs for Quasi-Nonvolatile Data Retention, 1999 International Symposium on Defect and Fault Tolerance in VLSI Systems, pp. 311-318.

* cited by examiner

SEMICONDUCTOR MEMORY DEVICE AND REFRESH PERIOD CONTROLLING METHOD

FIELD OF THE INVENTION

This invention relates to a semiconductor memory device and, more particularly, to a semiconductor memory device in need of refresh for data retention, and to a refresh period controlling method.

BACKGROUND OF THE INVENTION

Capability of pause refresh of a memory device is widely changed responsive to ambient temperature. Temperature compensation of a self-refresh period is the technique of controlling the refresh period for coping with the temperature dependency of the capability of pause refresh. If the technique of temperature compensation of the self-refresh period is brought to completion, it is possible to reduce the data retention current by one order of magnitude at ambient temperature as compared with that at elevated temperatures (upper limit of the guaranteed temperature). It is however technically difficult to design a circuit showing extensive temperature traceability suited to a device, such that there lacks an efficacious circuit designing technique.

The temperature compensation technique, so far proposed, may roughly be classified into the following two types:

(a) the technique in which temperature-dependent device parameters, such as the current of the MOS transistor, are detected by some means and converted into the refresh period, for example, the thermometer technique of monitoring the temperature to control the refresh period, or the technique of monitoring the cell leakage characteristics to control the refresh period, termed the 'cell leakage monitor system' in the present specification; and (b) the technique of directly reading and writing plural memory cells that are for data retention, and determining the refresh period from the status of occurrence status of error.

Recently, a mobile SDRAM (Synchronous DRAM), characterized by the low data retention current, has been presented to the market. The products of this type basically uses the above technique (a).

Typical of the above technique (a) is the thermometer (temperature sensor) circuit. The refresh period controlling method, employing the thermometer circuit (thermometer system), detects e.g. minute temperature change of the level of the reference voltage (Vref) in a temperature sensor device (temperature sensor) and, based on the prevailing temperature information, elongates the refresh period by carrying out frequency-division, such as by doubling, quadrupling and the like, of the fundamental period of a timer counter.

However, since the variations in the level of generation of the reference voltage (Vref) in a thermometer are inherently independent of variations in the capability of refresh of the DRAM device, it is mandatory with the temperature system to match (trim) these two sorts of the variations at plural temperature points. This poses a serious problem in a wafer test step (the step of applying a probe on a pad of a wafer chip to carry out an electrical test of a die).

In the practical manufacturing process for DRAM devices, only temperature trimming for two points (high temperature point and low temperature point) is feasible from the perspective of test cost. As a result, fails tend to be produced at a mid temperature range so that a large operating margin needs to be provided as the variations are taken into account. With the result that it is not possible to achieve marked temperature traceability.

On the other hand, the techniques pertinent to (b) are disclosed in e.g. the Patent Publications 1 and 2 and in Non-Patent Publication 1.

The Patent Publication 1 discloses a standby current decreasing method (data retention current decreasing method) in a memory system employing the DRAM. As shown in FIG. 1 herein, a computer includes, in addition to a DRAM, an error correction encoding circuit and an error correction decoding circuit (error correction circuit), a refresh interval control circuit, a timer 2, a temperature sensor, a refresh circuit and a timer 1.

As the configuration of a DRAM device, provided with the ECC (error-checking and correction) encoding circuit and the decoding circuit as well as the refresh period control circuit, reference is made to the description of Patent Publications 2 and 4, indicated hereinbelow.

The operation of the system shown in FIG. 1 will now be described. First, in the usual write (WRITE) operation, the encoding operation is carried out at all times, so that parity data are written in a parity domain provided from the outset in the DRAM. Alternatively, on entry to the data retention operating mode (self refresh mode), data of all bits are read to an ECC encoding circuit to generate and write parity data of the entire data. Refresh period control is then exercised in accordance with the algorithm shown in FIG. 2.

During the operation for data retention, all bit refresh pause (e.g. refresh interval) is repeated. Each time all bit refresh is carried out, all data are read to an error correction decoding circuit (error correction circuit) to carry out error detection and correction. If there is no error, the refresh period is extended (elongated) by a preset multiplication factor k1 and if there is any error, the row in error is copied. Or, the refresh period is shortened in dependence upon the number of errors. By repetition of the above sequence of operations, the refresh period is allowed to converge to an optimum value.

On the other hand, the number of errors detected (error rate) is controlled to be within the gamut of the error correction capability of the error correction decoding circuit (error correction circuit).

In the Non-Patent Publication 1, this technique was substantiated by evaluation on a real operating apparatus. This technique, if grasped as being equipped in a DRAM, may be summarized as follows:

In a data retention mode, carrying an on-chip ECC (realizing low power dissipation by power control), all data are read to an ECC decoding circuit to monitor the error rate.

The refresh cycle is shortened and elongated in case the error rate measured is higher and lower than a preset value, respectively. By so doing, refresh period temperature compensation may be enabled as the error rate is maintained at lower than the ability for correction.

As the configuration for variably controlling the refresh period based on the error rate of the memory cells, there is disclosed in e.g. Patent Publication 4 a semiconductor integrated circuit device including an error rate selection circuit booted for the data retention mode to read plural data held in a dynamic memory circuit to generate check bits for error detection and correction for storage in a supplementary memory circuit. Plural items of data and check bits associated therewith are read by an ECC circuit, at a constant refresh period, to effect error detection and correction. A first detection signal indicating the absence of error is integrated, a second detection signal, indicating the presence of error, is integrated with a weighting factor larger than that of the first detection signal, the detection signals are summed in the manner of subtracting the first stated integrated value, the refresh period is elongated a predetermined length of time when the integrated value exceeds a predetermined value and the refresh period is shortened a predetermined length of time when the integrated value has become smaller than a predetermined value.

There is also known a configuration in which, with the data retention mode, tail bits inferior in the capability (real power) of pause refresh are corrected for errors by the ECC circuit and masked, and the refresh period is elongated up to one second to realize the saving in power usage (Patent Publication 2). As for temperature dependency of pause refresh characteristics (temperature dependency of tail bits and normal bits), see the above Patent Publication 2 (e.g. FIGS. 10 and 11). As for details of the ECC circuit (ECC codec), as later described, reference is made to e.g. Patent Publication 3.

[Patent Publication 1]
JP Patent Kokai Publication JP-A-11-213659
[Patent Publication 2]
JP Patent Kokai Publication JP-P2002-056671A
[Patent Publication 3]
JP Patent Kokai Publication JP-2004-152378A
[Patent Publication 4]
JP Patent Kokai Publication JP-P2002-025229A
[Non-Patent Publication 1]
DFT'99 (1999 IEEE International Symposium on Defect and Fault Capability in VLSI systems), pp. 311-318

SUMMARY OF THE DISCLOSURE

As a technique for temperature compensation, provided with an on-chip ECC circuit, realizing a data retention mode of low power dissipation through power control, realizing the refresh of a long refresh period, reducing the data retention current and aimed to reduce the current consumption further in a low temperature range, there may further be provided a thermometer circuit and a cell leakage monitor circuit. The data retention mode in which the on-chip ECC circuit is provided, the parity information for the memory cells is generated in the ECC circuit to carry out power control, and in which the cells suffering from refresh defects are restored by error correction by the ECC circuit to achieve refresh with a long refresh period and low current consumption, is herein termed a 'super self refresh mode', abbreviated below to SSR mode. Regarding the semiconductor memory device, having an on-chip ECC circuit, realizing the data retention mode of the low power dissipation through power control, and also realizing the refresh with a long refresh period, see the description of the above Patent Publication 2.

The above techniques have their proper merits and demerits, such that, for realization of the data retention current of the order of 10 μA (ambient temperature), new temperature compensation techniques must be re-examined, beginning from their principles.

Accordingly, it is an object of the present invention to provide a semiconductor memory device and a refresh period controlling method in which there is exploited a temperature compensation technique whereby marked reduction in the data retention current may be achieved.

The present invention which attains the above and other objects may be summarized as follows.

A semiconductor memory device in accordance with one aspect of the present invention comprises a memory array including a plurality of memory cells which are in need of refresh operations for data retention, a circuit for writing preset data in a plurality of predetermined memory cells, termed monitor cells, in the memory array, a circuit for performing control for reading data from the plural monitor cells, in which the predetermined data have been written, when a preset period equal to or shorter than the refresh period has lapsed, and a circuit for comparing the data read from the monitor cell to the preset data to measure an error count or an error rate and for variably controlling the refresh period based on measured results of the error count or the error rate.

In the semiconductor memory device according to the present invention, the refresh is self-refresh, and the refresh period is controlled so that the error count or error rate as measured during the self-refresh will be within a desired setting range.

The semiconductor memory device of the present invention further comprises an error correction circuit, and the refresh being self-refresh. The self-refresh period may be controlled so that the error count or error rate as measured during the self-refresh will be within a range correctable by the error correction circuit.

The semiconductor memory device of the present invention may further comprise a BIST (built-in self test) circuit for generating an internal command and an internal address for writing and reading of preset data for the monitor cell and for controlling the comparison with expected value data.

In the semiconductor memory device according to the present invention, the monitor cells are provided in a monitor area provided separately from a usual memory area in the memory array, and the error count or the error rate is obtained by writing physical or logical data '1' in the monitor area, by reading out the '1' data from the monitor cells at a period equal to or shorter than the refresh period, and by observing the read data.

In the semiconductor memory device according to the present invention, the monitor area may have an unused area of a redundancy restoration memory.

In the semiconductor memory device according to the present invention, the monitor cells may be memory cell for one or more words selected by a word line distinct from word lines provided in a usual memory area.

A semiconductor memory device in accordance with another aspect of the invention includes a storage device having stored therein an internal address of the monitor cell. The monitor cell is accessed by the internal address from the storage device during writing and reading of data for the monitor cell. In the semiconductor memory device in another aspect of the invention, the period of measuring the error count or the error rate is set so as to be shorter than the refresh period for improving temperature follow-up characteristics.

In the semiconductor memory device according to the present invention, when the measured error count or error rate has exceeded the desired set value, error correction decoding for the memory array is carried out to lower the error rate to a desired set value. Control is managed for enabling all errors to be ultimately corrected by the decoding operation at the time of exiting from the data retention mode.

The semiconductor memory device according to the present invention further includes an ECC (error-checking and correction) encoding/decoding circuit. Data of the memory array is read at the time of entry to a data retention mode, the error detection correction encoding/decoding circuit generating check bits for error detection and correction for storage in a preset check area. The refresh period is set to a longer value within the range allowed for error generation by an error correction operation employing check bits. The ECC encoding/decoding circuit performs error bit correction and decoding, using the check bits, before returning to the normal operation in exiting from the data retention mode.

The semiconductor memory device according to the present invention further comprises an ECC (error-checking and correction) encoding/decoding circuit. Data of the memory array is read, at the time of entry to a data retention operation mode, the error detection correction encoding/decoding circuit generating check bits for error detection and correction and storing the check bit generated in a check area. Then, (A1) an expected value data '1' is written in the monitor cell;

(A2) all cells of the memory array are refreshed;

(A3) the operation is paused during the refresh time (at least a portion of the internal power supply circuit is turned off);

(A4) the internal power supply circuit is turned on and data is read from the monitor cell and compared with the expected value data '1' to measure an error; and (A5) when the error rate is larger than a preset upper limit value, the refresh period is shortened, whereas, when the error rate is not larger than a preset lower limit value, the refresh period is elongated and, when the error rate is intermediate between the preset upper and lower limit values, the refresh period is not changed.

The operations from (A1) to (A5) are repeated until exiting from the data retention mode. When exiting from the data retention mode, error correction is carried out in the error detection correction encoding/decoding circuit before proceeding to the normal operation.

In the semiconductor memory device according to the present invention, control of the self-refresh period may be such that several bits or more inferior in the capability of pause refresh to the usual memory area are used as monitor cells. These several bits, inferior in the capability of pause refresh to the usual memory area, are obtained by carrying out the restoration by pause refresh for M or more bits and by selecting, out of these bits, approximately M/10 having the worst capability. The more the number of the monitor bits, the higher is the precision in error rate judgement. In actuality, M is 50 or more bits.

A method for controlling the refresh period for a semiconductor memory device, in another aspect of the present invention, comprises the steps of writing expected value data in a plurality of memory cells in a memory array including an array of memory cells, each being in need of a refresh operation for retention of data, reading data from the plural memory cells, in which the expected value data have been written, at a period equal to or shorter than the refresh period, comparing the read data to the expected value data to measure an error count or an error rate, and variably controlling the refresh period based on measured results of the error count or error rate for elongating, shortening or maintaining the refresh period.

The meritorious effects of the present invention are summarized as follows.

According to the present invention, the memory cells, in which the expected value data have been written, are read with a period equal to or shorter than a refresh period, and compared with the expected value data to measure an error count or an error rate, and in which the refresh period is variably controlled based on the measured results, so that temperature compensation characteristics may be improved appreciably.

Moreover, according to the present invention, the trimming adjustment in the manufacture process may be dispensed with to reduce the cost, while stable temperature adjustment may be achieved extremely readily.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
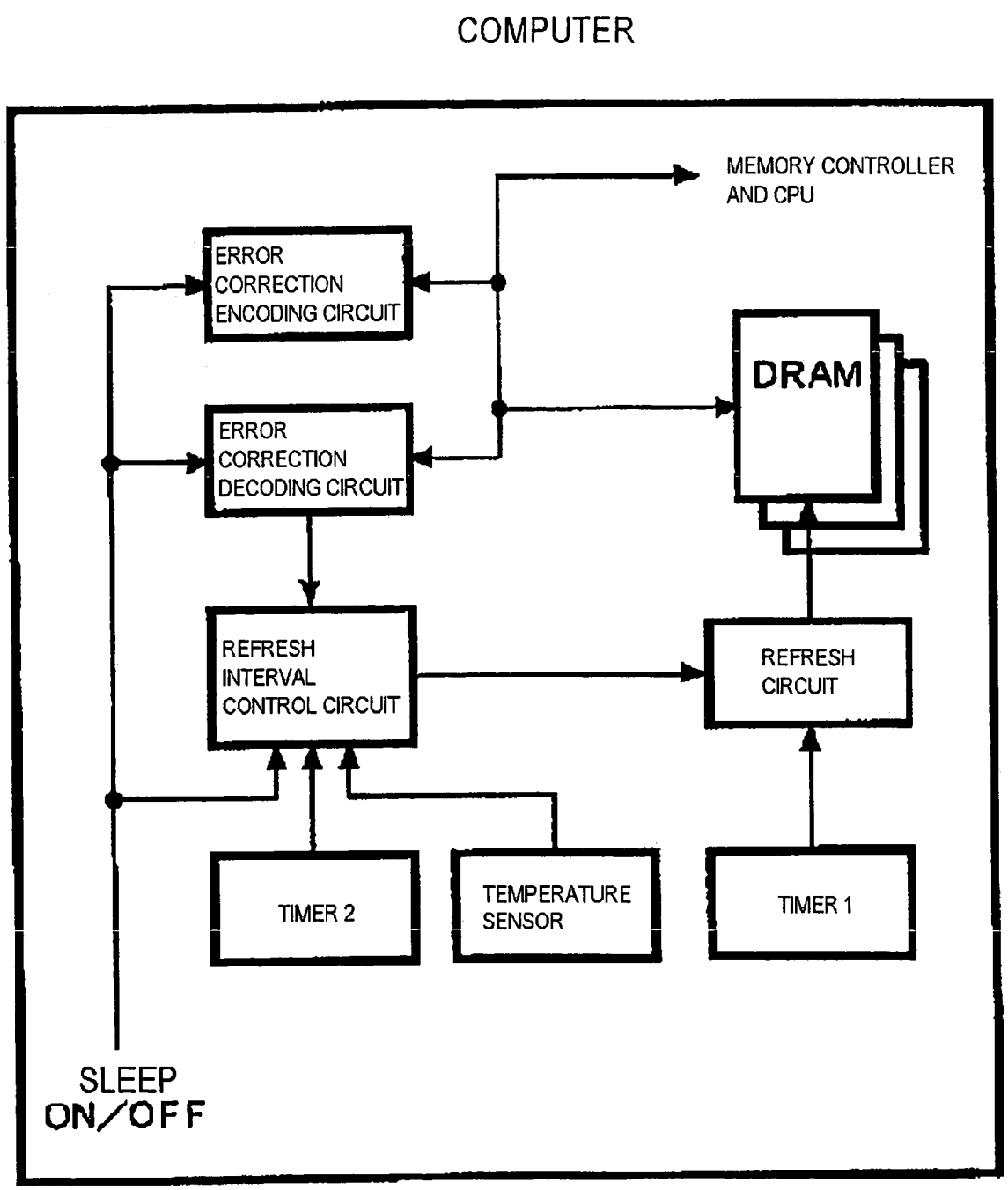
FIG. 1 is an overall block diagram showing a conventional technique (JP Patent Kokai Publication JP-A-11-213659).

Referring to the drawings, the present invention will be described hereinafter in more detail. According to the present invention, temperature control for the refresh period is as shown in FIG. 4A. The semiconductor memory device according to the present invention is briefly described below. In a memory array, there is provided a monitor bit area 103 having plural monitor cells. During the refresh operation, expected value data, such as physical '1', are written in the monitor bit area 103. After a pause for a period equal to or shorter than the refresh period, data are read from the monitor cells. An error rate counting circuit 105 compares the read data with the expected value data to judge whether or not the read data coincides with the expected value data (pass/fail decision). Then, error signal is counted. A frequency divider circuit 106 is controlled in dependence upon the measured error count (error rate) to control variably the period of a refresh timer.

A refresh address generating circuit 107, responsive to an output of the frequency divider circuit 106 (refresh trigger signal), generates and outputs a refresh address for refreshing the memory cells selected by the refresh address. That is, the data signal of the memory cell, output by the sense amplifier to a bit line, is amplified, and the so amplified data signal is re-stored from the bit line to the memory cell.

According to the present invention, described above, it is unnecessary to read check bits by the ECC decoding circuit to detect errors for measuring the error rate, contrary to the case of the aforementioned Patent Publication 2.

Figure 4B:
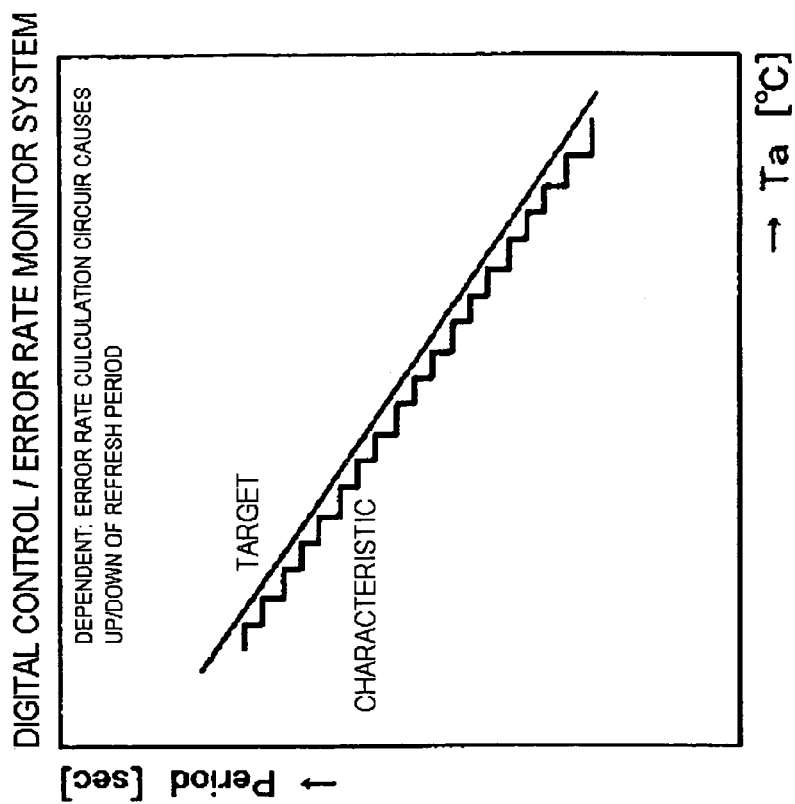
FIGS. 4A and 4B illustrate the refresh temperature compensation system of the present invention.
Figure 4A:
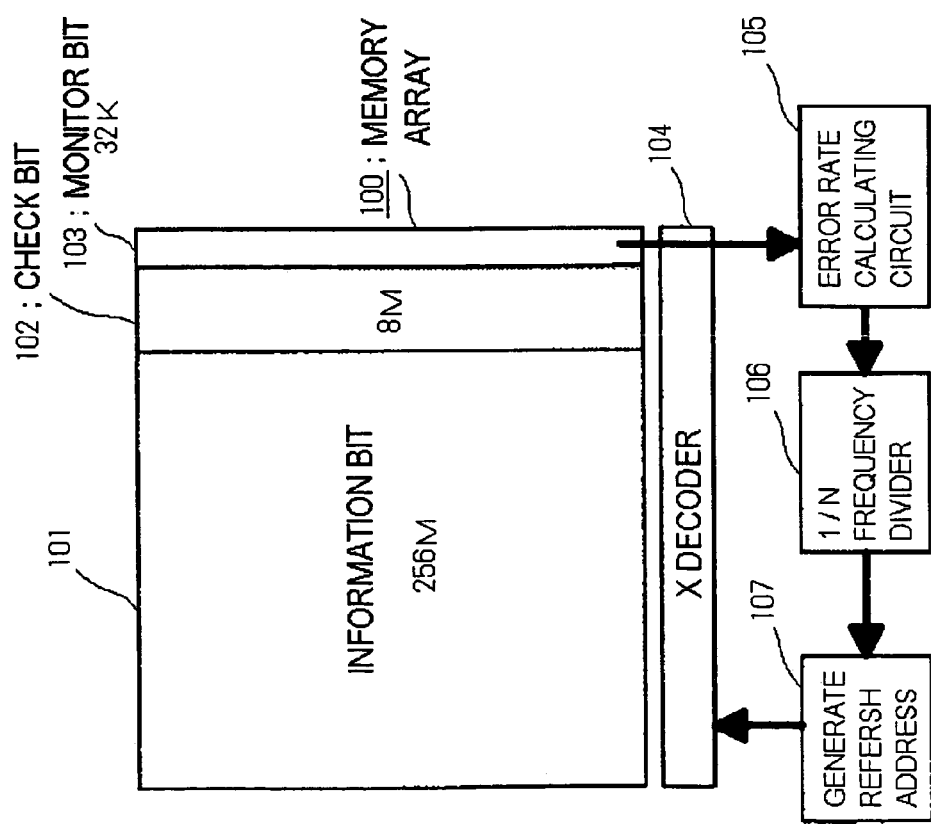

FIG. 4B shows the relationship between the refresh period of the present invention, and the temperature Ta° C., in which the refresh period is controlled up/down by the error rate counting circuit 105. It is unnecessary to match the periods, as in the temperature check system, while the reference voltage Vref is also unnecessary. According to the present invention, the data retention current (power supply current during the data retention mode) may, for example, be not larger than 10 μA.

The present invention may be applied to a usual self refresh system in which encoding/decoding by the ECC encoding/ decoding is not carried out. In this case, approximately 10 refresh restoration bits may be monitored.

By way of comparison with the present invention, such a configuration in which the refresh period is controlled by a cell leakage monitor circuit, referred to below as the 'cell leakage monitor system', and such a configuration in which the refresh period is controlled based on temperature detection, referred to below as the 'temperature system', will now be described. FIG. 3A illustrates an analog controlled cell leakage monitor system. In this figure, the temperature and the period (time) are plotted on the abscissa and on the ordinate, respectively. In the cell leakage monitor system, a pseudo memory cell, employing e.g. the reverse bias leakage of the PN junction, is used, and the refresh period (long period) showing temperature dependency is directly generated from the cell leakage characteristics.

As a principle, the refresh period may be adjusted continuously (that is, in an analog method), depending on the temperature. Moreover, during the time other than the refresh period, only the cell leakage monitor circuit may be in operation, so that the data retention current not larger than 10 μA may be achieved. Although the cell leakage monitor system may be said to be an ideal system, it exhibits marked process dependency, while the matching of the period (absolute value) is of a problem.

Figure 3B:
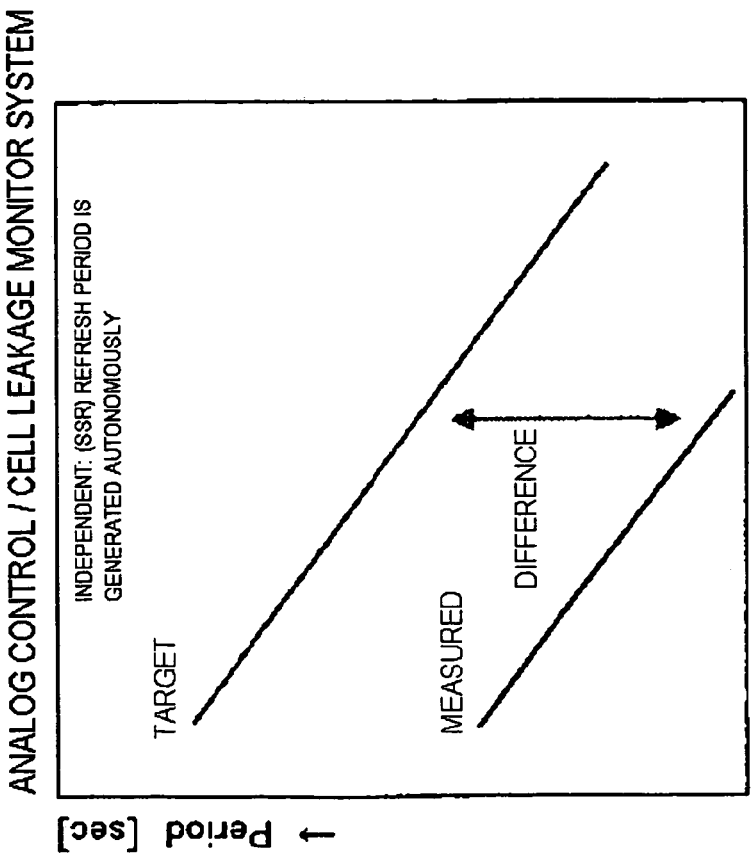
FIG. 3B illustrates the refresh temperature compensation system employing a thermometer.
Figure 3A:
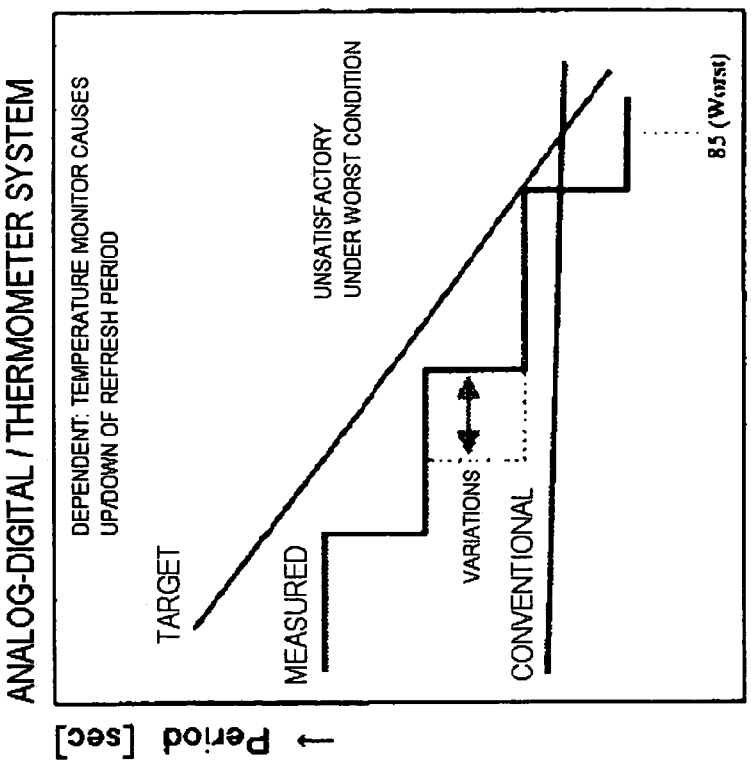
FIG. 3A illustrates the refresh temperature compensation system, employing a cell leakage monitor.

FIG. 3B illustrates the thermometer system. In the thermometer system, there is provided a thermometer circuit adapted for voltage conversion of the PN junction forward bias leakage current into voltage for detecting the temperature from the resulting potential. The temperature is detected at several points and the refresh period is digitally controlled to twice, four times and so forth of the usual refresh period.

Hence, the temperature points detected depend on samples and are in need of trimming, even though there is no risk of the period being severely beside the mark. The result is that the margin of the refresh period needs to be set to a larger value, such that, in the worst high-temperature state, the refresh period tends to be shorter than in the conventional product exhibiting no temperature dependency. In addition, since the reference voltage (Vref) generating circuit and an amplifier circuit are needed at all times, it is difficult to achieve the data retention current not larger than 20 μA.

In comparison with the cell leakage monitor circuit and with the thermometer circuit, the present invention, described with reference to FIGS. 4A and 4B, has the following advantages:

The refresh period can be elongated and moreover the data retention current can be lowered to 10 μA or less. That is, the DC component of the refresh current can be lowered to 10 μA or less.

(a) If conversely the thermometer circuit is to be realized, the reference voltage (Vref) generating circuit, exhibiting temperature dependency, the reference voltage (Vref) generating circuit, not exhibiting temperature dependency, and a differential amplifier circuit for amplifying the results of comparison of the reference voltage Vref, are needed, so that the DC current is caused to flow at all times. For generating the reference voltage Vref, the data retention current equal to or larger than 20 μA is needed.

(b) According to the present invention, there is no process dependency, while trimming adjustment is scarcely needed. Consequently, stable temperature compensation may readily be achieved.

Conversely, for realizing the thermometer circuit, trimming for absorbing variations in the detected temperature is needed. In actuality, there is variation on the order of 30° C. in the detected temperature and, after trimming, there persists the variation of the order of, for example, 10° C.

The refresh capability of the device has marked temperature dependency, so that the temperature difference of 10° C. causes the refresh capability to be changed by a factor only slightly smaller than two. Thus, the refresh period has to be set to a shorter value (in a margin increasing direction). Conversely, there are occasions wherein the data retention current itself is increased as a result of the temperature compensation.

(c) Since the data of the real memory is read, and the refresh period is set depending on the state of errors, the refresh period may be elongated (adjusted) depending on the error of retention data of the memory circuit to achieve temperature compensation.

(d) However, in actuality, the configuration of reading out all data of the memory array to monitor the error state cannot be put to practical use as the technique for temperature compensation.

That is, since the error rate of the totality of data needs to be monitored, all bit READ needs to be carried out for each refresh. The base (AC component) of the data retention current is increased by a factor of two or more and hence low current consumption cannot be achieved in a high temperature range.

(e) The above problem (d) may be avoided by diminishing the memory area for monitoring the error rate. However, the error rate depends on the retention data of the area of interest. Thus, a correct value (error rate) cannot be obtained, such that refresh period setting may be random. For example, if the retention data is 0 data, no failure occurs.

The present invention improves the shortcomings of the above-described conventional cell leakage monitor or thermometer system to realize the temperature compensation system aimed to lower the power, as the merits of the two systems are exploited. Specifically, for exploiting the basic operation of the conventional technique and eliminating the shortcomings thereof, the following three requirements are added and the subject of monitoring the error rate is limited to a newly provided monitor bit area.

Referring to FIG. 4A, the memory array 100 includes information bits 101 of 256 Mbits (Megabits), check bits of 8 Mbits and monitor bits 103 of 32 Kbits (monitor cell area). According to the present invention, all cells inclusive of the monitor bits are refreshed and physical '1' is written in the monitor bits 103 per refresh. The physical '1' from each of the monitor bits is read with a period equal to or shorter than the refresh period and judged whether the read data coincides with the expected value data to decide the error rate (error count) to variably control the refresh period based on the error rate. Meanwhile, the error corresponds to failure and the error rate is equal to the value of the error count divided by the total number (number of failures/(pass+number of failures)).

The monitor cell for monitoring the error rate, according to the present invention, will now be described.

According to the present invention, data '1' is written in the monitor bit 103 during the refresh operation in the data retention mode (SSR mode) of low power dissipation. The data is read every pause refresh (power off during the pause period) to monitor the error rate. Similarly to the check bits (parity bits) 102, the monitor bit 103 can be redundancy-restored (a fail cell is replaced by a redundancy cell during wafer test) and specified address is allocated to the restored bit. There are provided a number of monitor bits 103 corresponding to the number of the memory cells connected to the word line selected by an X-decoder 104. This word line is distinct from the word line for information or check bits. Meanwhile, the monitor bits 103 are selected by the internal address (X address and Y address), generated by the BIST circuit, not shown.

Alternatively, an unused area (which passed e.g. a wafer test) of the redundancy restoration memory may be allocated as monitor bits.

The error rate calculating circuit (ERATE MONITOR) 105 is provided in parallel with the error detection correction encoding/decoding circuit (ECC CODEC) to generate write data for the monitor bits as well as to measure the error rate (number of failure bits) of the read data.

Figure 17:
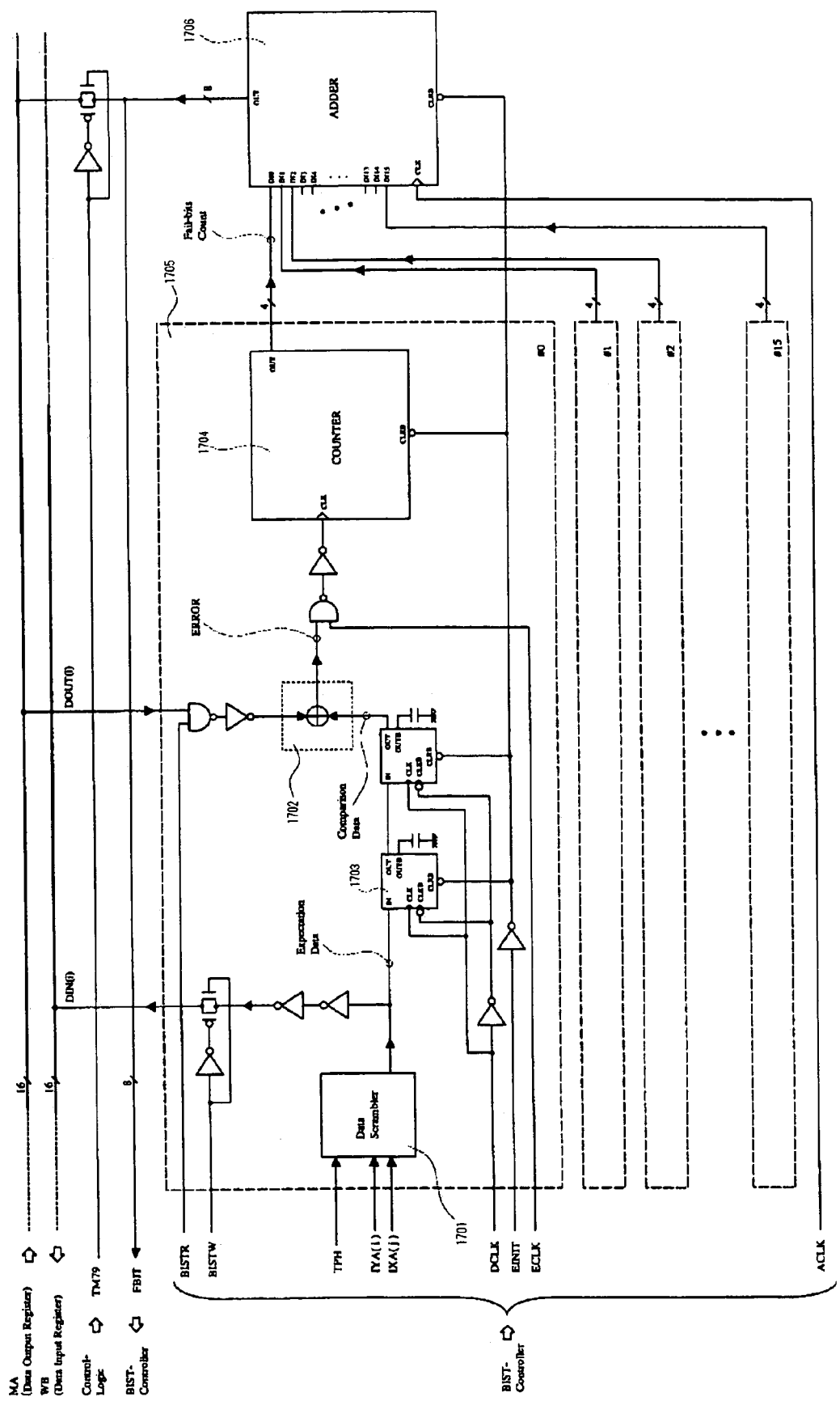
FIG. 17 is a diagram showing an illustrative configuration of an error rate calculating circuit in an embodiment of the present invention.

According to the present invention, in which the expected value compared with the read data from the monitor cell is known, the error rate calculating circuit (ERATE MONITOR) 105 may be composed by a simplified configuration composed of a counter circuit (COUNTER) and an adder (ADDER), as shown for example in FIG. 17.

In case where the present invention is applied to a DRAM, carrying the data retention mode (SSR mode) of low power dissipation, with the ECC-CODEC of 1 set/4 banks, the error rate calculating circuit (ERATE MONITOR, also referred to as an 'error monitor circuit') 105 is attached to the internal I/O bus, as is the encoding/decoding circuit (ECC CODEC). The error rate calculating circuit (ERATE MONITOR) 105 executes error rate count and write operation, in addition to the usual read and write operations.

For monitoring the error rate during the self refresh operation, the present invention includes an ECC controller (see CONTROLLER 6 of FIG. 5) generating and outputting an internal command and an internal address to an SDRAM interfacing circuit (for example a control circuit 209 of FIG. 5) and controlling the operation of the error rate calculating circuit (ERATE MONITOR) 105. This ECC controller (6 of FIG. 5) includes a BIST block controlling the BIST (built-in self test) and an ECC (error-checking and correction) block. The ECC block generates and writes parity bits in the SSR mode, an internal command and an internal address for error detection and correction, to an interfacing circuit of the SDRAM (for example, the controller circuit 209 of FIG. 5), to output a control signal (INIT, PARITY, SYNDROME and CORRECT), for example, to the ECC-CODEC.

Figure 41:
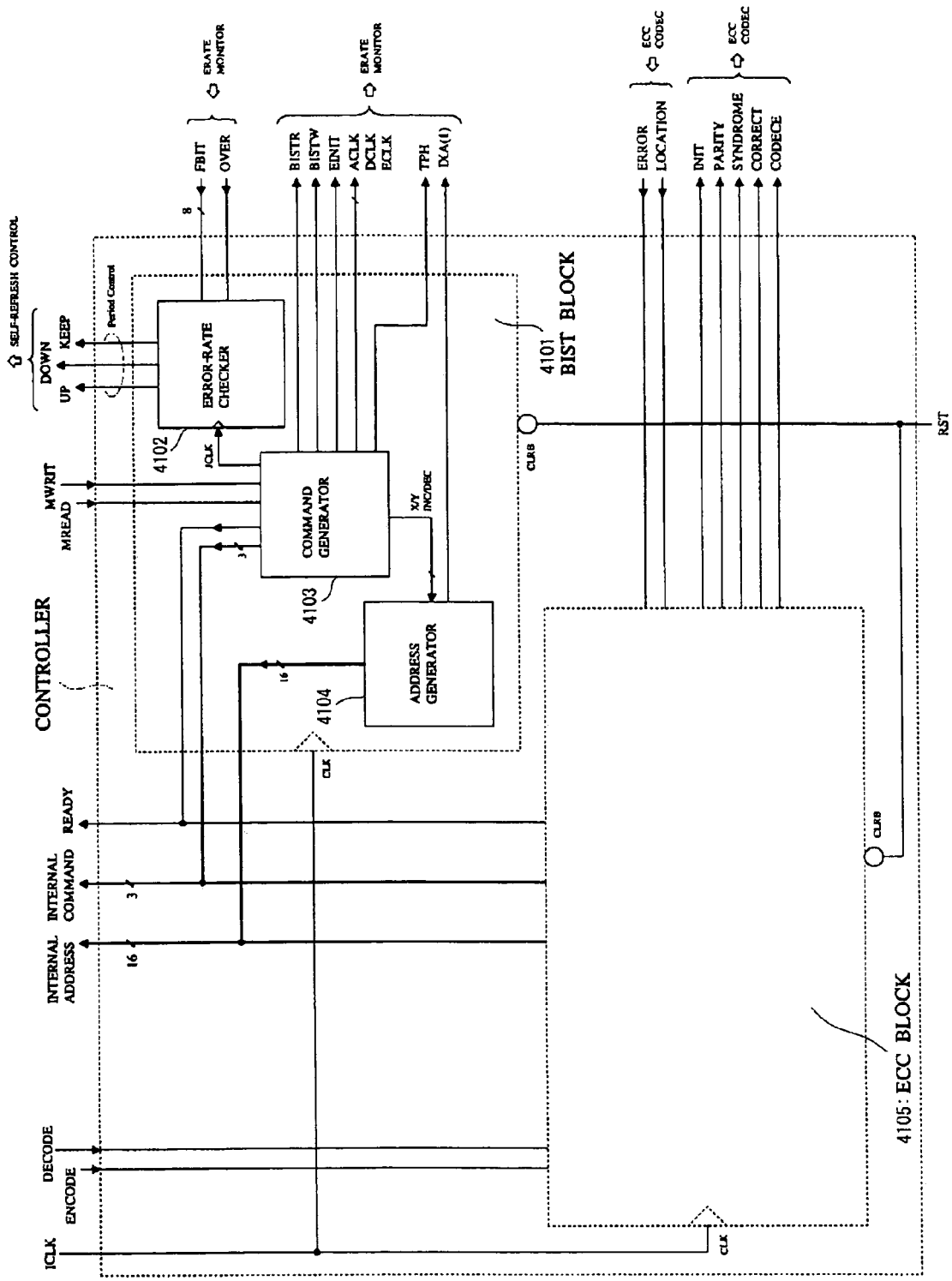
FIG. 41 is a diagram showing the configuration of an embodiment of an ECC controller carrying the monitor bit access control function (FIGS. 5 and 6-6).

The BIST circuit generates internal commands (e.g. ACT, READ, WRITE, PRE), generates an internal address of the monitor bit to output the so generated address to the interfacing circuit of the SDRAM, generates an address signal for controlling the outputting of the expected value data to the I/O bus and the sampling of the read data from the I/O bus for the error rate calculating circuit (ERATE MONITOR), for generating an address signal for generating the expected value data, and acquiring an error rate from the error rate counter circuit (ERATE MONITOR) to output a refresh period control signal (UP, DOWN, KEEP) to the refresh control circuit (see FIG. 41).

According to the present invention, in which measurement of the error count or the error rate is limited to pause refresh failure ('1' failure) of the monitor bit area, as a small capacity memory, the current consumption in monitoring the error rate is reduced to the write and read current for the small capacity memory (monitor cell). The write and read current for the monitor cell becomes negligibly smaller than the refresh current.

The monitor bit area 103 of FIG. 4A is a memory area limited to a small memory area provided independently or selected optionally, for example, an excess area of the redundancy restoration memory. For the following reason, the monitor bit area may be used for controlling the refresh period.

There is no vital difference in the probability of occurrence of tail bits of the pause refresh failure ('1' failure) of conventional products and products of many manufacturers. This probability is on the order of 0.001% in the lowest case. Thus, if the memory capacity is approximately 256 kbits or more, the error rate as necessary may be monitored with the small memory area of, for example 32 kbits. It is noted that addition of 32 Kbits of monitor bits only increases 1/(256×32)=0.12% for the 256 M cell array.

Figure 2:
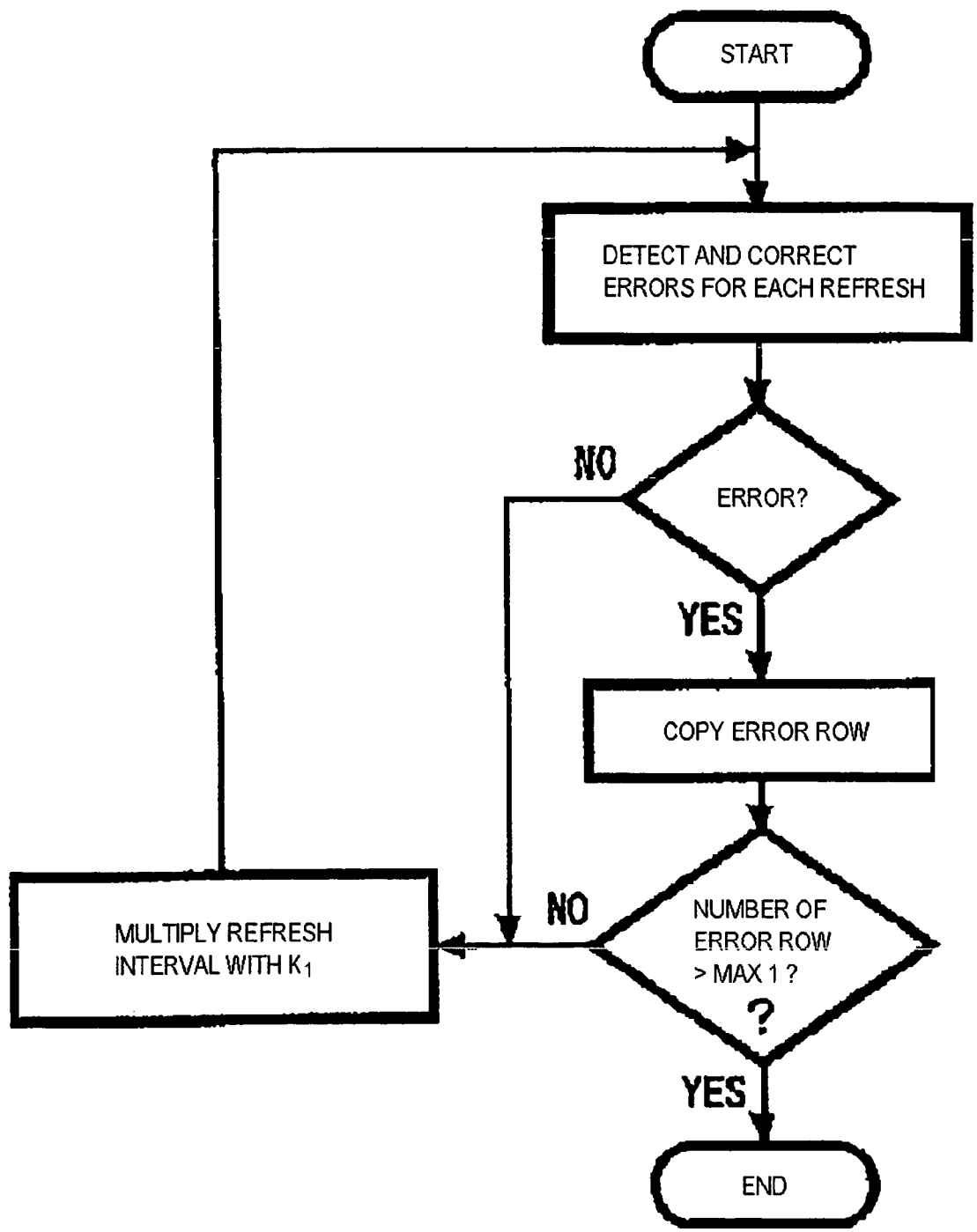
FIG. 2 shows a refresh cycle control algorithm of the related art (JP Patent Kokai Publication JP-A-11-213659).

According to the present invention, in which the error rate of data written in the memory cell is directly monitored, the ideal temperature compensation, similar to that of the aforementioned Patent Publication 1 (see FIGS. 1 and 2 hereof) may be achieved, while period matching, such as trimming, is unnecessary.

According to the present invention, the refresh period is controlled based on the error rate of the error rate calculating circuit 105, so that the reference voltage Vref is unneeded, and hence the data retention current may be set to 10 µA or less.

The present invention may also be applied to the usual self-refresh. Approximately 10 refresh restoration bits are monitored.

With the semiconductor memory device, according to the present invention, the following operation is carried out after entry of self refresh and the SSR mode on command input.

(1) All bits are read to generate parity bits (this is the same encoding operation as that of the above Patent Publication 2).

(2) '1' is written in the monitor bits and all bits are burst-refreshed.

(3) After a set pause period, '1' monitor bits are read and the error rate is counted. Meanwhile, the error rate count corresponds to the count of the number of the errors generated.

(4) If the error rate is larger than the upper limit value e1, the refresh period is made shorter than the current value. If the error rate is lower than the lower setting limit value, the refresh period is made longer than the current value. If none of the above applies, the refresh period is not changed.

The operation then goes back to (2) above to repeat the refresh and error rate monitor operation. By this control algorithm, the refresh period can be variably controlled within the range of the correction capability of the on-chip ECC, as the error rate is suppressed.

(5) On exit command input, all bits inclusive of parity bits are read, and the error bits are corrected, after which reversion is made to the normal mode (the same decoding operation as that of the aforementioned Patent Publication 2). The present invention will now be described in detail with reference to preferred embodiments thereof.

EMBODIMENT

Figure 5:
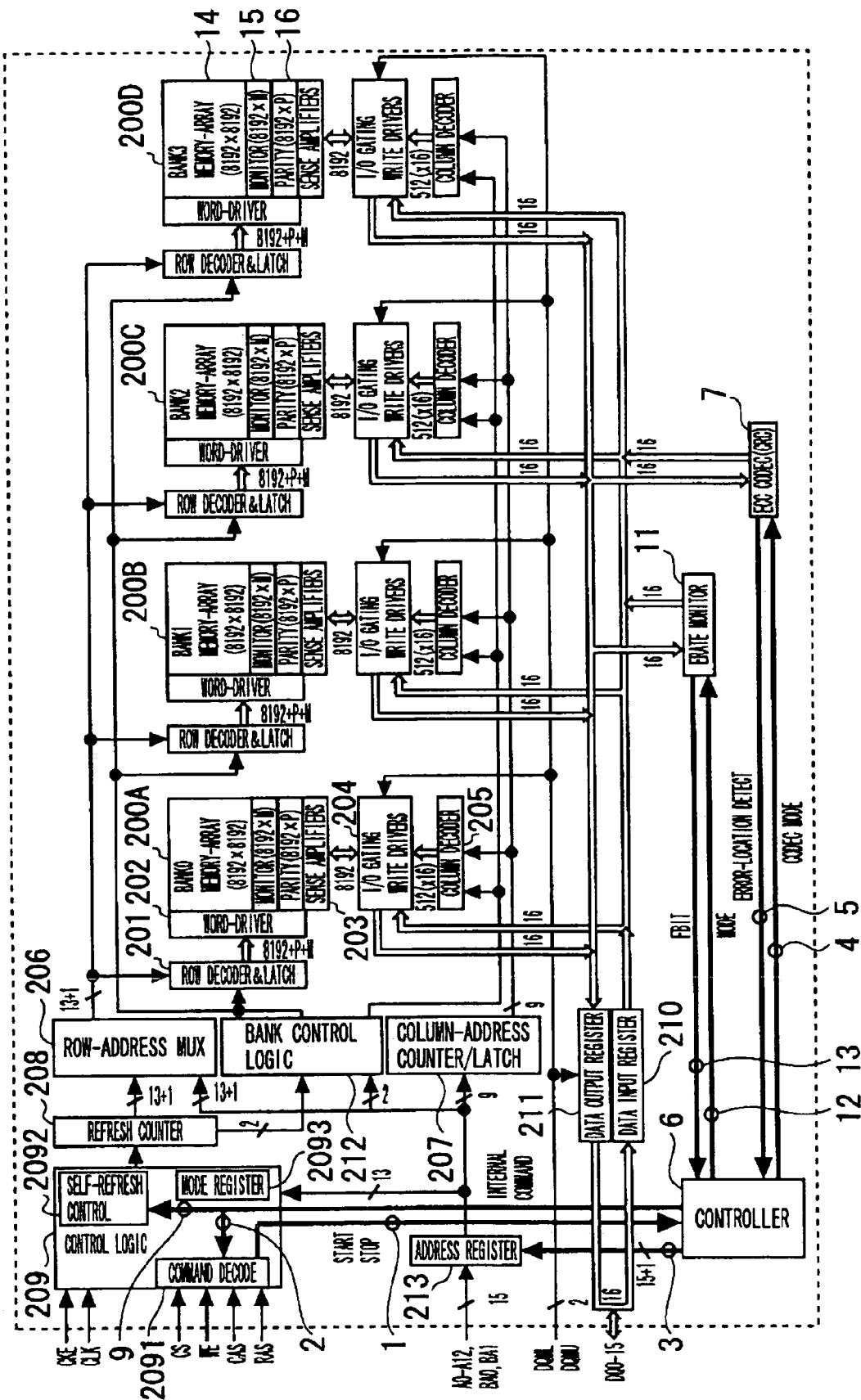
FIG. 5 is a diagram showing the overall structure of an embodiment of the present invention.

FIG. 5 is a diagram showing the configuration of a semiconductor memory device according to an embodiment of the present invention. FIG. 5 depicts an overall block diagram of an embodiment of a dynamic RAM (referred to below simply as DRAM) of the present invention. The DRAM of the present embodiment is an SDRAM (synchronous dynamic random-access memory). The SDRAM of the present embodiment has four memory arrays 200A to 200D in association with four memory banks (BANK 0 to 3). The memory arrays 200A to 200D, associated with the four memory banks 0 to 3 (BANK 0 to 3), are each provided with a matrix array of dynamic memory cells. In each memory array of FIG. 5, the gate terminal of a memory cell transistor, not shown, is connected to a word line, not shown, for providing on/off control of the memory cell transistor. One of the drain and the source of the memory cell transistor connected to a bit line, not shown, complementary from row to row, with the other of the drain and the source of the memory cell transistor being connected to one end of a capacitor for data storage. Depending on the decoded results by a row decoder 201 (ROW DECODER & LATCH), a word driver 202 drives a selected word line, not shown, of a memory array 200 to a high potential. The complementary bit line, not shown, of the memory array 200 is connected to an I/O line by a sense amplifier 203, an I/O gating write driver 204, as a column selection circuit, and a column decoder 205. The I/O gating write driver 204 includes a main amplifier and a write amplifier.

The sense amplifier 203 receives and amplifies a small potential difference, appearing on the complementary bit lines on data read from the memory cells. The I/O gating write driver 204 includes a column switch MOS transistor for selecting the complementary bit lines for connection to the complementary I/O lines. The column switch MOS transistor is selectively activated responsive to the decoded results of the column address signal by the column decoder 205. Each memory array 200 of the banks 0 to 3 is similarly provided with a row decoder (ROW DECODER & LATCH), a sense amplifier, an I/O gating write driver, and a column decoder.

The I/O line is provided common to the memory banks and connected to an output terminal of a data input register 210 and to an input terminal of a data output register 211. Terminals DQ0 to DQ15 (16 bits) are data input/output terminals that receive or output 16-bit data D0 to D15 (of which D0 to D7 are lower bytes and D8 to D15 are upper bytes). DQML and DQMU are control signals for byte controlling, used for controlling the input/output buffer. Specifically, the control signals DQML and DQMU control the input buffer for upper bytes and that for lower bytes, respectively.

Address bits A0 to A14 of 15-bit address signal, supplied from the address input terminal, are temporally held by an address register (ADD REG) 213. Out of the above address signals, entered sequentially, the row address signal for selecting the memory cell is sent to the row decoder 201 of the memory bank, via a row address multiplexer (ROW ADD MUX) 206, and thence supplied to the row decoder 201 of the memory bank. Address bits A13 and A14 are allocated to bank select signals BA0 and BA1 for selecting the memory bank. The signals BA0 and BA1 are sent to a bank control circuit (BANK CONTROL LOGIC) 212, where a selection signal for the four memory banks is generated and sent to the row decoder 201. The column address signal is held in a column address counter/latch (COLUMN ADDRESS CONTROL/LATCH) 207.

A refresh counter (REFRESH COUNTER) 208 generates a row address for self-refresh. For example, with the memory capacity of e.g. 256 Mbits, a 9 bit address signal is valid for a=8 bit configuration. The column address counter 207 is supplied with an input column address signal as preset data and, in the burst mode, specified by a command, as later described, outputs the column address signal, as the preset data, or a sequentially incremented value of the column address signal, to the column decoder 205 of each memory bank.

A control logic (CONTROL LOGIC) 209 forms an SRAM interfacing circuit and includes a command decoder (COMMANDDEC) 2091, a self-refresh control (REF CONTROL) 2092 and a mode register (MODE REGISTER) 2093. The mode register 2093 holds various operating mode information.

The command decoder 2091 receives and decodes outer and internal commands, depending on the operating mode.

The self-refresh control circuit 2092 is a self-refresh control block and performs refresh operations and period control thereof.

Only the row decoder 201 associated with the bank as specified by the bank control circuit (BANK CONTROL LOGIC) 212 is in operation to perform the word line selecting operation.

In the example shown in FIG. 5, the control circuit 209 is supplied with outer control signals, such as a clock signal CLK, a clock enable signal CKE, a chip select signal CS, a column address strobe signal CAS, a row address strobe signal RAS or a write enable signal WE, and DQM and an address signal, via a mode register 2093, and generates internal timing signals for controlling the operating mode of the SRAM and the operation of the above circuit block, based on level changes or timings of the above signals. The control circuit 209 includes input buffers, not shown, associated with the respective signals. Other outer input signals are rendered significant in synchronism with a rising edge of the internal clock signal. The chip select signal CS commands a command input cycle to be started by its low level. When the chip select signal CS is high (non-select state of the chip), other input signals have no meaning. However, the internal operations, such as memory bank selecting state or burst operation, as later described, are not affected by changes to the non-select state of the chip. The signals RAS, CAS and WE differ in function from the corresponding signals in the usual DRAM and are significant signals subject to definition of a command cycle.

The clock enable signal CKE is a signal which commands the validity of the next clock signal. When the clock enable signal CKE is high or low, the rising edge of the next clock signal is valid or invalid, respectively.

If, in the read mode, there is provided an output enable signal OE controlling the output enable for the data output register (DATA OUTPUT REGISTER) 211, the signal OE is also output to the control circuit 209. If the signal is e.g. in a high level, the output of the data output register 211 is in a high output impedance state.

The row address signal is defined by the levels of address bits A0 to A12 in a row address strobe/bank active command cycle synchronized with the rising edge of the clock signal (internal clock signal).

The address bits A13 and A14 (BA0 and BA1 of FIG. 5) are treated as bank select signals in the above row address strobe bank active command cycle. That is, one of the four memory banks 0 to 3 is selected by the combination of BA0 and BA1. The memory bank selection control may be carried out by such processing as activation only of the row decoder on the selecting memory bank side, all non-selection of the column switch circuit on the non-select memory bank, or connection of only the selected memory bank to the data input circuit 210 and to the data output register 211.

If, in an SDRAM, a burst operation is going on in a given memory bank, another memory bank is specified in the interim and a row address strobe/bank active command is supplied, the operation of the row address system in said another memory bank is enabled without affecting the operation going on in the given memory bank. Thus, except if data collision occurs in e.g. 16-bit data input/output terminal DQ0 to DQ15, the internal operation may be started in advance by issuing a pre-charge command and a row address strobe/bank active command to a memory bank different from the memory bank processed by the command being executed during execution of the command the processing of which has not as yet come to a close.

Referring to FIG. 5, the reference numeral 1 denotes a start/stop signal from an SDRAM interface to the ECC controller 6.

The reference numeral 2 is an internal command signal from the ECC controller 6 to the SDRAM interface, or a JOB end signal. For example, when the encoding or decoding operation is finished, a READY signal is output.

The reference numeral 3 is an internal address signal supplied from the ECC controller 6 to the address register 213.

The reference numeral 4 is an operation mode signal (CODEC MODE) of an ECC coding/decoding circuit (ECC CODEC) 7. The signal is controlled from the ECC controller depending on the operation. There are e.g. four modes of initialization (INIT), syndrome calculation (SYNDROME), outputting of parity bits (PARITY) and error position detection.

The reference numeral 5 is an error detection signal, and an error position detection signal (ERROR-LOCATION DETECT) from the ECC coding/decoding circuit (ECC CODEC) 7 to the ECC controller 6.

The reference numeral 6 is an ECC controller (1 set/4 banks). The ECC controller 6 outputs an internal command and an internal address to control the internal operation of the SDRAM, as well as to control the ECC codec 7 depending on the operations. The ECC controller also controls an error rate calculating circuit (ERATE MONITOR) 11, in the error monitor operation, depending on the operations.

The reference numeral 7 is an ECC coding/decoding circuit (ECC CODEC) and includes a coding circuit and a decoding circuit to carry out syndrome calculation, parity bit calculation and error detection/correction.

The reference numeral 9 is a period change signal (e.g. UP/DOWN signal) from the ECC controller 6 to the self-refresh control circuit 2092.

The reference numeral 11 is an error rate calculating circuit (ERATE MONITOR) for comparing a read data from the monitor cell with an expected value to count errors. The error rate calculating circuit also outputs the expected value as write data to the memory array.

The reference numeral 12 is an operating mode signal (MODE) to the error rate calculating circuit 11. The signal is controlled from the ECC controller 6 and has e.g. an expected value READ mode and an expected value WRITE mode. The error rate calculating circuit 11, that generates the expected value responsive to an address, is also equipped with a data scrambler (see FIG. 17).

The reference numeral 13 is an error rate (FBIT) from the error rate calculating circuit 11. It is a binary number made up of several bits and is output from the error rate calculating circuit 11 to the ECC controller 6.

The reference numeral 14 is a memory array of a bank memory and the reference numerals 15 and 16 denote a monitor field and a parity field, respectively.

The present embodiment uses a cyclic code for ECC (error-checking and correction) mounted on-chip with the DRAM, and diminishes the stand-by current due to correction of refresh malfunctions (masking) during self-refresh. Specifically, an ECC codec (coding/decoding circuit) 7 is provided for each of the memory banks 0 to 3. The ECC codec 7 receives a mode (CODEC MODE) signal from the ECC controller 6 to correct the read data for errors and notifies the error detection information (ERROR LOCATYION DETECT) to the ECC controller 6. The ECC controller 6 also performs control of varying the refresh period in the self refresh control circuit 2093 based on the error rate.

The error rate calculating circuit 11 receives a mode (MODE) signal from the ECC controller 6 and, in the error monitor mode, measures the error of the monitor bits (Fail Bit) read from the I/O gating write driver 204 to notify the ECC controller 6 of the error.

If the cyclic code is used as the ECC circuit, the circuit of the coder/decoder (CODEC) forming the ECC is also reduced in size. Consequently, the code length may be increased, and the number of parity bits may be decreased, so that the increase in the chip area by the DRAM on-chip ECC may be suppressed to the smallest possible value.

Meanwhile, plural cycles are needed for generating parity bits or for correcting error bits. Consequently, the ECC operation by the ECC codec (generation of parity bits and error detecting/correcting operation) in the present embodiment is carried out in case the access speed is not of vital concern, such as when the self refresh is entered for the data retention mode and when reversion is made to the normal mode from the self refresh mode.

In the present embodiment, low power dissipation may be achieved by restricted ECC operation. With the ECC codec 7, pause refresh malfunctioning bits may be corrected, and hence the ECC circuit is not in operation during self refresh in the data retention mode. Thus, even if error bits are generated, these error bits are allowed to stand, without being corrected, during the self refresh period in the data retention mode. It is at the time of exiting from the data retention mode to the normal mode that error detection/correction is carried out by the ECC decoding circuit of the memory array.

In the configuration shown in FIG. 5, the ECC codec 7 is configured as one set/four banks. The error rate calculating circuit 11 is connected to the I/O bus as is the ECC codec 7. The operation of counting and writing the error rate is carried out in conjunction with the read and write operations similar to those of the normal operation.

Although not shown, an internal power generating circuit is provided in FIG. 5, for generating, responsive to an operating voltage, such as VCC or VSS, supplied from the power supply terminal, a variety of internal voltages, such as a plate voltage of a memory cell, not shown, a precharge voltage, such as VDL/2, or a substrate back-bias voltage VBB, in addition to the internal boost voltage VPP, associated with the word line selection level, an internal dropped voltage VDL, associated with the sense amplifier operating voltage, and an internal dropped voltage VPERI, associated with the operating voltage of the peripheral circuits. Meanwhile, in the embodiment shown in FIG. 5, the banks 0 to 3 are provided with a memory array (8K rows×8K columns), monitor bits (M rows×8K columns) and with parity (P rows×8K columns). The row decoder 201 decodes and latches a row address 13+1 bits from the row address multiplexer 206 to drive the selected word line from the word driver 202. It is noted that the 13 bits are for the 8K words and the 13+1 bits are monitor bits for parity accessing.

Figure 6:
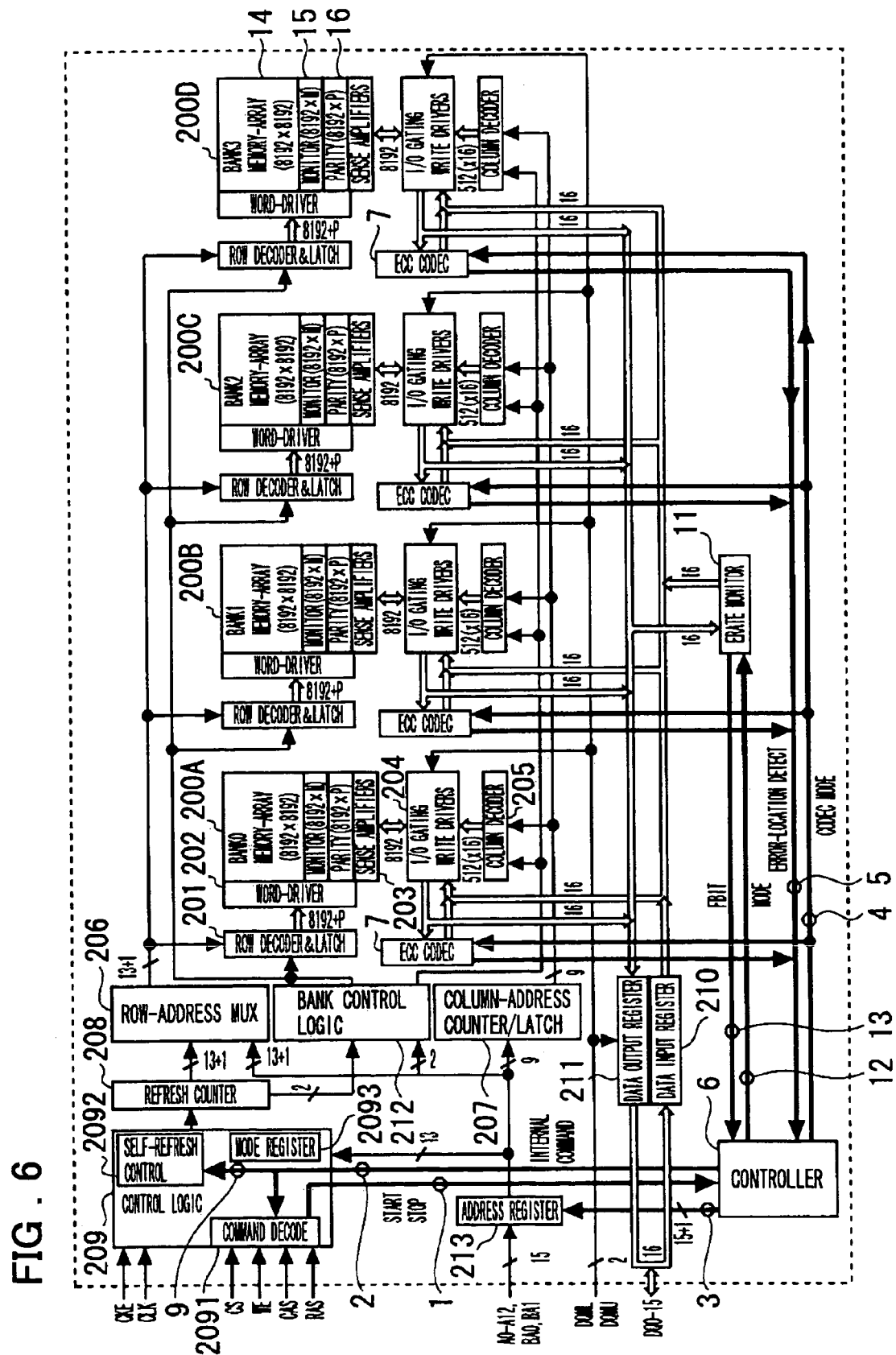
FIG. 6 is a diagram showing the overall structure of another embodiment of the present invention.

FIG. 6 shows the configuration of a memory device of a modification of the present invention. Referring to FIG. 6, the DRAM of the ECC coding/decoding circuit 7 (1 set/1 bank) comprises the error rate calculating circuit 11. Although the error rate calculating circuit 11 is similar to that shown in FIG. 5, it may be provided on each bank, as is the ECC coding/decoding circuit 7 of FIG. 6. In this case, the read and write operations may be carried out simultaneously for the four banks, in order to reduce the operating time.

For storage of the monitor bits, a separate memory is needed, as is the memory for parity bits.

When an unused area of the redundancy restoration memory is used for the monitor bits, the area that may be arranged for the area of the monitor bits differs from chip to chip. Thus, one set is provided on the internal I/O bus, as shown in FIG. 6, and read and write operations, similar to those for the normal operation, are carried out to monitor errors.

Figure 7:
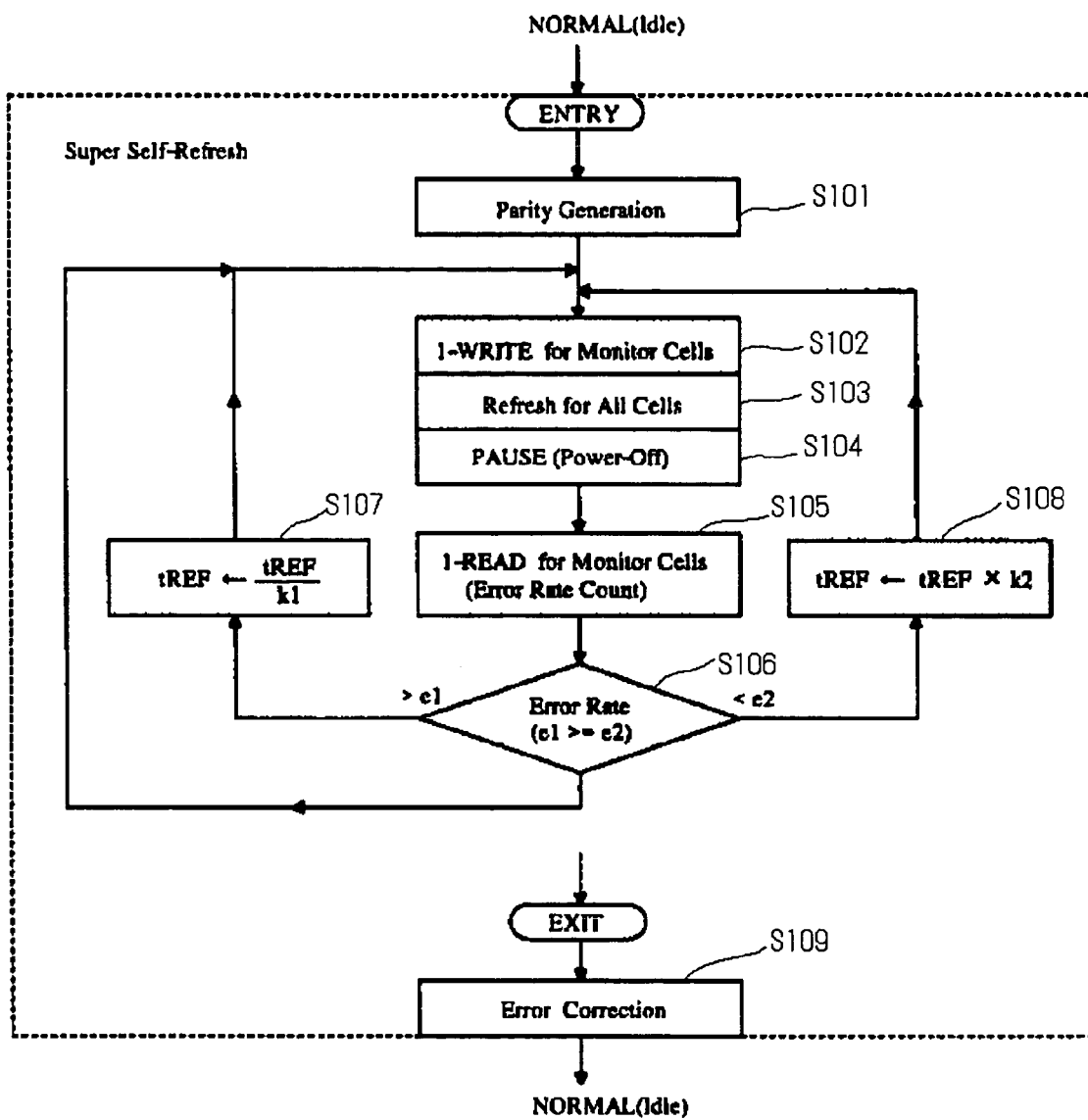
FIG. 7 is a flowchart showing the refresh period control algorithm of an embodiment of the present invention.

FIG. 7 depicts a flowchart for illustrating the refresh period control algorithm of the present embodiment. In the sequence of operations of FIG. 7, the simple processing of monitoring the error rate with the refresh period is used. In the present embodiment, generation of parity bits of the ECC codec (7 of FIG. 5) or correction of error bits is carried out at the time of entry to a super self-refresh mode or of exiting from the super self-refresh mode.

The super self-refresh mode is entered from the normal operation, responsive to a command.

The parity (check bit) for error detection/correction is generated (step S101).

'1' is written in the monitor cell (monitor bit field) of the memory array (step S102).

All cells of the memory cell array is refreshed (step S103).

For example, a pause is made for one second (power off). In the power off state, the internal power supply circuit is partially turned off.

'1' is read from the monitor cell (step S105).

When the error rate is larger than an upper limit e1, the refresh period tREF is shortened (step S107).

$$tREF \leftarrow tREF/k1$$

When the error rate is not larger than a lower limit e2, the refresh period tREF is elongated (step S108).

$$tREF \leftarrow tREF \times 2$$

If an error rate is not larger than e1 and larger than e2, the refresh period is not changed.

In exiting from the SSR mode, the ECC codec corrects errors, using check bits of the memory array, to correct the errors of the memory cells. The ECC codec then proceeds to the normal operation.

In the present embodiment, error measurement is made every refresh period. For coping with rapid temperature change during the pause period, the refresh period is reduced to a short value of 1/k1 in case the error rate (number of counts) is larger than a set value (e1). At this time, rapid period control of 1/2 or 1/4 is used.

If, on the other hand, the error rate (number of counts) is smaller than the set value (e2), the refresh period is elongated by a factor of k2. It is noted that low speed period control is performed by setting k2 e.g. by a factor of 1.1 or 1.2.

In case of a simplified control by multiplying the period by 2 or 4 by a frequency dividing counter, no detection is made during the pause period, so that, when the temperature rise has commenced, the period tends to be too long, and hence k2 is increased by a factor of 1.1 or 1.2.

The timer circuit, determining the refresh period, is required to have this period controlling function. The timer circuit will be described subsequently (see FIG. 25).

Figure 8:
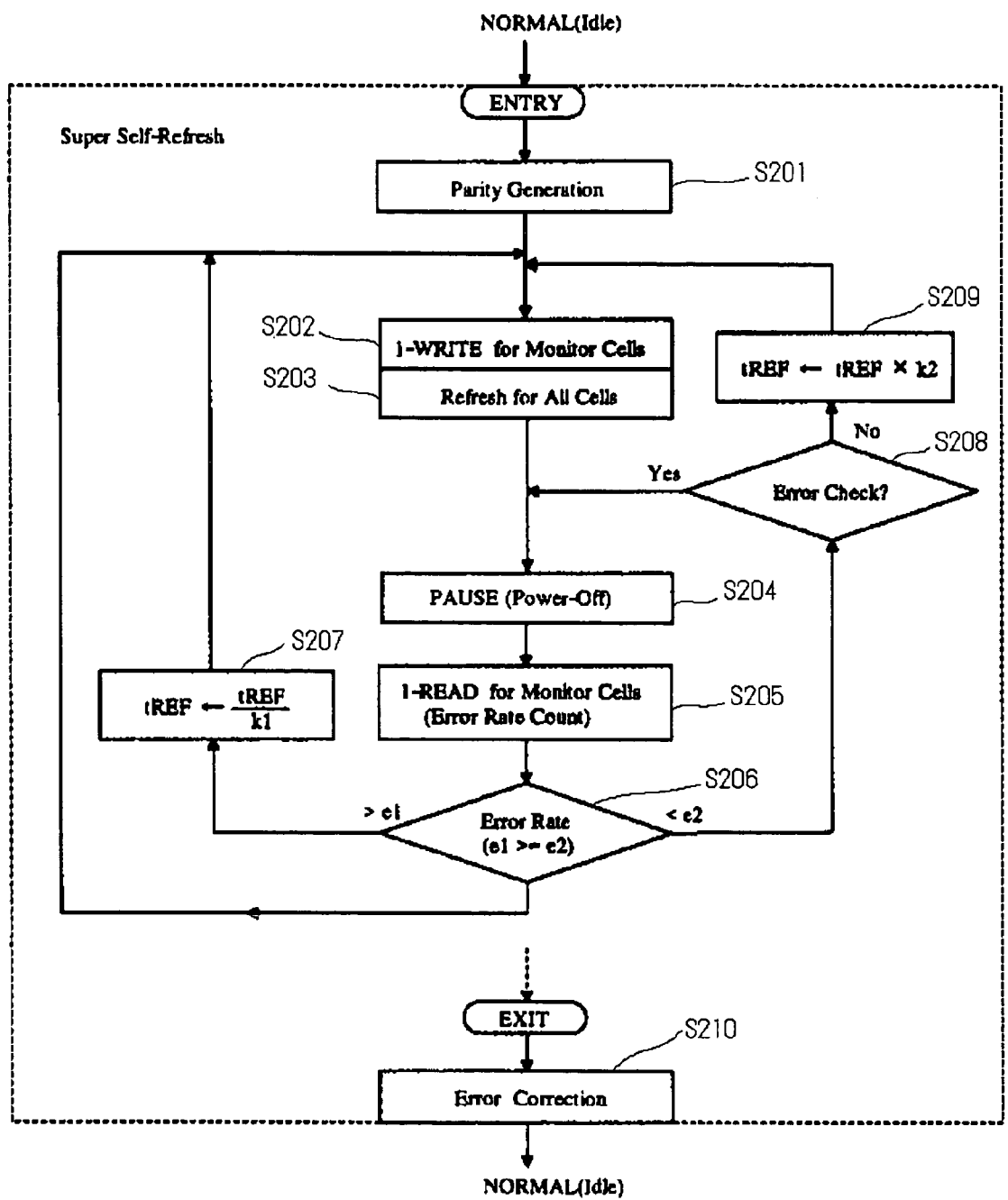
FIG. 8 is a flowchart showing the refresh period control algorithm of another embodiment of the present invention.

FIG. 8 is a flowchart for illustrating the refresh period controlling method of a modification of the present invention.

This flowchart shows the operation of an embodiment for monitoring the error with a period shorter than the refresh period. The pause period is successively increased to monitor the error rate. However, no period change is made at each error monitor point. The period change is carried out by each cycle of refresh for all cells.

The monitor period for the monitor bit error rate is set to 1/n of the refresh period. Referring to FIG. 8, the super self refresh mode is entered from the normal operation.

The encoding circuit of the ECC codec 7 generates the parity of the memory cells of the memory cell array.

'1' is written in the monitor cell (step S202).

All of the cells of the memory array are refreshed (step S203).

A 1/n pause of the refresh period (power down) is made (step S204).

'1' is read from the monitor cell (step S205).

If the error rate is larger than the set value e1, the refresh period tREF is shortened (step S207).

$$tREF \leftarrow tREF/k1$$

If, with the error rate not higher than e2, the number of times of error monitor is less than n, that is, error check is to be performed further, pause processing of the step S204 is performed. If, with the error rate not higher than e2, n times of the error monitor are finished, the refresh period tREF is elongated (step S209).

$$tREF \leftarrow tREF \times k2$$

If the error rate is not larger than e1 and larger e2, the refresh period is not changed.

When exiting from the super self refresh mode, error correction is made and transition is made to the normal operation.

When desired to improve follow-up characteristics to changes in temperature, the error rate is monitored at a period shorter than the refresh period. For example, the refresh for all cells operation is carried out after carrying out error rate monitoring twice. If n=2 and the refresh period is 1 sec, the pause period is 500 msec.

After the pause time, the error monitor for monitor bits is carried out (the monitor area is read and the error rate is determined). If the error rate is larger than the set value, processing moves to period shortening and refreshing for all cells, without regard to the number of times of error rate monitoring, and the number of times of pause is also reset.

When the error rate is smaller than the set value e2, and the current error monitoring is the first one, reversion is directly made to the pause period without doing anything. After this pause, the second error monitor operation is again performed. At this time, the error monitor operation is carried out for the pause period twice as long and transfer is made to period change according to the error rate and to the refresh for all cells operation. By so doing, the error rate may be monitored with the one-half of the refresh period (where n=2). However, in order to render this effective, a monitor bit area twice as large is required.

That is, there is meaning only when the error monitor memory area of the second monitor operation is the memory area of monitor bits distinct from that of the first monitor operation. It is because the error monitor operation (read operation of the monitor area) performed results in the refresh (re-write) operation being carried out for the memory cells in question. If the second error monitor operation is performed for the same memory cell, the pause time for the memory cell is scarcely changed from that for the first error monitor operation.

The data written in a monitor bit is data '1' and is mainly aimed to detect pause refresh failure and need not be physical data '1'.

For example, if data scrambling (see FIG. 17) is complex and difficult to implement, the data may be logical data '1'. If the data may be logical data '1', 50% of data is mostly physical data '1' and hence the error rate can be monitored without coming into question. This depends on the memory map configuration of each individual chip. In this case, data scrambling is unneeded and, in addition, even if physical '0' data becomes apparent, due e.g. to plate leakage malfunctions, the error rate can be monitored with advantage.

Figure 9:
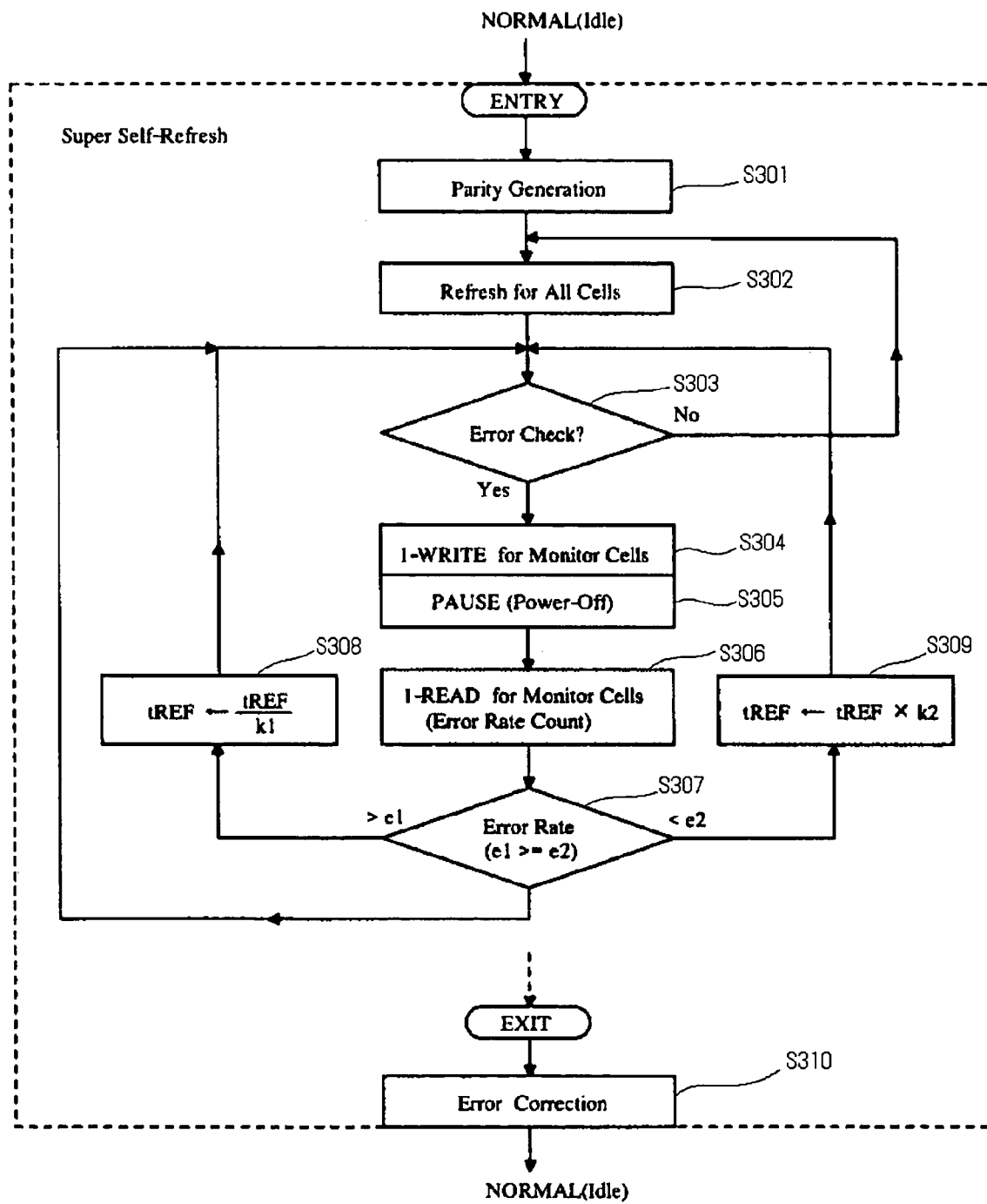
FIG. 9 is a flowchart showing the refresh period control algorithm of still another embodiment of the present invention.

FIG. 9 is a flowchart for illustrating the operation of a modification of the present invention, more specifically, a flowchart for illustrating an embodiment in which an error is monitored with a period shorter than the refresh period. The period control decision is made with an error rate lower than the error rate for the refresh period. The super self refresh mode is entered from the normal operation.

The parity is generated in the coding circuit of the ECC codec (step S301).

All of the cells of the memory array are refreshed (step S302).

With the error check mode (Yes of step S303), '1' is written in the monitor cell (Yes of step S304). When error decision has been carried out n times, processing moves to a step S302.

1/n pause of the refresh period is made (power off) (step S305).

'1' is read from the monitor cell (step S306)

The error rate is judged (step S307). If the error rate is larger than the set value e1, the refresh period is set so that tREF←tREF×k1 (step S308) and then processing moves to a step S303.

If the error rate is not larger than e2, tREF←tREF×k2 (step S309) and then processing moves to the step S303.

If the error rate is not larger than e1 and larger than e2, processing moves to a step S303 without changing the refresh period.

When exiting from the super self refresh mode, the decoding circuit of the ECC codec carries out the error correction. Then, processing moves to the normal operation (step S310).

Figure 10:
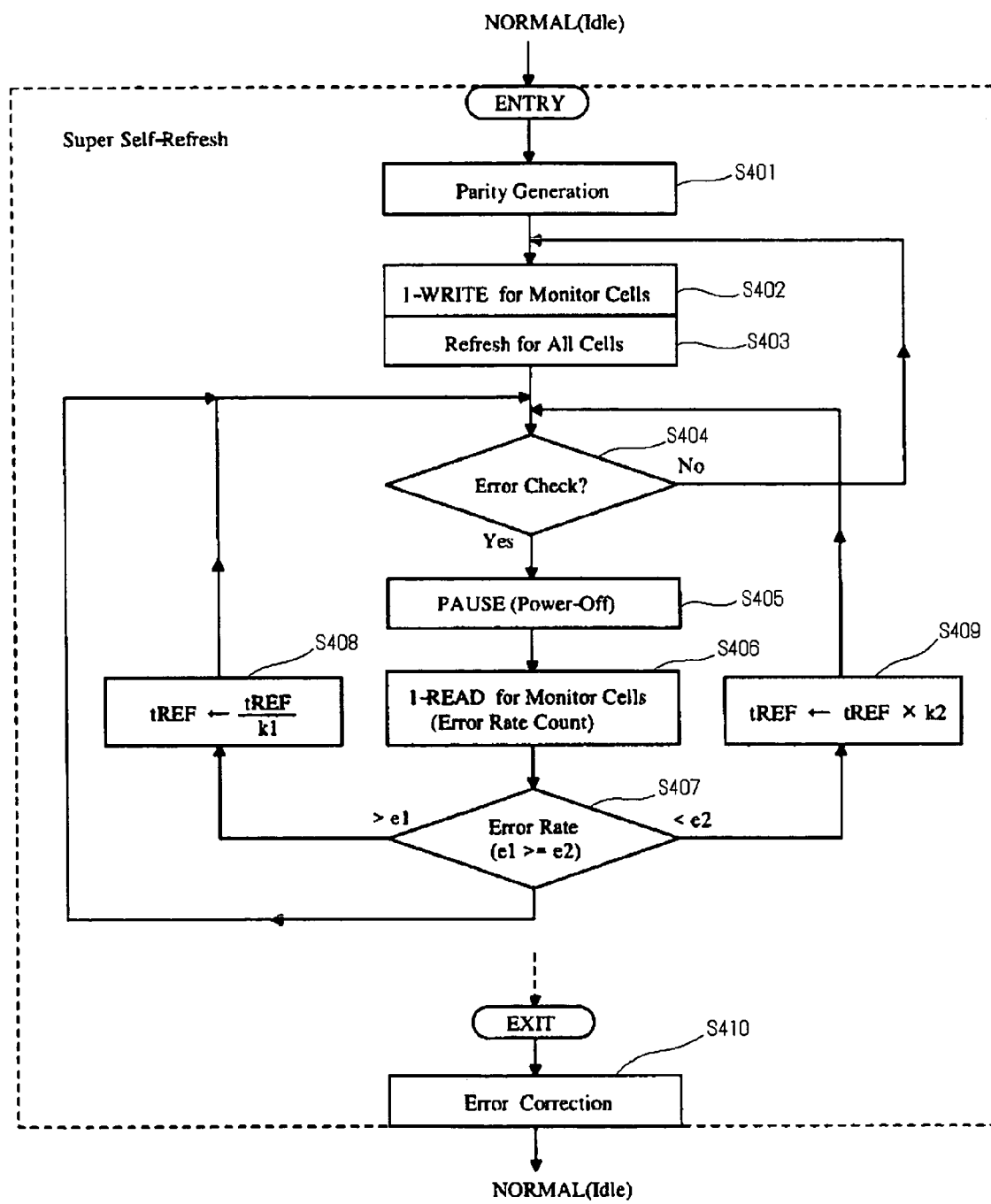
FIG. 10 is a flowchart showing the refresh period control algorithm of yet another embodiment of the present invention.

FIG. 10 is a flowchart for illustrating the refresh period controlling method of a modified embodiment of the present invention, that is, a flowchart for illustrating an embodiment for carrying out an error monitor operation with a period shorter than the refresh period. The pause time is progressively increased to monitor the error rate. However, the period is changed at each error monitor point. The super self refresh mode is entered from the normal operation.

The parity is generated in the coding circuit of the ECC codec (step 401).

'1' is written in the monitor cell (step S402).

All of the cells of the memory array are refreshed (step S403).

If the mode is the error check mode (Yes of step S404), 1/n pause of the refresh period is made (power off) (step S405). If an error monitor operation is carried out n times (No of step S404), processing moves to a step S402.

'1' is read from the monitor cell (step S406)

The error rate is judged (step S407). If the error rate is larger than the set value e1, the refresh period is set so that tREF←tREF/k1 (step S408) and then processing moves to a step S404.

If the error rate is not larger than e2, tREF←tREF×k2 (step S409) and then processing moves to the step S404.

If the error rate is larger than e1 and larger than e2, processing moves to a step S404 without changing the refresh period.

When exiting from the super self refresh mode, the decoding circuit of the ECC codec carries out the error correction. Then, processing moves to the normal operation (step S410).

Figure 11:
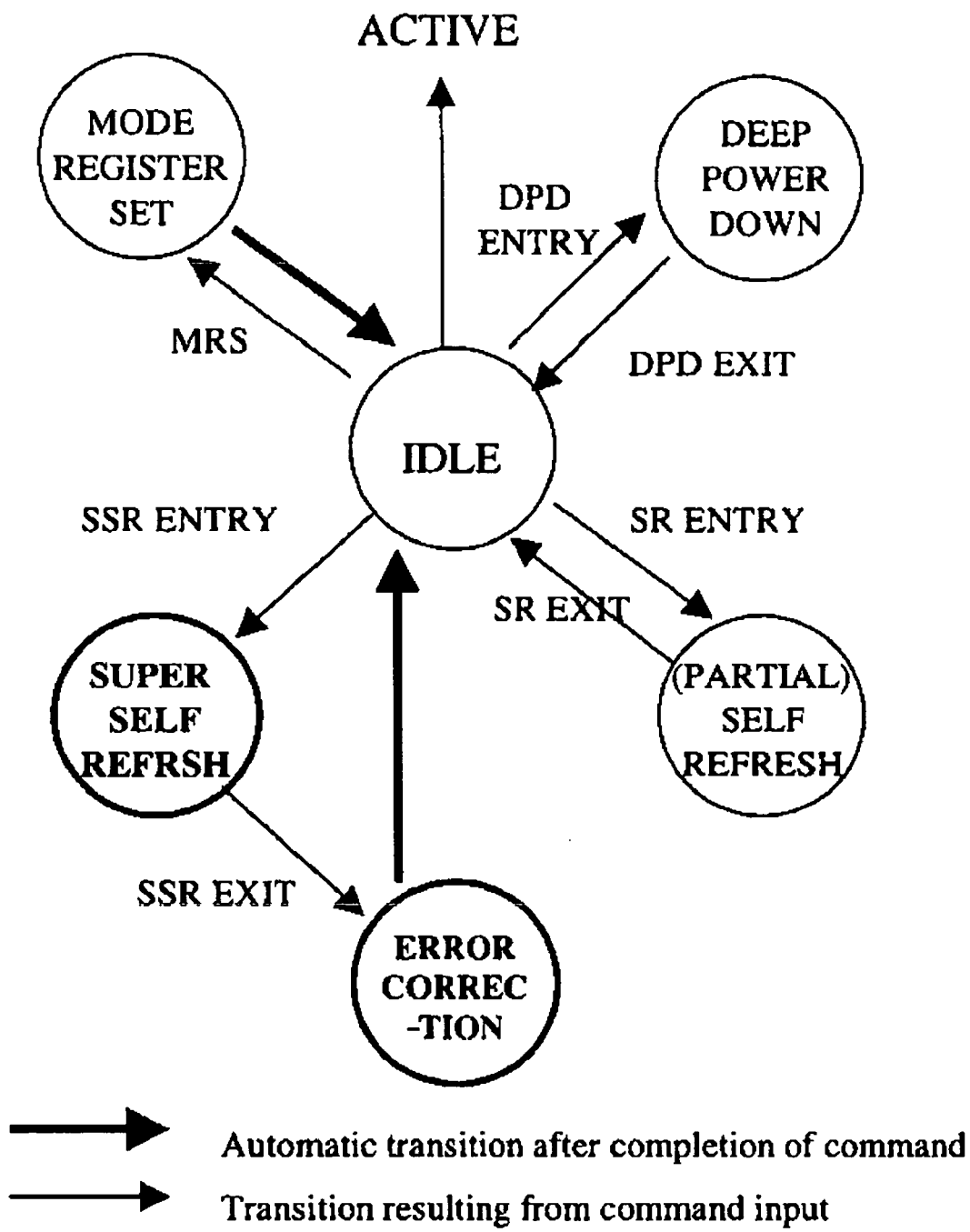
FIG. 11 is a status transition diagram of an SSR-carrying DRAM according to an embodiment of the present invention.

FIG. 11 depicts an example of state transition of the DRAM, having the SSR mode, according to the present invention. As in the usual SR (self refresh), the SSR mode is entered with the SSR entry command to the command decoder to transfer to the SSR state. For example, the clock enable signal CKE goes low in synchronism with the rise of the clock signal CLK, and a command to the SSR mode entry (SPC) is entered. The command to the SSR mode entry (SPC) is decoded as a chip select signal CS, a row address strobe signal RAS, a column address strobe signal CAS and a write enable signal WE, these signals being of a preset level, are supplied, in synchronism with the clock signal, to the command decoder 2091. The operating state transfers to a decoding state by the SSR exit command, such as by the clock enable signal CLK going high from low and by an exit command being taken into the command decoder. On termination of the decoding, the operating state is automatically restored to the idle state (usual state). As for the waveform of the operating timing, reference is made to FIGS. 56 and 57.

The operating state moves from the idle state to the active state on receipt of the active command.

From the idle state, the operating state undergoes a transition to mode register setting by command input (mode register setting). After the mode register setting, the state transition back to the idle state is executed.

From the idle state, parity is appended by a command input of the SSR entry, followed by the transition to SSR. Error correction is executed by a command input of SSR exit. The state transition back to the idle state is performed.

From the idle state, the operating state undergoes a transition to SR by a command input of the SR (self refresh) entry and returns to the idle state by a command input for SR exit.

From the idle state, the operating state undergoes a transition to DPD (Deep Power Down) by a command input to DPD entry, and goes to the idle state by a command input of the DDR exit.

Figure 12:
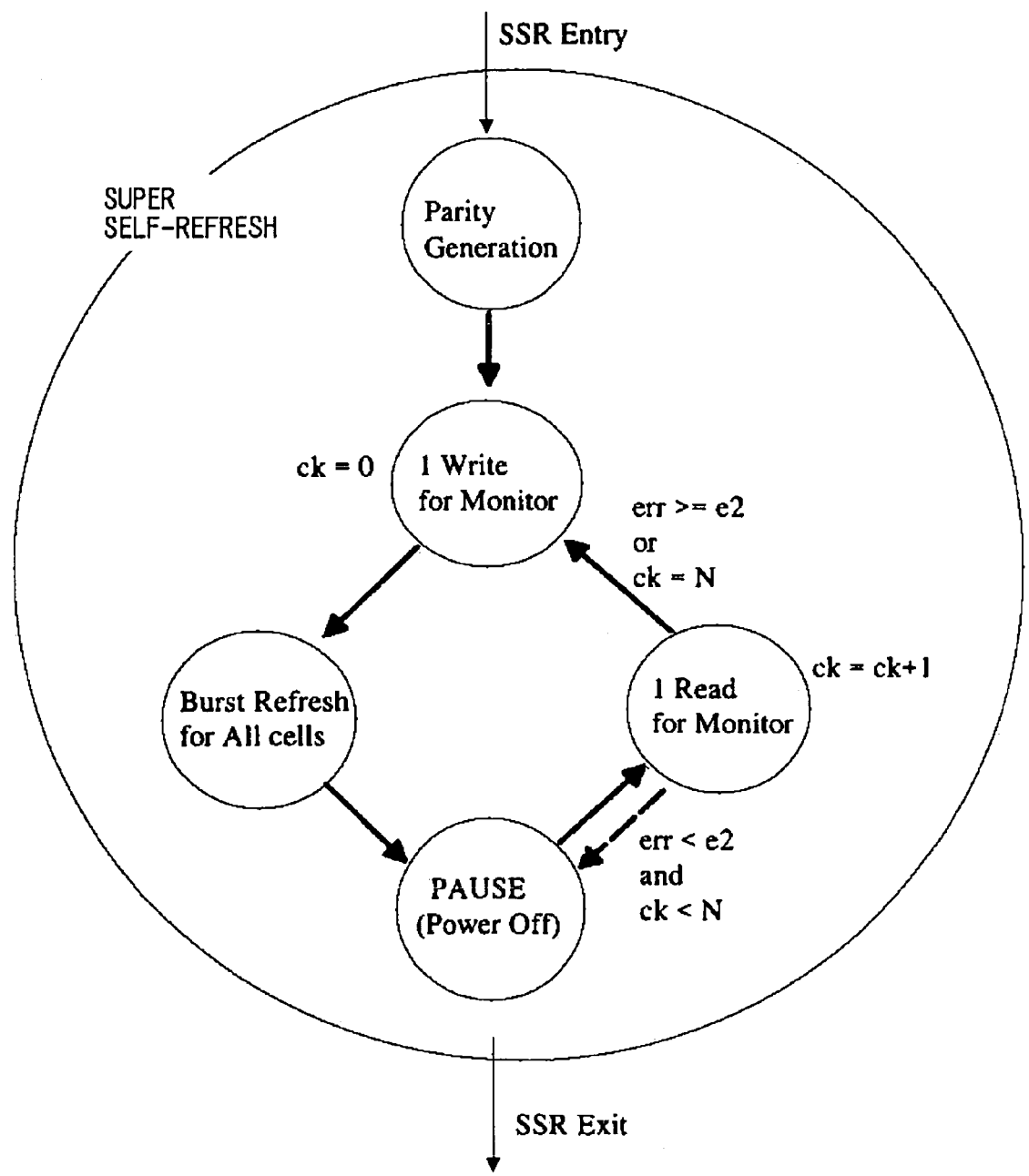
FIG. 12 is a diagram showing a transition to the SSR mode state of the DRAM carrying the error rate monitor control function for the refresh period of another embodiment of the present invention.

FIG. 12 shows the transition to the SSR mode state in case the function for monitor controlling the error rate of the refresh period is provided. When the SSR state is entered, the operating state moves to the coding state (generation of parity bits). On completion of the generation of parity bits, 1 write to monitor bit→pause (cessation of at least part of the internal power supply circuit, power off state)→1 read of monitor bit→error rate decision→1 write to monitor bit, is repeated. That is, on entry to SSR, the parity information is generated, '1' is written in the monitor bit, all cells are burst-refreshed, followed by pause and read of '1' of the monitor bit. If pause is made N times or the error rate err is not less than e2, '1' is written in the monitor bit. Pause is made if the number of times of pause is less than N and the error rate is less than e2.

Figure 13:
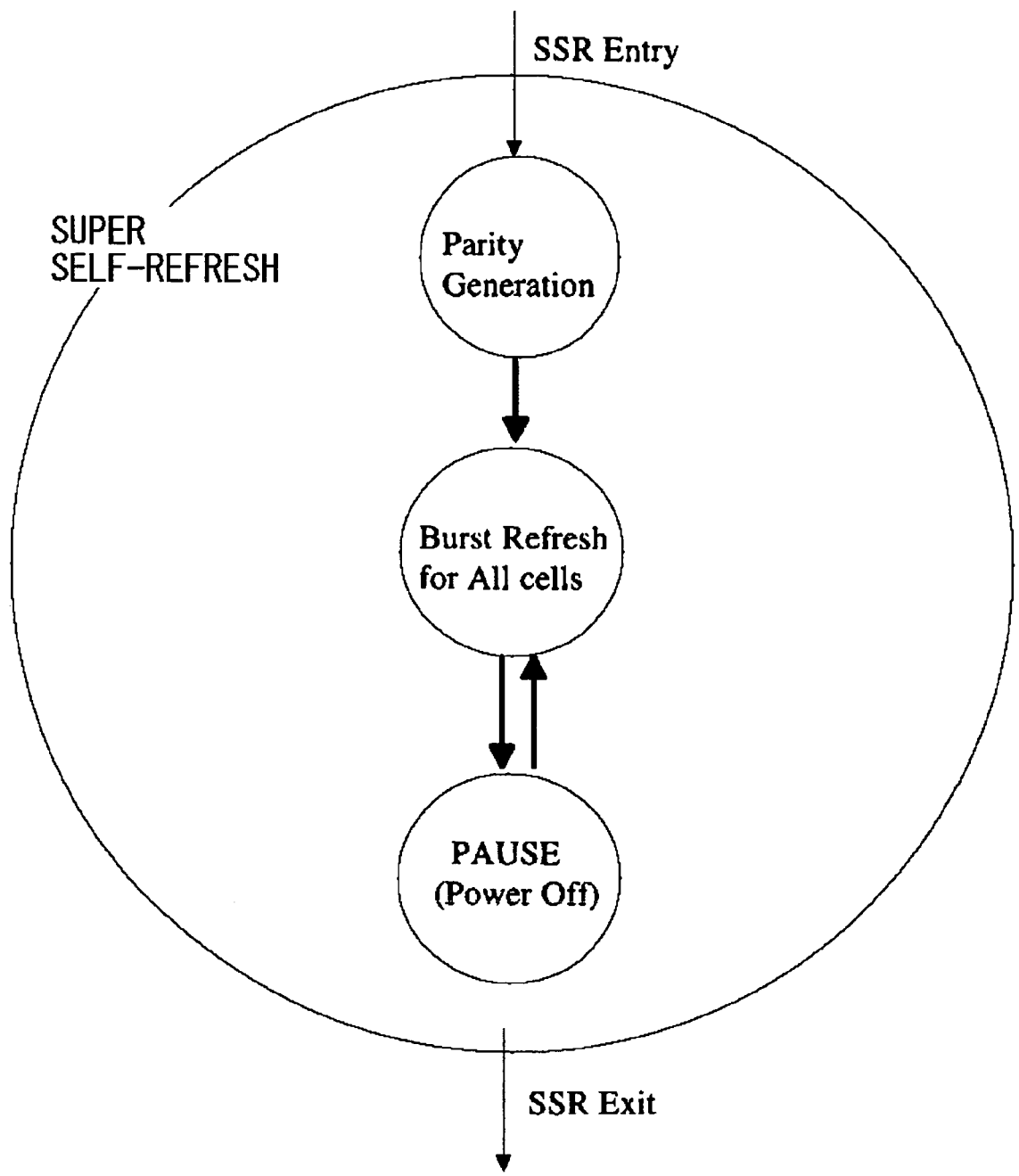
FIG. 13 is a diagram showing a transition to the SSR mode state of the DRAM not carrying the error rate monitor control function for the refresh period of still another embodiment of the present invention.

FIG. 13 shows a state transition to the SSR mode state devoid of the refresh period error rate monitor control function. When the SSR state is entered, the operating state moves to the coding state (parity bit generation). After the end, pause (cessation of the internal power supply and power off state) →all bit refresh is repeated. When the SSR state is entered, the parity is generated and all cells are burst refreshed, followed by pause. Transition is made between the pause and the burst refresh and transition is made to the usual mode with the SSR exit.

Figure 14:
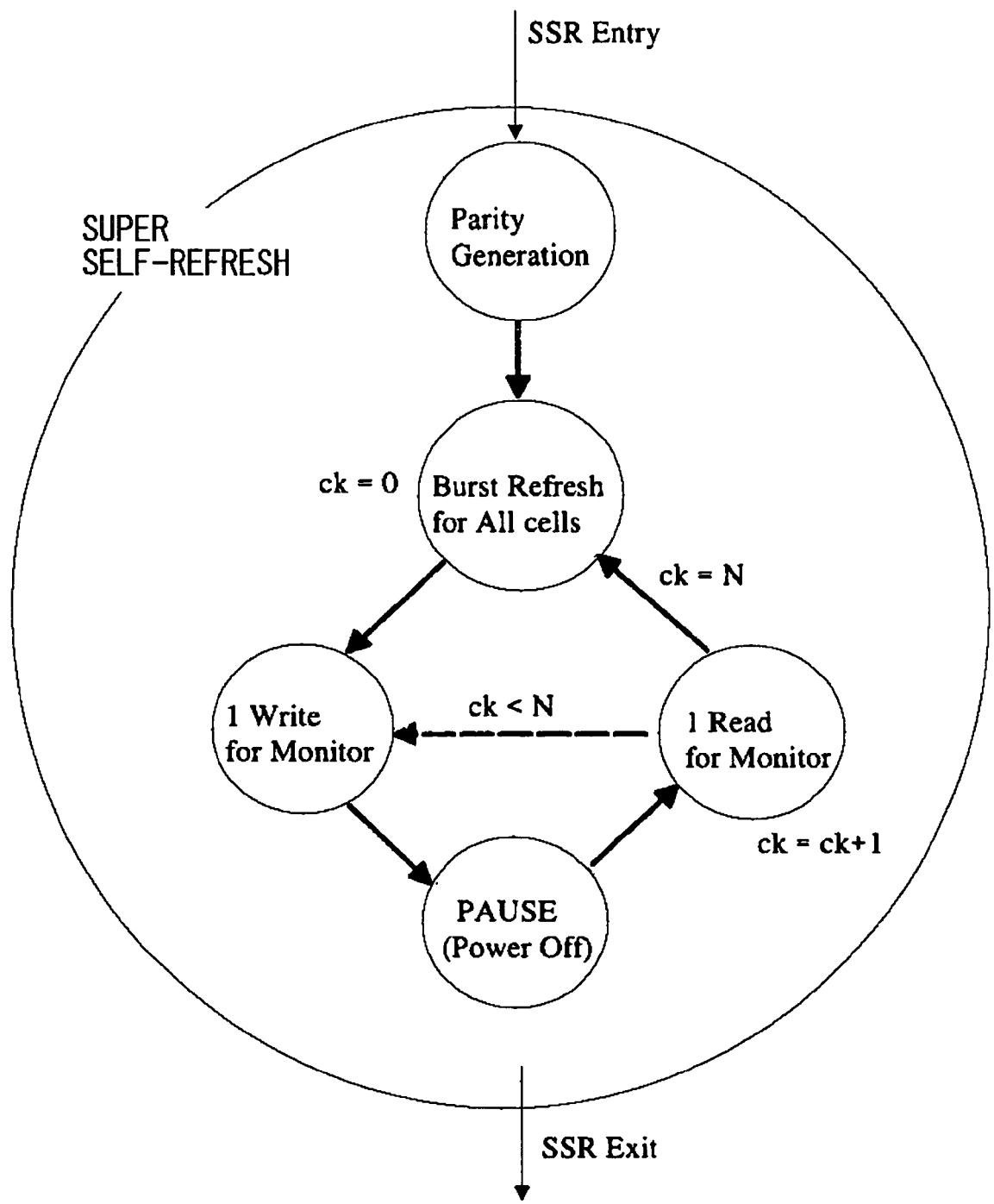
FIG. 14 is a diagram showing a transition to the SSR mode state of the DRAM carrying the error rate monitor control function for the refresh period of another embodiment of the present invention.

FIG. 14 shows an SSR mode state transition diagram in case the memory device has the refresh period error rate monitor control. On entry to the SSR mode, the parity is generated and burst refresh is carried out to perform an error monitor operation plural times ('1' writing to the monitor bit and '1' read from the monitor bit are carried out N times).

Figure 15:
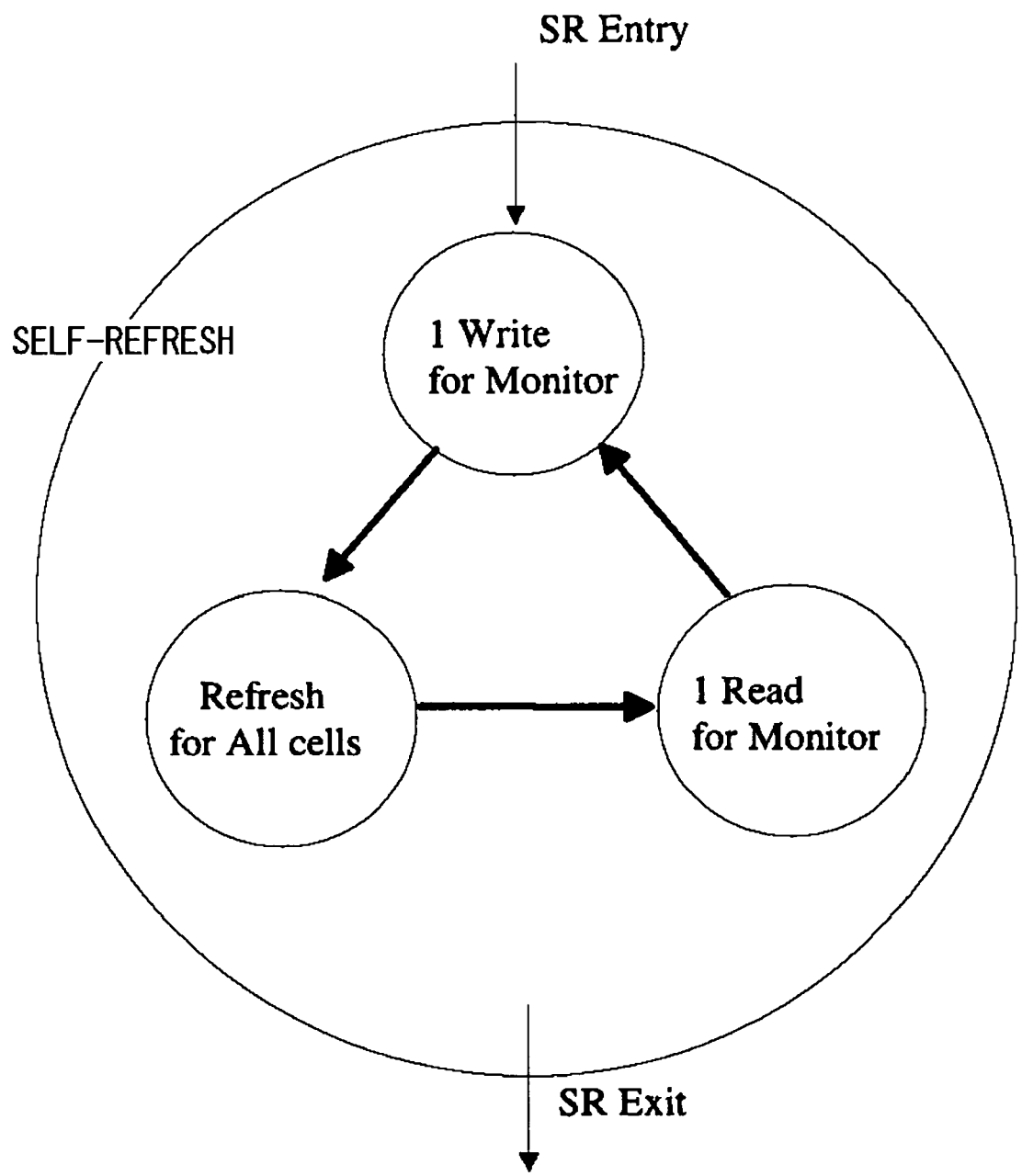
FIG. 15 is a diagram showing a transition diagram showing the state of transition to the usual SR mode of a DRAM carrying the refresh period error rate control function of another embodiment of the present invention.

FIG. 15 (corresponding to FIG. 9) depicts an SR mode state transition diagram in case the memory device has the refresh period error rate monitor control. Read-write interrupt to the monitor bit (about 10 bits) occurs in the course of the refresh operation.

Figure 16:
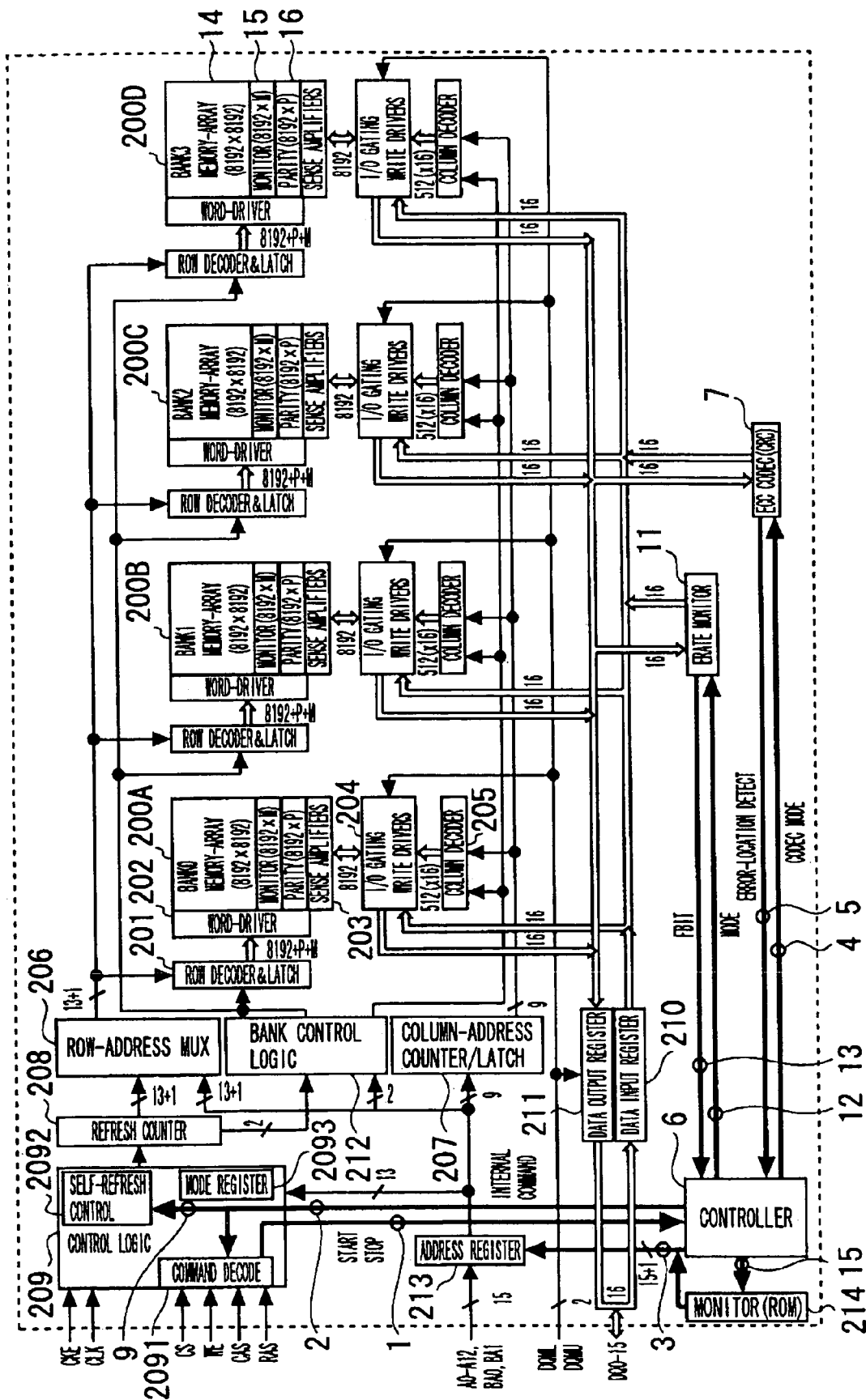
FIG. 16 is a diagram showing an overall configuration of a further embodiment of the present invention.

FIG. 16 shows the configuration of a third embodiment of the present invention. The ECC codec is one set/four banks and, in distinction from the case of FIG. 5, includes a usual self refresh accommodating monitor bit address ROM 214.

The ECC controller 6 accesses the ROM 214, having stored therein a usual self refresh accommodating monitor bit address, and outputs an internal address from the monitor bit address to carry out the read-write operation.

FIG. 17 shows an illustrative configuration of the error rate calculating circuit 11 shown in FIG. 5. Referring to FIG. 17, a comparator circuit 1702 compares read data DOUT(i) with an expected value (Expectation Data). In case of failure, the comparator circuit outputs ERROR as a high level and, when ECLK is at a high level, an error is counted up by a counter 1704.

An adder (ADDER) 1706, supplied with a fail bit count (Fail Bit Count: 4 bits) from 16 I/O lines, adds the fail bit counts every clock ACLK and outputs the result of addition (total sum) associated with the 16 I/O lines.

Meanwhile, a data scramble circuit 1701 is supplied with TPH, internal address IYA (i) and IXA (j), supplied from BIST (Built In Self Test) controller, not shown (see FIG. 41) to output expected value data (expected value of physical '1'). With memory cells connected to a common word line and to a complementary bit line pair, the expected values at the time of physical '1' writing are different, so that an expected value is generated in the data scramble circuit 1701, based on the control signal TPH from the BIST controller (see for example FIG. 41) and the internal X address IXA and internal Y address IYA, and transmitted through register circuits 1703, 1704 by the clock signal DCLK to the comparator circuit 1702.

BISTR (BIST read), BISTW (BIST write), DCLK (clock), EINT (initialization), ECLK (clock) and ACLK (clock of the adder) are supplied from a BIST controller enclosed in the DRAM. TM79 is a control signal supplied from a control logic 209 of FIG. 5.

Figure 18:
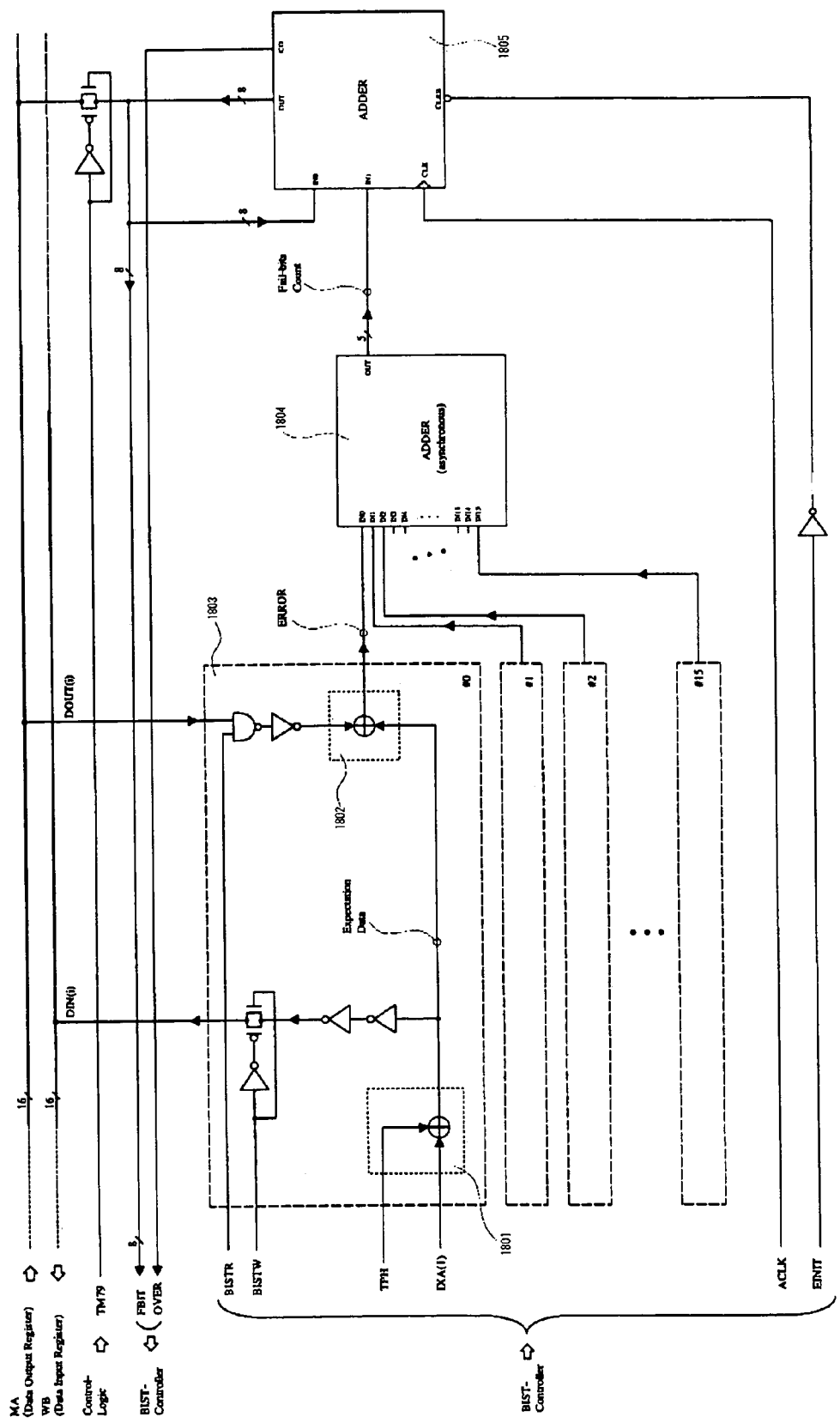
FIG. 18 is a diagram showing the configuration of a further embodiment of an error rate calculating circuit in an embodiment of the present invention.

FIG. 18 shows another illustrative configuration of the error rate calculating circuit 11 shown in FIG. 5. This circuit configuration includes an adder (asynchronous adder) 1804 for adding errors of 16 I/O channels and an adder 1805 for adding fail bit counts (Fail-Bit Counts) as a sum of output values obtained by the adder 1804 by ACLK.

Figure 19:
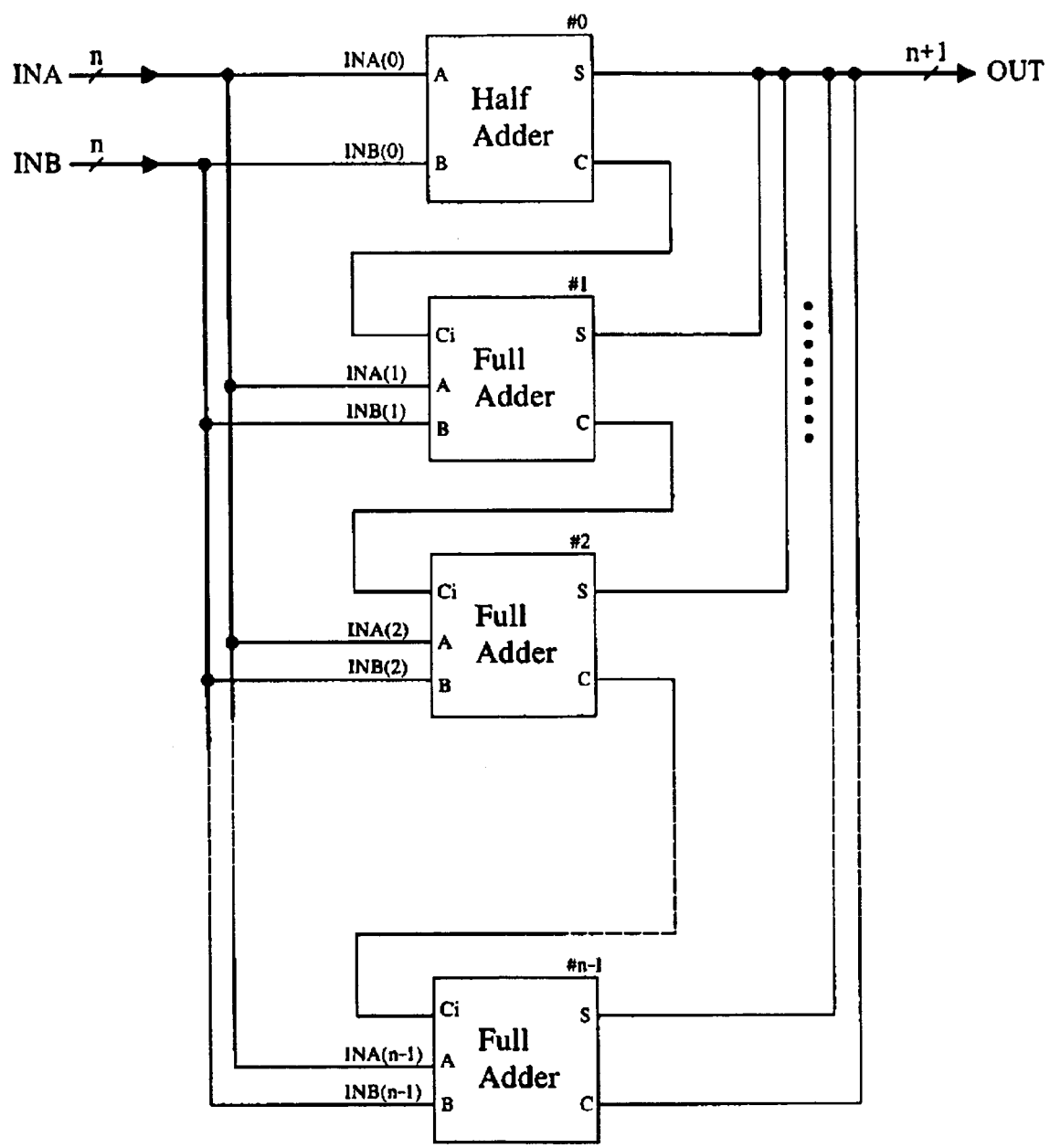
FIG. 19 is a diagram showing the configuration of an embodiment of an n-bit adder circuit (1805 of FIG. 18).

FIG. 19 shows the configuration of an n-bit adder of the adder 1805 of FIG. 18. The n-bit adder is composed by a half adder for summing the lowermost bits INA (0) and INB (0) and a full adder for adding the uppermost bit to a carry of the result of addition of the next lower order bits.

Figure 20:
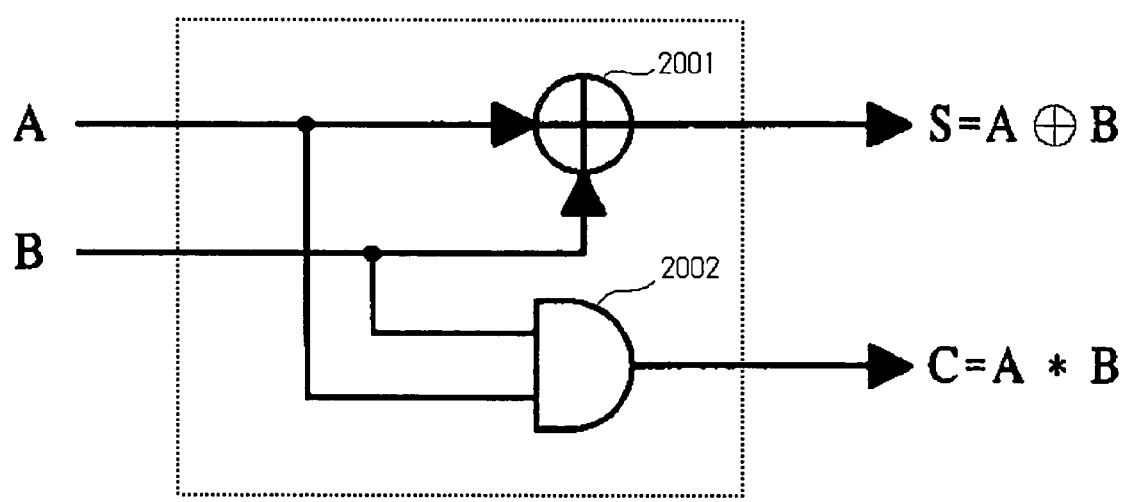
FIG. 20 is a diagram showing the configuration of an embodiment of a half adder circuit.

FIG. 20 shows the configuration of the half adder of FIG. 19. The half-adder is composed by an EXOR circuit 2001, supplied with signals A and B as inputs, and an AND circuit 2002 for generating a carry C.

Figure 21:
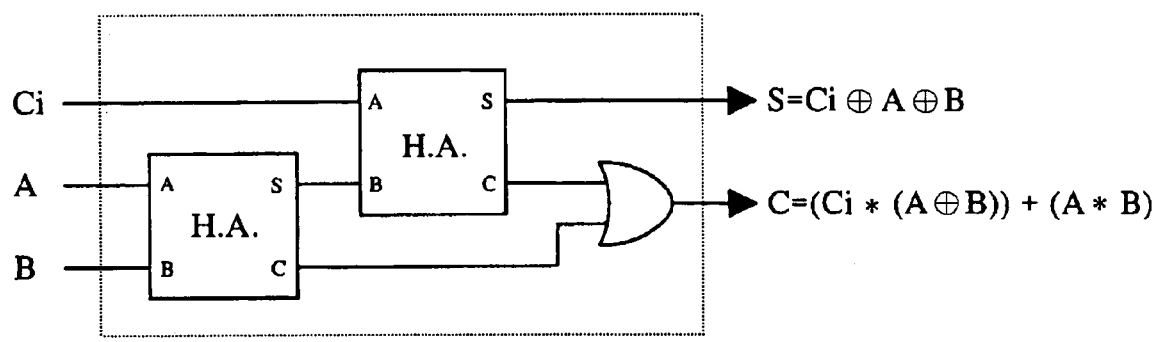
FIG. 21 is a diagram showing the configuration of an embodiment of a full adder circuit.

FIG. 21 shows the configuration of the full adder of FIG. 19. In FIG. 21, Ci denotes the carry of the result of addition of the next lower order bits.

Figure 22:
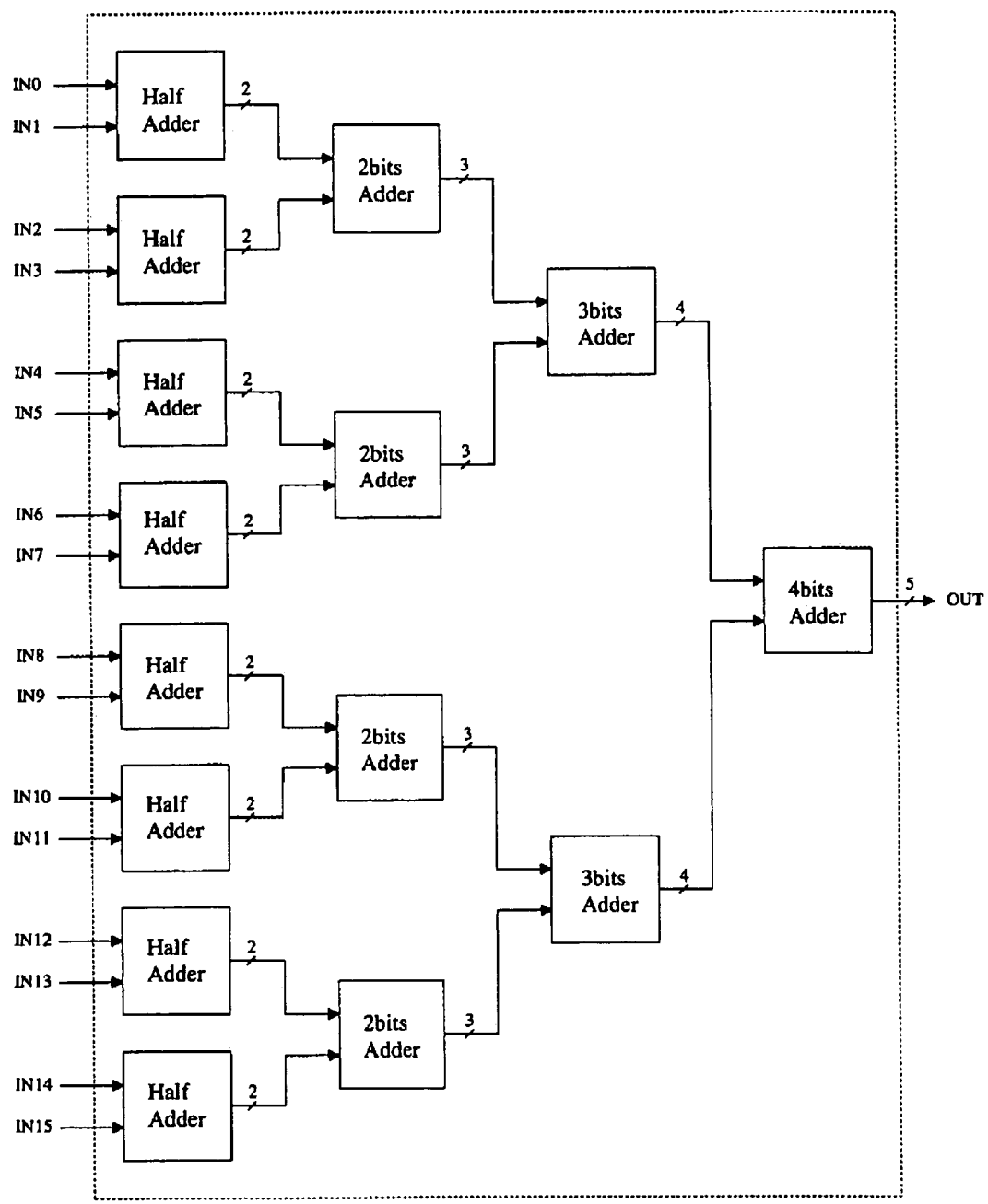
FIG. 22 is a diagram showing the configuration of an embodiment of a 16-input 1-bit adder circuit (1804 of FIG. 18).

FIG. 22 shows the configuration of a 16-input 1-bit adder 1804. This adder has a layered structure composed of eight half adders, two 2-bit adders and a 4-bit adder.

Figure 23:
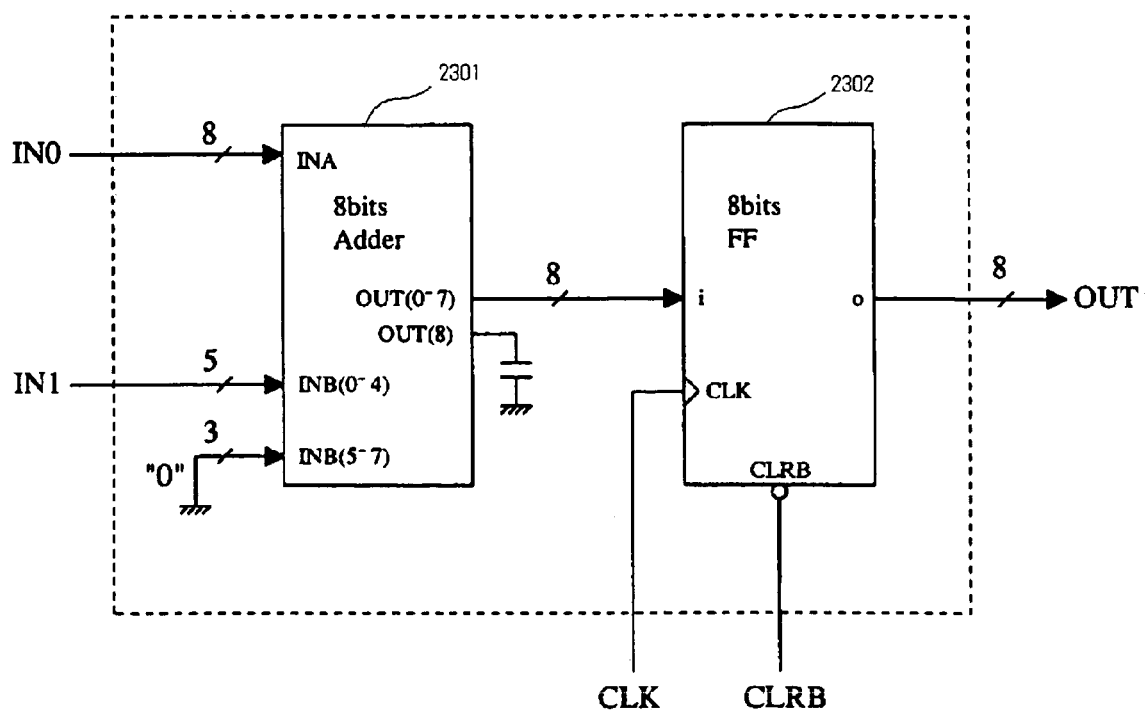
FIG. 23 is a diagram showing the configuration of an embodiment of an adder circuit (1706 of FIG. 17).

FIG. 23 shows the structure of the adder 1706 of FIG. 17. This adder includes the 8-bit adder and an 8-bit flip-flop (8-bit FF) having a clear terminal.

Figure 24:
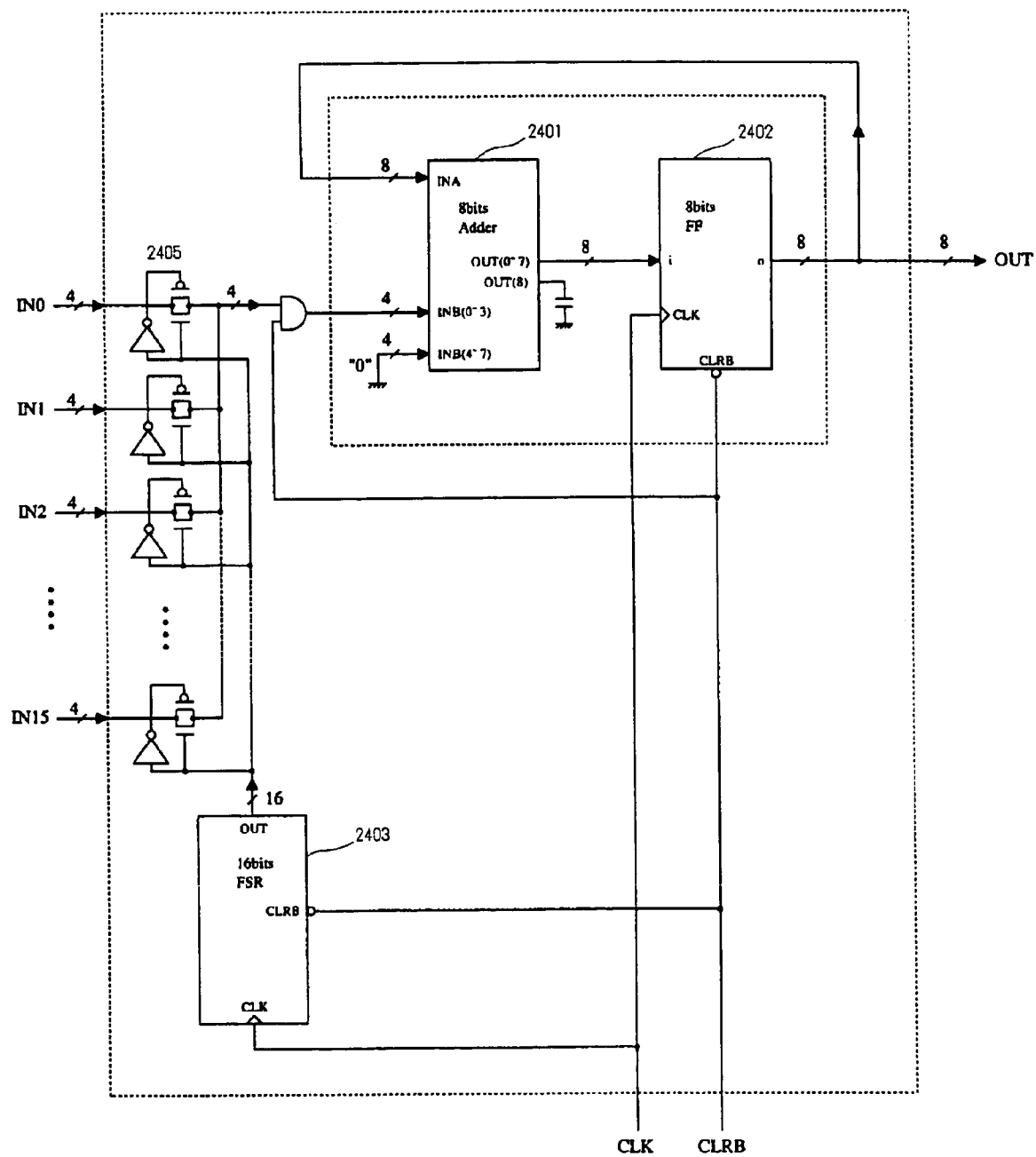
FIG. 24 is a diagram showing the configuration of an embodiment of an adder circuit (1706 of FIG. 17).

FIG. 24 depicts the configuration of an 8-bit adder of FIG. 23 and the adder (ADDER) 1706 of FIG. 17. One of 4-bit signals IN0 to IN15 is selected by a CMOS transfer gate 2405, which is on/off controlled by an output of a 16-bit FSR (Feed Back Shift Register) 2403. The selected 4-bit signal is entered to a 4-bit input INB (0-3) of an 8-bit adder (8-BIT ADDER) 2401, and inputs INB (4-7) are set to 0. An output of the 8-bit flip-flop 2402 is fed back to an input terminal INA of the 8-bit adder (8-BIT ADDER) 2401 by way of carrying out cumulative addition. The flip-flop (8-bit FF) is reset by a clear signal of the clear terminal.

Figure 25:
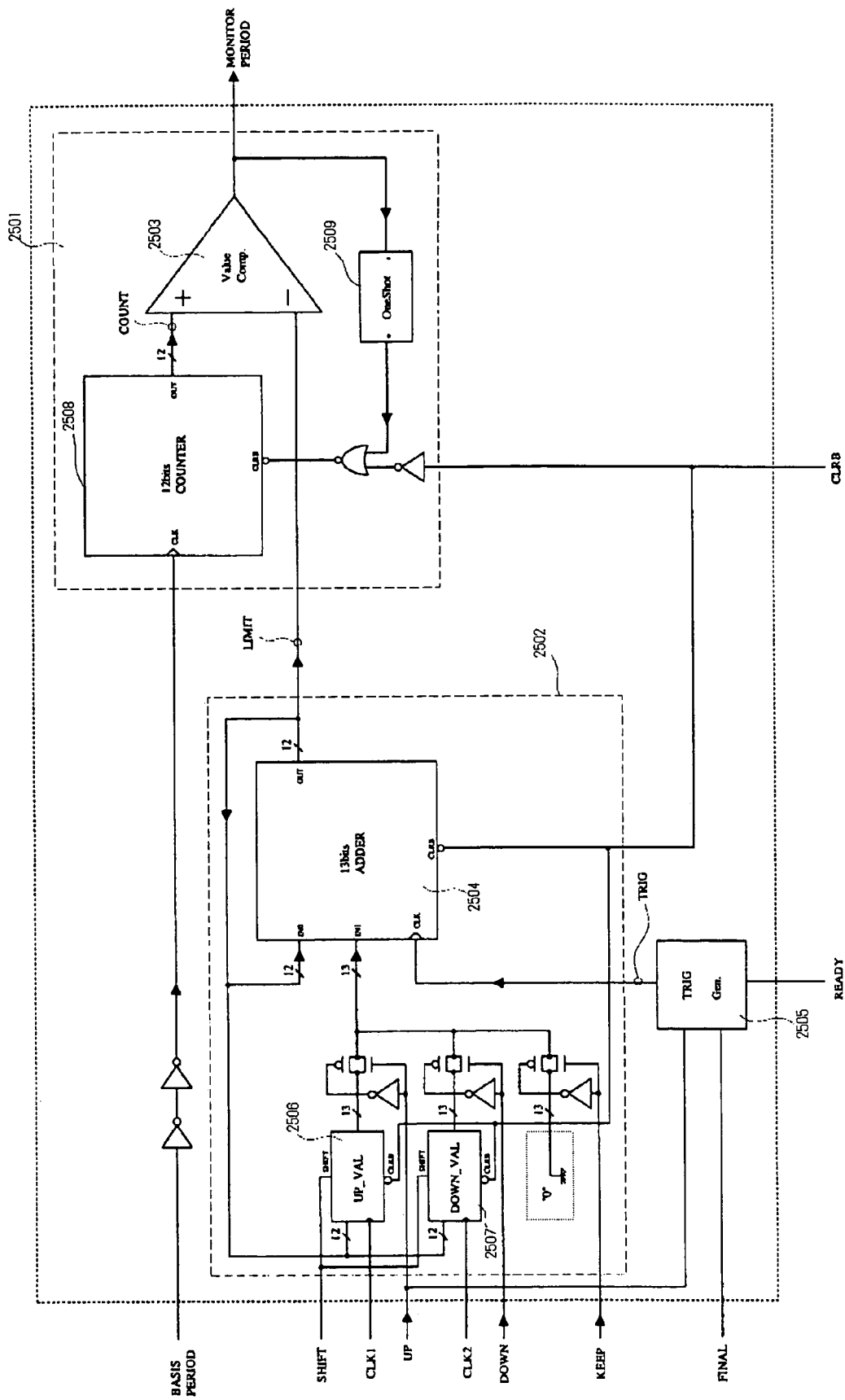
FIG. 25 is a diagram showing the configuration of an embodiment of a timer circuit (FIGS. 5, 6, 16).

FIG. 25 shows an illustrative configuration of an internal timer circuit of a self-refresh control circuit 2092 of FIGS. 5 and 6. The timer circuit receives a period UP/DOWN signal from the ECC controller 6 to calculate and set the period. It is noted that the ECC controller 6 outputs a DOWN signal and an UP signal when the error rate is not larger than the lower setting e2 and not less than the upper setting e1, respectively.

In FIG. 25, an output of a 13-bit adder (13 bit Adder) 2504 is entered as a reference value (LIMIT) of a count comparator 2503, and is supplied to a 12-bit counter (12 bit Counter) 2508, which is supplied with a reference period (BASIS PERIOD) as a clock signal. When the output of the 12-bit counter 2508 exceeds a threshold value, the count comparator 2503 outputs a MONITOR PERIOD signal as a high level signal. When the MONITOR PERIOD signal goes high, a one-shot (One Shot) 2509 generates a one-shot pulse which resets a 12-bit counter 2508. An output (12 bit output) of the 13-bit adder (13-bit Adder) 2504 is entered to a period sum calculating circuit (UP_VAL) 2506 and to a period subtraction value calculating circuit (DOWN_VAL) 2507 and shifted with the clock signals CLK1 and CLK2. When the UP signal is at a high level, the output of the period sum calculating circuit (UP_VAL) 2506 is entered via a CMOS transfer gate to an input terminal IN1 of the 13-bit adder (13 bit Adder) 2504, whereas, if the DOWN signal is at a high level, the output of the period subtraction value calculating circuit (DOWN_VAL) 2507 is entered via a CMOS transfer gate to an input terminal IN1 of the 13-bit adder (13 bit Adder) 2504. The 13-bit adder (13 bit Adder) 2504 sums the current value entered to the input terminal IN0 and the value of the input terminal IN1 together to output the resulting sum, with a trigger from a trigger generator 2505 as the clock signal CLK. When the signal KEEP is at a high level, "0" is entered to the input terminal IN1, with the output of the 13-bit adder (13 bit Adder) 2504 remaining at a constant value.

Figure 26:
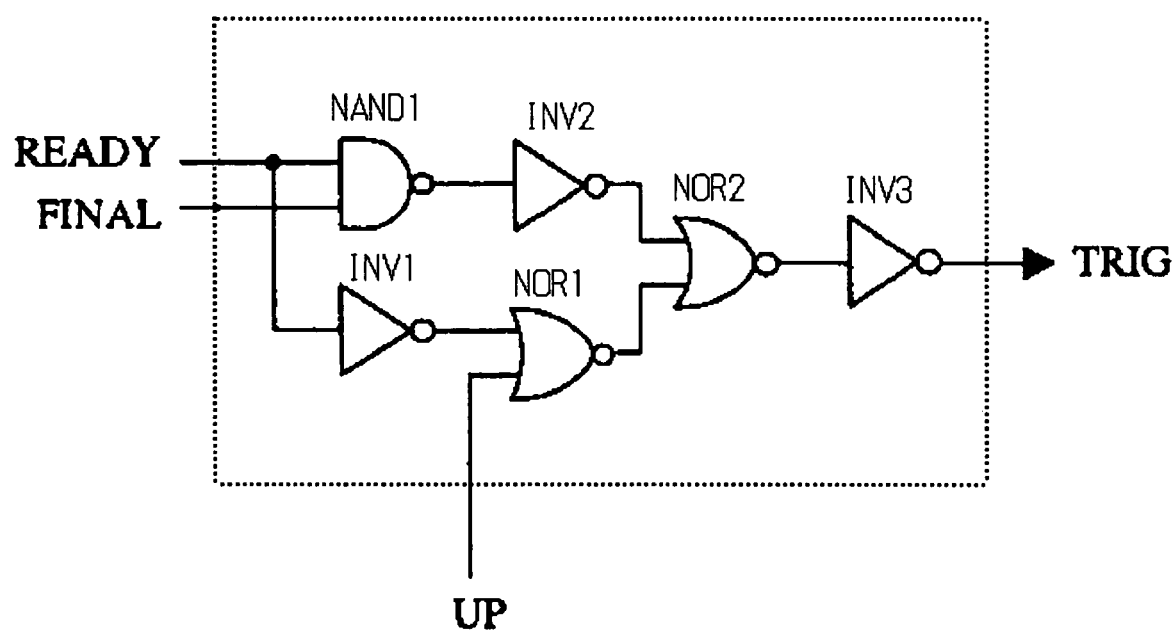
FIG. 26 is a diagram showing the configuration of an embodiment of a TRIG generating circuit of a timer circuit of FIG. 25.

FIG. 26 depicts the configuration of the trigger circuit of FIG. 25. When the signals READY and FINAL are both at a high level, or when the signals READY and FINAL are at a high level and at a low level, respectively, TRIG is at a high level.

Figure 27:
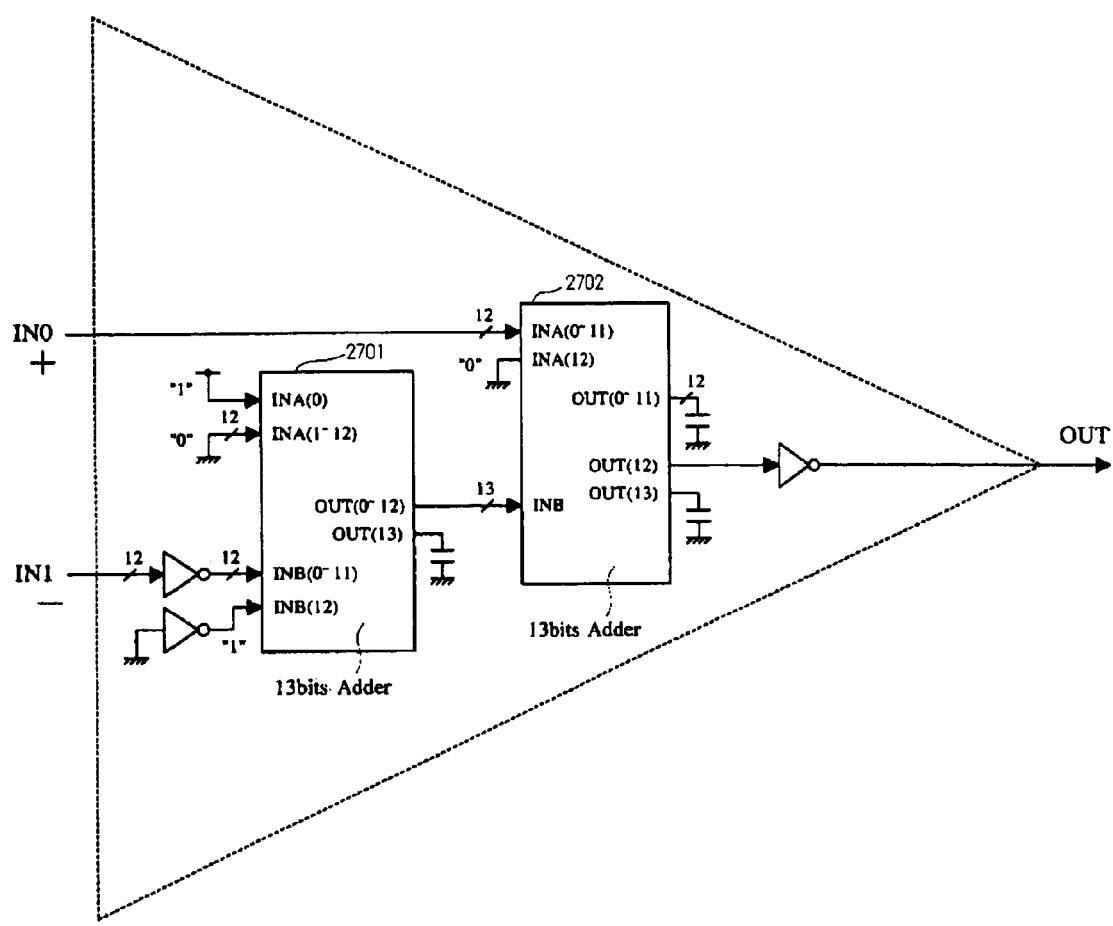
FIG. 27 is a diagram showing the configuration of an embodiment of a count comparator circuit of the timer circuit of FIG. 25.

FIG. 27 shows the configuration of the count comparator 2503 of the timer of FIG. 25. Referring to FIG. 27, a 13-bit adder 2701 calculates 2's complements of the input IN1 (12 bits), and a 13-bit adder 2702 adds IN0 (12 bits) and 2's complements of the IN1 to output an inverted signal of an OUT(12).

Figure 28:
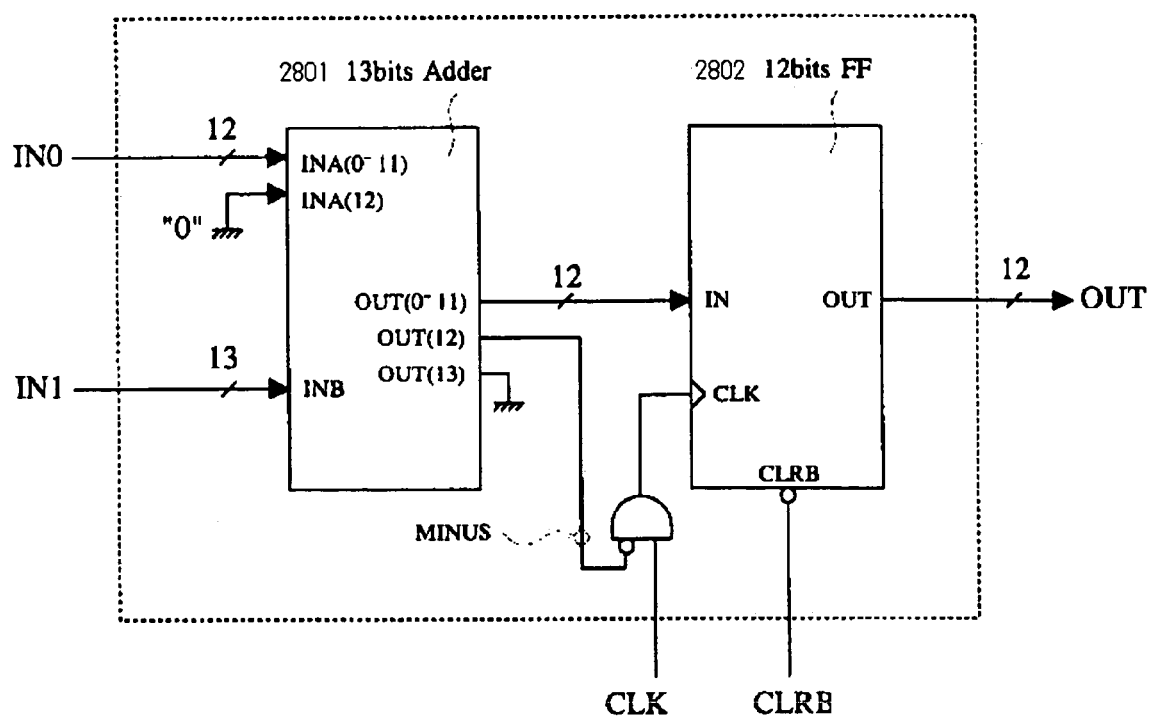
FIG. 28 is a diagram showing the configuration of a 13-bit adder circuit of the timer circuit of FIG. 25 (2504 of FIG. 25).

FIG. 28 shows the configuration of the 13-bit adder (13 bit Adder) 2504 in the timer of FIG. 25. The 13-bit adder (13 bit Adder) 2504 includes an adder (13 bit Adder) 2801 for summing IN0 (12 bits) and IN1 (13 bits) together, and a 12-bit flip-flop 2802 for sampling outputs of the adder (13 bit Adder) with clock signal CLK. When an output of the 13th bit OUT (12) of the adder 2801 is at a high level, the CLK is masked.

Figure 29:
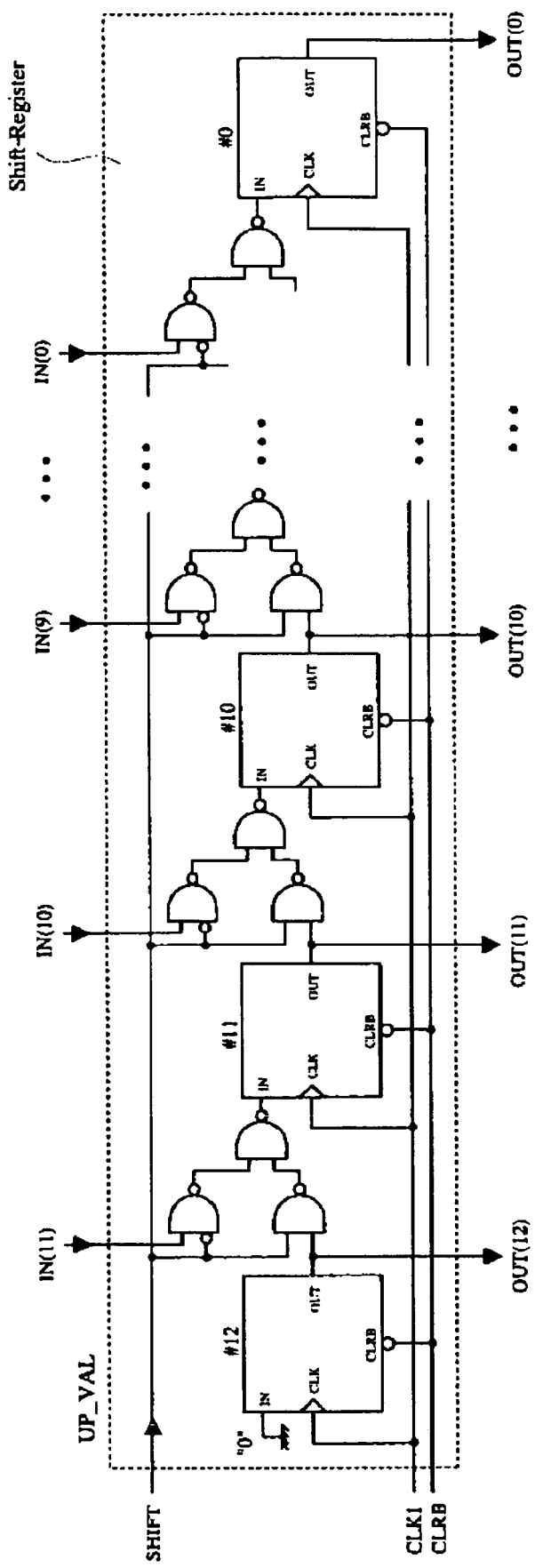
FIG. 29 is a diagram showing the configuration of a period addition value calculating circuit of the timer circuit of FIG. 25 (2506 of FIG. 25).

FIG. 29 shows the configuration of the period sum calculating circuit (UP_VAL) 2506 of FIG. 25. The period sum calculating circuit (UP_VAL) includes a shift register having a 13-stage data shift register #0 to #12. The data shift register #0, an input IN of which is supplied with a NAND result of a NAND output of an input IN(0) and an inverted version of the shift signal SHIFT and a NAND output of an output of the data shift register of the previous stage #1 and an inverted version of the shift signal SHIFT, samples the input with the clock signal CLK to output the result as OUT(0). The data shift register #10, an input IN of which is supplied with a NAND result of a NAND output of an input IN (10) and an inverted version of the shift signal SHIFT and a NAND output of an output of the data shift register of the previous stage #11 and an inverted version of the shift signal SHIFT, samples the input with the clock signal CLK to output the result as OUT (10). The data shift register #11, an input IN of which is supplied with a NAND result of a NAND output of an input IN(11) and an inverted version of the shift signal SHIFT and a NAND output of an output of the data shift register of the previous stage #12 (output being "0") and an inverted version of the shift signal SHIFT, samples the input with the clock signal CLK to output the result as OUT(12).

Figure 30:
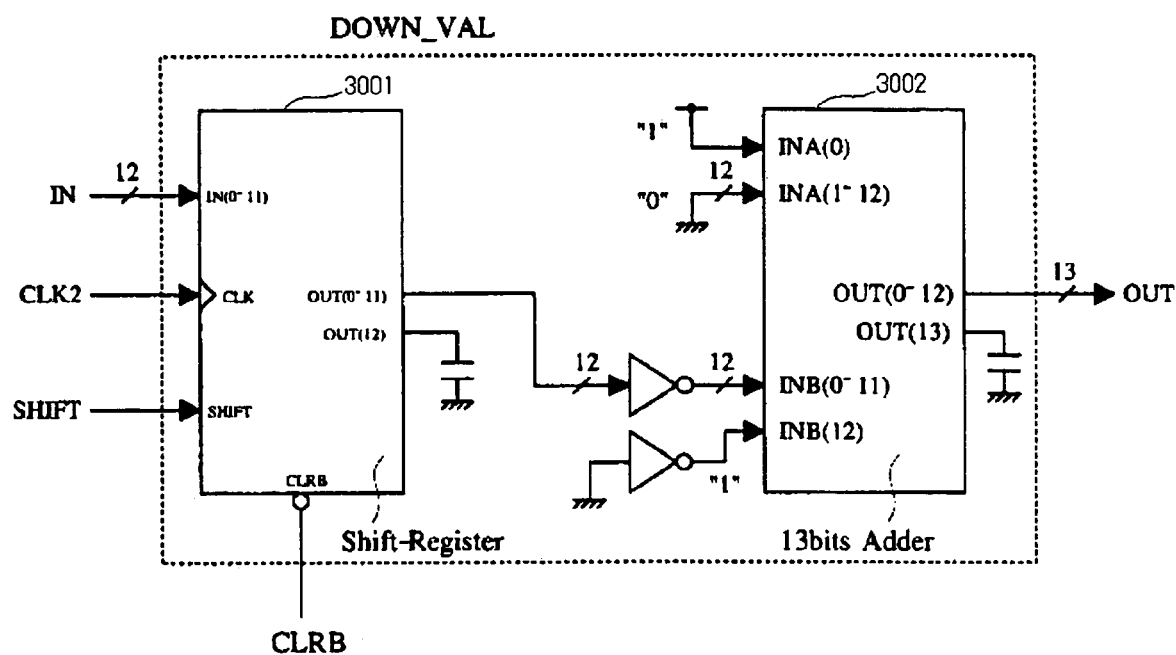
FIG. 30 is a diagram showing the configuration of a period subtraction value calculating circuit of the timer circuit of FIG. 25 (2507 of FIG. 25).

FIG. 30 shows the configuration of the period subtraction value calculating circuit (DOWN_VAL) 2507 in the timer of FIG. 25. The period subtraction value calculating circuit (DOWN_VAL) 2507 includes a shift register 3001, supplied with an input IN to shift the input responsive to the shift signal SHIFT based on a shift clock signal CLK, and an adder (13 bit Adder) 3002 for outputting 2's complements of the output of the shift register.

Figure 31:
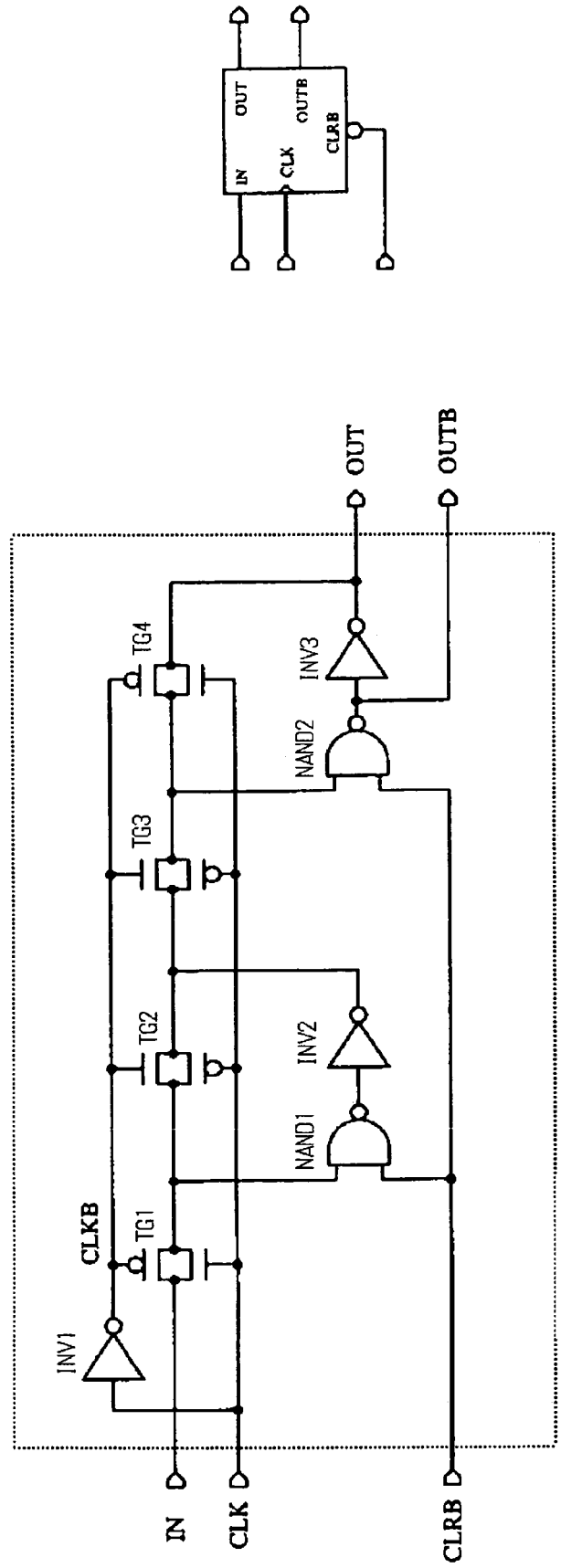
FIG. 31 is a diagram showing the configuration of an embodiment of a data register.

FIG. 31 shows an illustrative configuration of the data register of FIG. 29. Transfer gates TG1 to TG4 are connected across the input IN and the output OUT. The transfer gates TG1 and TG4 are turned on with the high level of the clock signal CLK, while the transfer gates TG2 and TG3 are turned on with the low level of the clock signal CLK. The output of TG1 is coupled to TG2 via NAND1 and INV2, while the output of TG1 is coupled to output OUT via NAND2 and INV3. When the low active signal CLRB is at a low level, the output OUT is at a low level, and the OUTB is at a high level. When the CLRB is at a high level and the clock signal CLK transfer from a low level to a high level, the input signal IN is transmitted through the TG1 in the on-state to the output of TG2 in the off-state, through NAND 1 and INV2, while being transmitted through the on-state TG3 to turn TG4 off so as to be output to output OUT through NAND2 and INV3. When the clock CLK is at a low level, TG1 is turned off, while the output OUT holds and outputs the value for the high level of the clock CLK.

Figure 32:
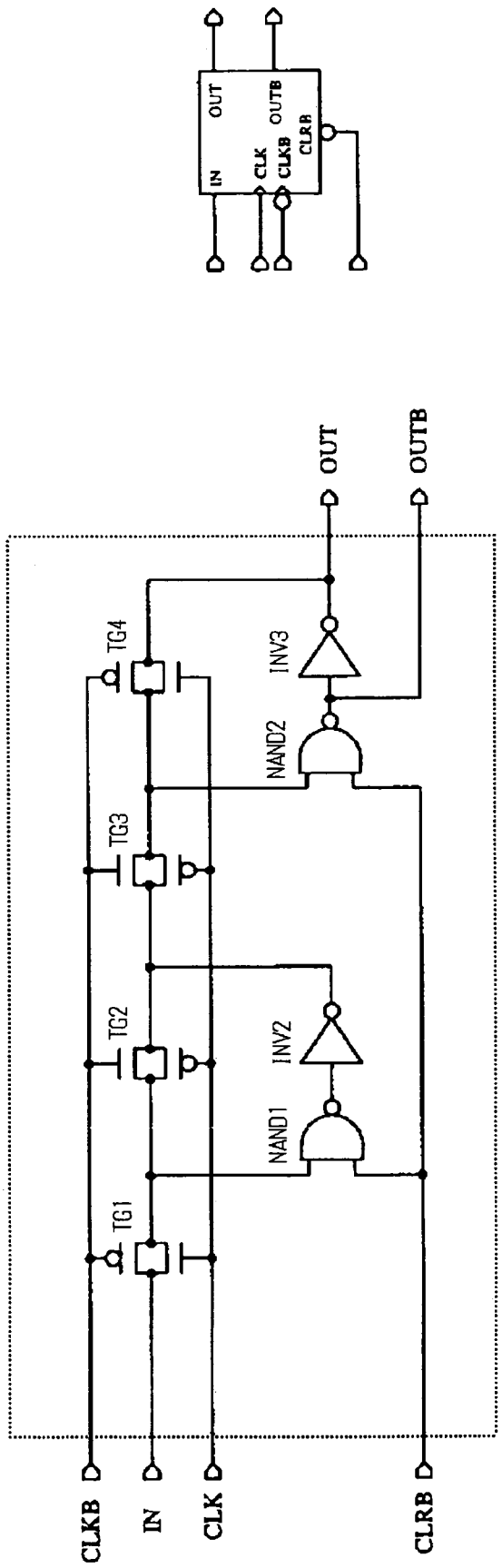
FIG. 32 is a diagram showing the configuration of another embodiment of the data register.

FIG. 32 shows another configuration of the data registers of FIG. 29. This data register receives a clock signal with a differential mode. That is, the data register receives a clock signal CLK and clock signal CLKB which is complementary with respect to a clock signal CLK. The inverter INV1 of FIG. 31 is not needed. The configuration is otherwise the same as that of FIG. 31.

Figure 33:
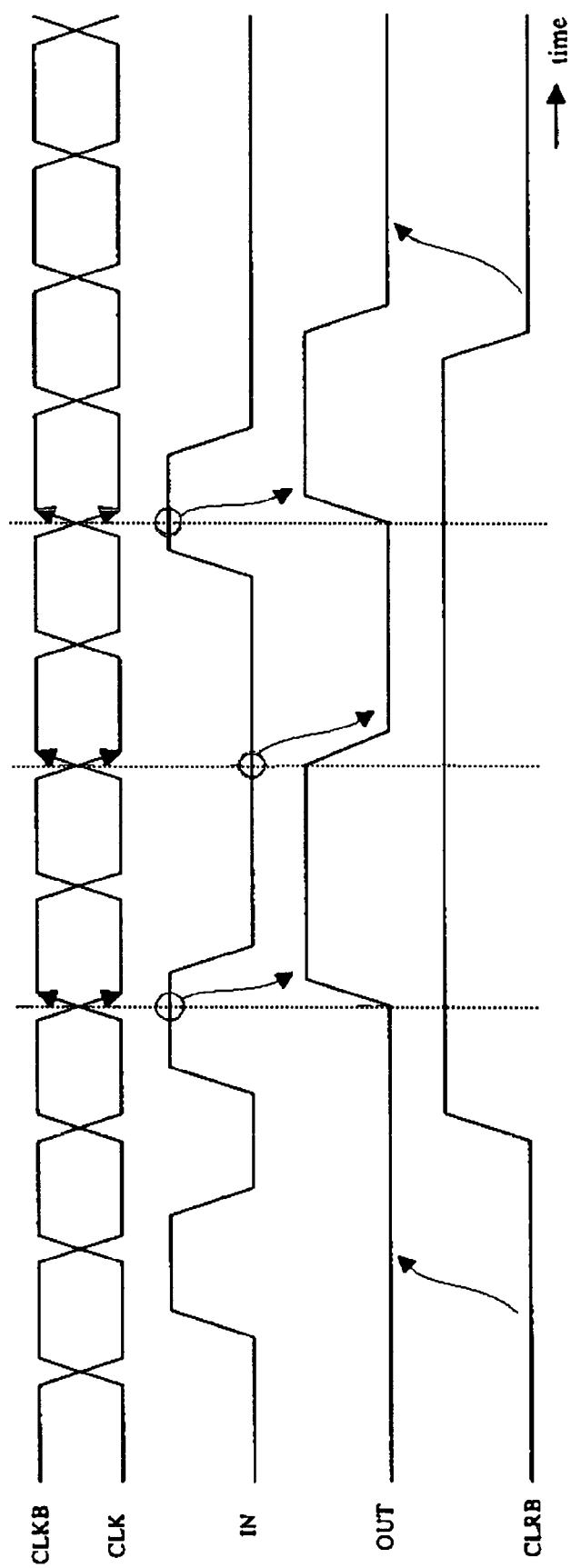
FIG. 33 is a diagram showing an example of an operating waveform of the data register.

FIG. 33 shows the operating waveform of the data register of FIG. 31 or 32. With CLRB at a low level, the output OUT is reset, and the input IN is sampled and output with the rise of CLK.

Figure 34:
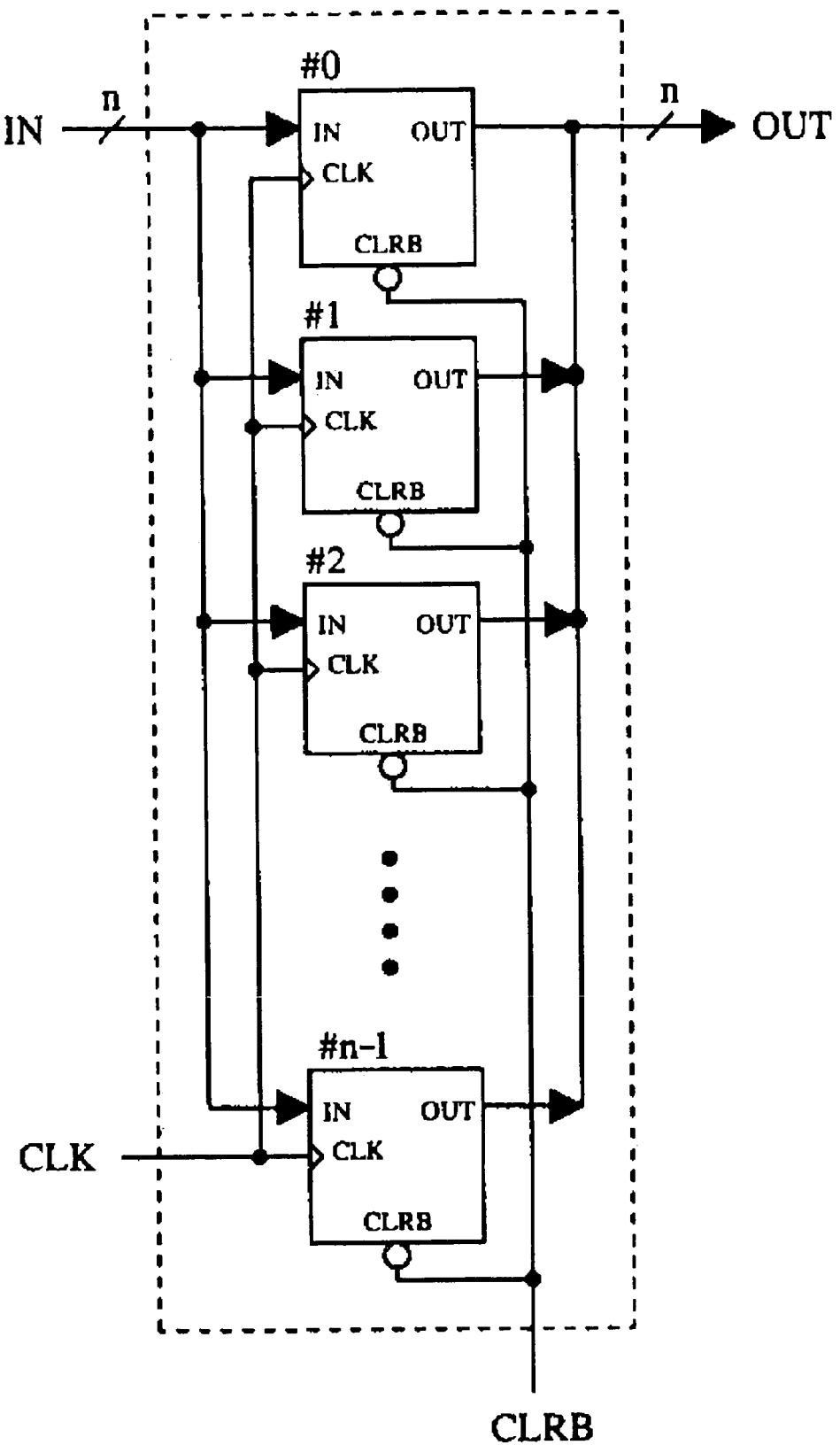
FIG. 34 is a diagram showing the configuration of an n-bit data register (FF).

FIG. 34 shows the configuration a 12-bit FF in a 13-bit adder of FIG. 28. This configuration is made up by parallel connection of n data registers of FIG. 31.

Figure 35:
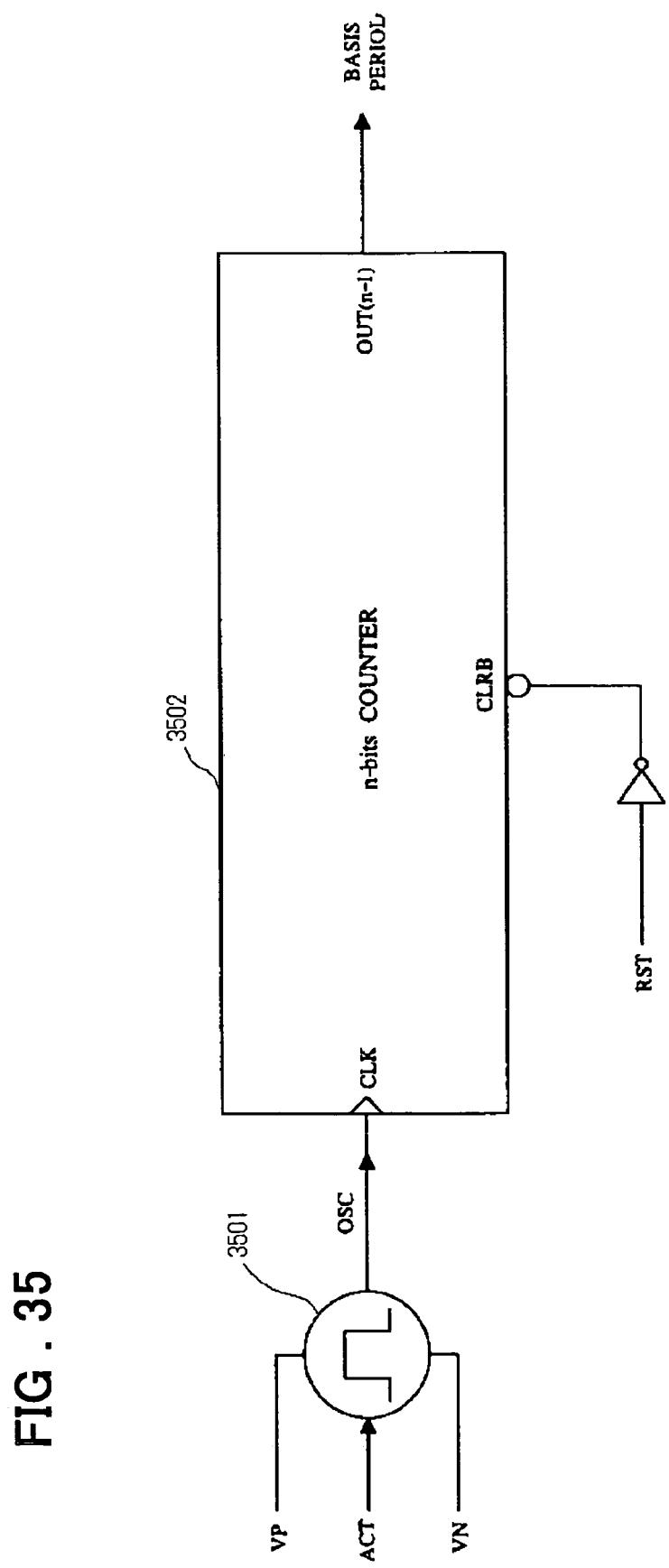
FIG. 35 is a diagram showing the configuration of a refresh basis period generating circuit.

FIG. 35 shows the configuration a basis refresh period generating circuit composed of an oscillator circuit 3501 and an n-bit counter 3502. The oscillator circuit 3501 is made up by a ring oscillator which oscillates when the ACT signal is in an activate state and which has the oscillation frequency variably controlled depending on the setting of the bias voltages VP and VN. A n-bit counter 3502 is supplied with and counts up with an oscillation clock signal output from the oscillator circuit 3501 to deliver a count output Out (n−1) as a basis period signal (BASIS PERIOD). When an RST signal is at a high level, the CLRB terminal is at a low level and the n-bit counter 3502 is reset.

Figure 36:
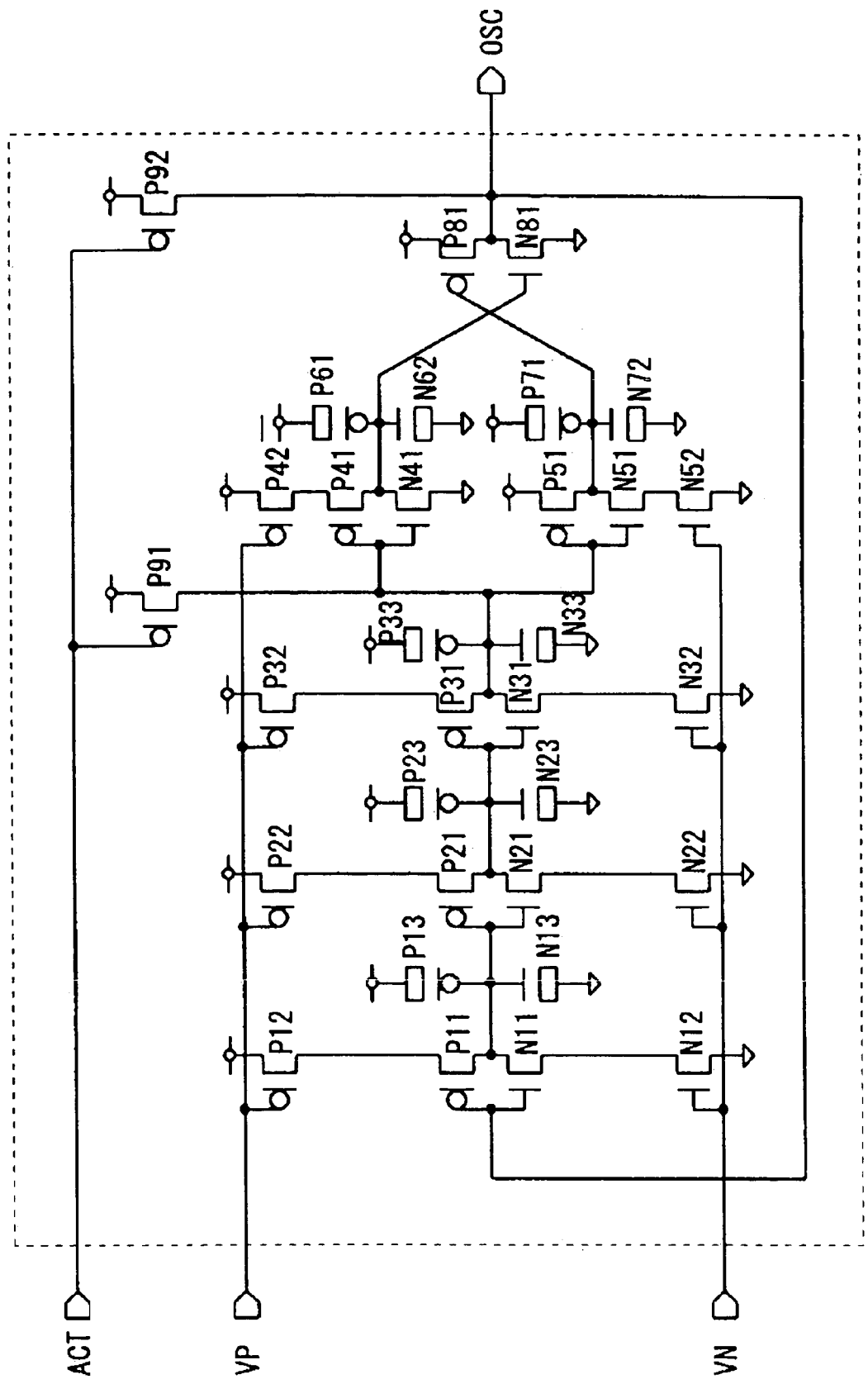
FIG. 36 is a diagram showing the configuration of a basis oscillator circuit (oscillator of FIG. 35).

FIG. 36 shows an illustrative configuration of the oscillator circuit 3501. The oscillator circuit is configured as a ring oscillator which has oscillation halted when the signal ACT is at a low level and which is activated when the signal ACT is at a high level. The oscillation frequency is determined by the capacitance of the MOS capacitor added and by the values of the bias voltages VP and VN. When the signal ACT is at a high level or low level, the ring oscillator, substantially formed by five stage inverters, is oscillated or halted, respectively.

Referring to FIG. 36, there are provided CMOS inverters P11 and N11 and current source transistors P12 and N12, the gates of which are supplied with bias voltages VP and VN, across the power supply VCC and the ground, and MOS capacitors P13 and N13 are provided to output nodes of the inverter. The above configuration makes up each of first to third stage inverters. There is provided a current source transistor P42 across the fourth stage inverter (P41, N41) and a power supply VCC. The current source transistor P42 has its gate supplied with the bias voltage VP. There is provided a current source transistor N52 across the fourth stage inverter (P51, N51) and the ground. The current source transistor N52 has its gate supplied with the bias voltage VN. An output end of the third stage inverters (P31, N31) is connected common to output ends of the fourth stage inverters (P41, N41) and to input ends of the fourth stage inverters (P51, N51). The two output ends of the fourth stage inverter are connected to the input end of the fifth stage CMOS inverter (driver circuit) (P81, N81), whilst the output end of the fifth stage CMOS inverter (driver circuit) (P81, N81) is connected to the input end of the first stage inverter (P11, N11). A pMOSFET 91, the gate of which is supplied with the signal ACT, is connected across the output end of the third stage inverter (P31, N31) and the power supply VCC, and a pMOSFET 92, the gate of which is supplied with the signal ACT, is connected across the output end of the fifth stage inverter (P81, N81) and the power supply VCC. With the signal ACT at a low level, the pMOSFETs 91 and 92 are turned on, the inputs to the fourth stage inverter (P41, N41, P52, N51) are at a high level, with the output OSC2 being fixed at a high level to halt the oscillation. With the above-described ring oscillator, the period of oscillation of the output signal OSC2 is variably set by varying the values of the bias voltages VP and VN. The output signal OSC2 may, of course, be at a low level when the oscillation is halted.

Figure 37:
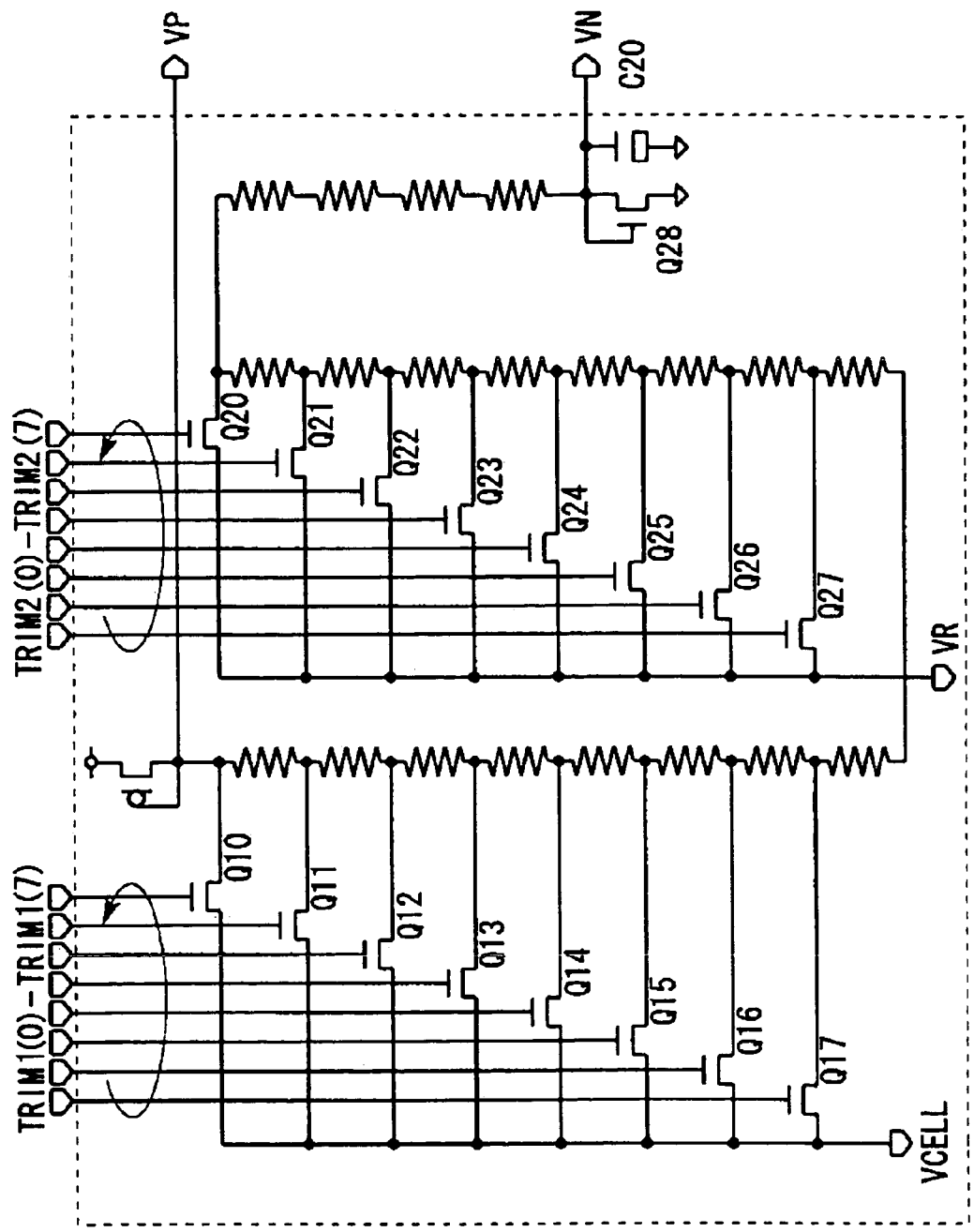
FIG. 37 is a diagram showing the configuration of the configuration of a bias circuit.

FIG. 37 shows the configuration of the bias voltage generating circuit adapted for generating the bias voltages VP and VN of FIG. 36. Referring to FIG. 37, switches Q10 to Q17 and Q20 to Q27 are provided for shorting the resistors of the series resistance circuit, and on/off switch control is exercised by trimming signals TRIM1 (0 to 7) and TRIM2 (0 to 7). Although there is no limitation to the trimming signals TRIM1 (0 to 7) or TRIM2 (0 to 7), these trimming signals TRIM1 (0 to 7) and TRIM2 (0 to 7) are formed by cutting the corresponding fuses.

Figure 38:
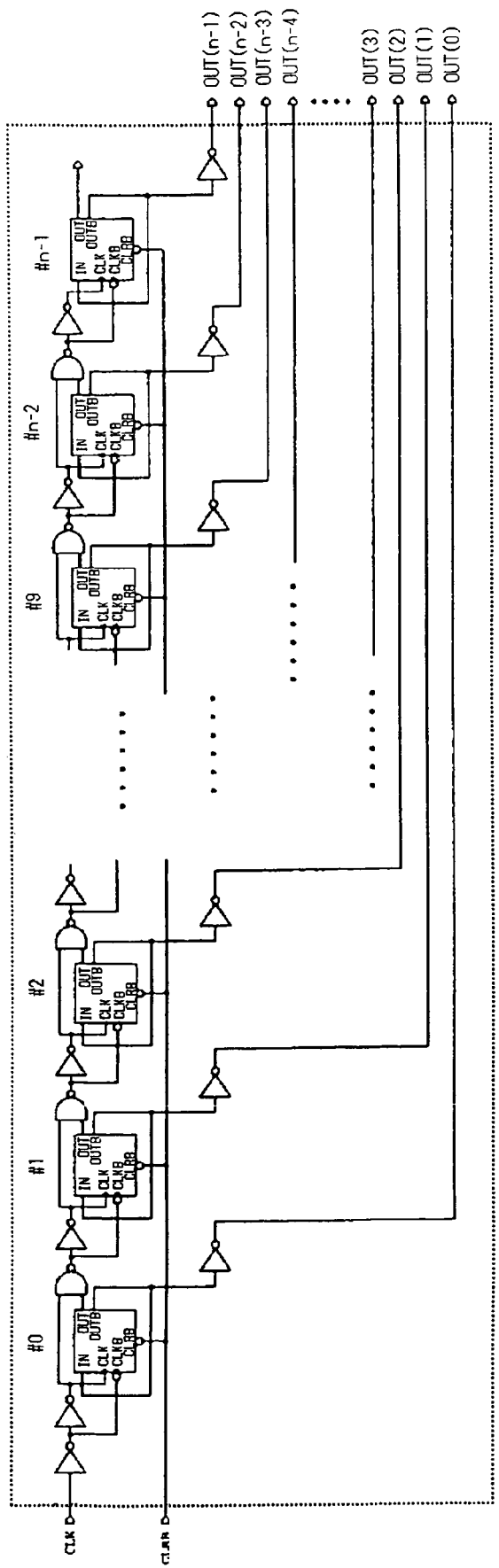
FIG. 38 is a diagram showing the configuration of an embodiment of a counter circuit (see FIG. 35).
Figure 39:
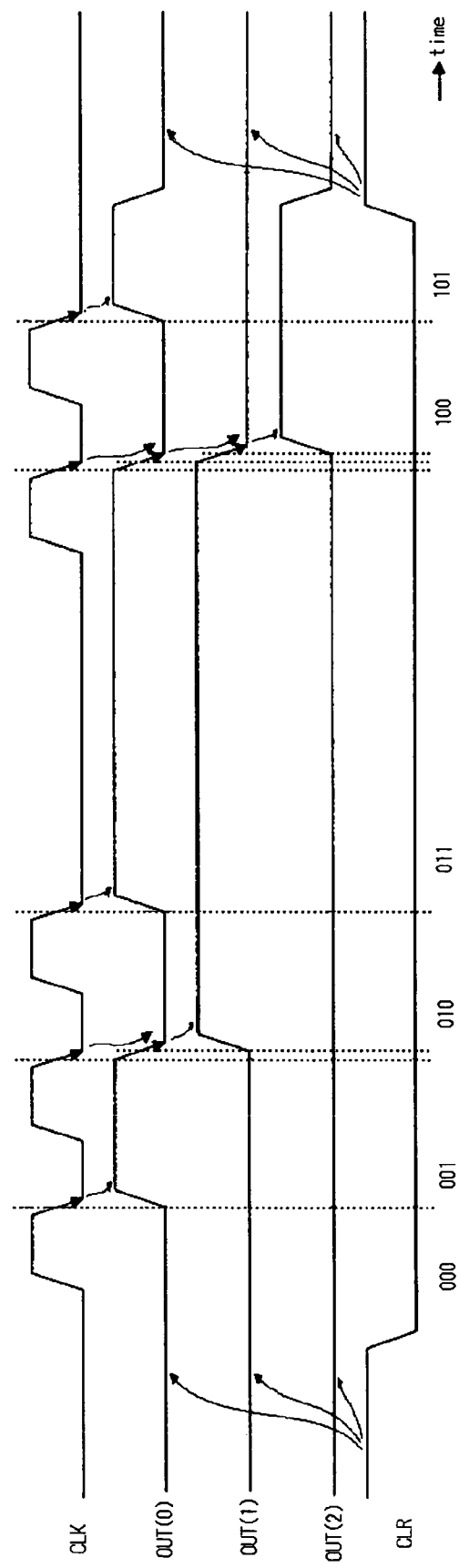
FIG. 39 is a diagram showing an example of an operating waveform of a counter circuit (see FIG. 38).

FIG. 38 shows the configuration of an n-bit counter 3502 (base-n counter) of FIG. 35, composed of n stages of the data register of FIG. 32. FIG. 39 depicts a timing diagram showing part of the operation of the counter of FIG. 38. An output OUT(0) is 1 with the first pulse of the clock signal CLK and outputs OUT(1) is 1 with the second pulse thereof. An output OUT(0) and an output OUT(1) are 1 with the third pulse of the clock signal CLK, an output (2) is 1 with the fourth pulse thereof and an output (2) and an output (0) are 1 with the fifth pulse thereof. Hence, the counter operates as an n-ary counter.

Figure 40:
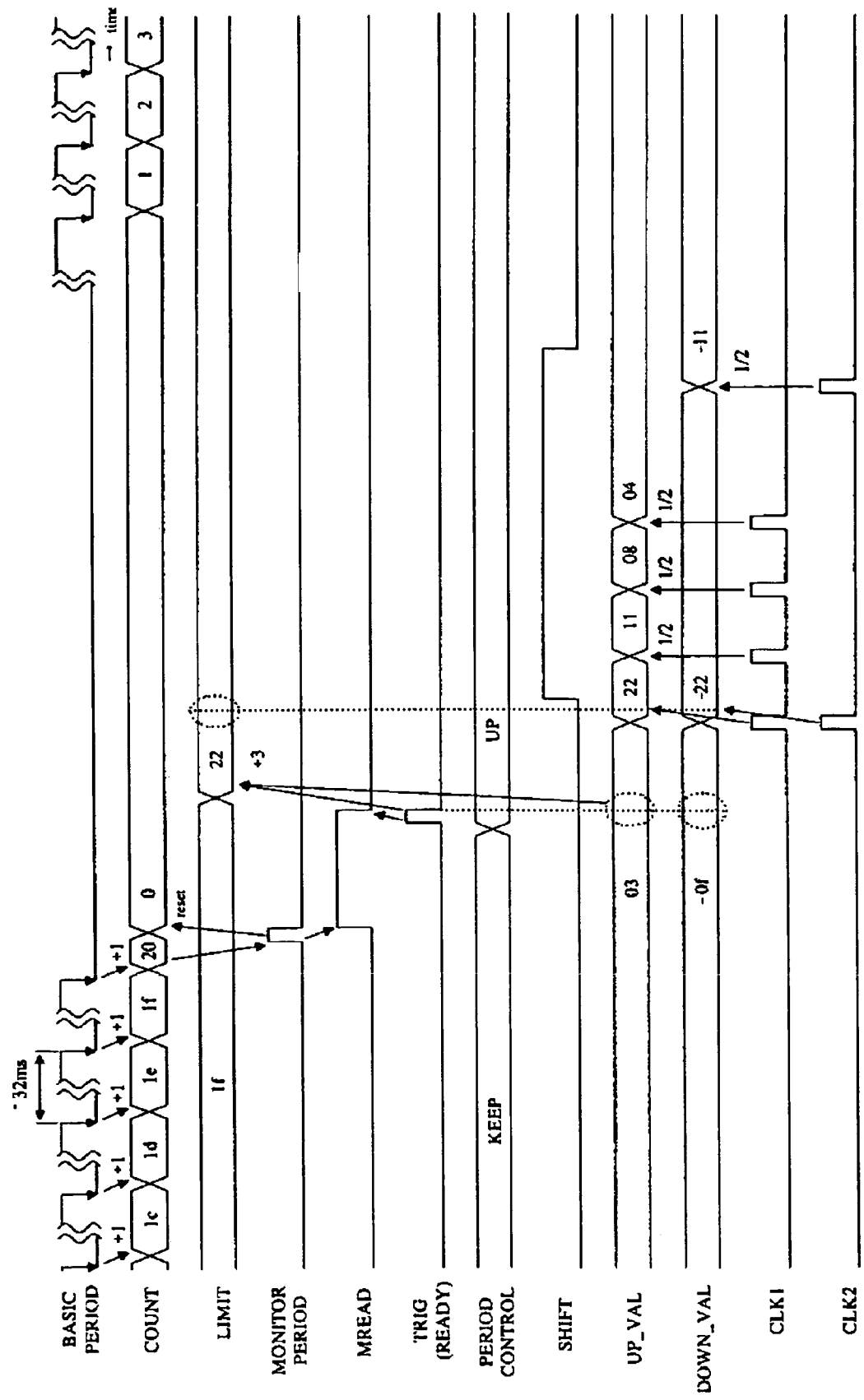
FIG. 40 is a diagram showing an example of an operating waveform of a timer circuit (FIG. 25).

FIG. 40 depicts a timing diagram showing the operation of the timer circuit of FIG. 25. The basis period (BASIS PERIOD) is 32 ms. When the counter (2508 of FIG. 25) is sequentially incremented and the count value thereof becomes equal to the value of LIMIT, the signal (MONITOR- PERIOD) is output as a pulse. Responsive thereto, a READ command (MONITOR READ) for the monitor area is issued (MREAD goes high) to carry out the READ operation of the monitor bits and the error rate count. The result is that the period control signal is changed from KEEP to UP.

Responsive to this period UP signal, an UP value (+3) is summed to the limit value which is thereby increased to 22 (hexadecimal). The clock signals CLK1 and CLK2 are then clocked. As the UP and DOWN values, ⅛ (½ multiplied by itself three times) of the LIMIT value is found and ½ is found, respectively.

That is, when LIMIT is 1f (hexadecimal), a 12-bit counter (2508 of FIG. 25) counts 'BASIS PERIOD'. When the count value of the 12-bit counter (2508 of FIG. 25) is 20 (hexadecimal), the comparator (2503 of FIG. 25) sets the signal (MONITOR PERIOD) to a high level and a one-shot pulse generator (2509 of FIG. 25) generates a one-shot pulse to reset the count value of the 12-bit counter (2508 of FIG. 25) to 0.

Responsive to the high level of the signal (MONITOR PERIOD), the signal MREAD (MONITOR READ) is activated. UP_VAL is set to 03 and DOEN_VAL is set to –0f. Responsive to the high level UP of the period control signal, UP_VAL is entered to a 13-bit adder (2504 of FIG. 25). Responsive to transition from the high level to the low level of the TRIG signal, LIMIT is set to 22 (hexadecimal) which is equal to 1f (output of the 13-bit adder 2504) added by 03.

On the other hand, an output value 22 of the 13 bit adder (2504 of FIG. 25) is set with the rise of the clock signal CLK1. UP_VAL is shifted to right, every clock signal CLK1, and is halved. An output value –22 of the 13 bit adder (2504 of FIG. 25) is also set in DOWN_VAL and is halved every clock signal CLK2.

FIG. 41 shows an illustrative configuration of the ECC controller 6. The ECC controller includes a BIST (Built-In Self Test) block 4101 and an ECC block 4105. The BISI block 4101 includes an error rate check circuit (ERATE CHECKER) 4102, a command generator 4103 and an address generator 4104.

The ECC block 4105 is responsive to the internal clock signal ICLK, encoding control signal ENCODE and decoding control signal DECODE to output an internal address, an internal command and a ready signal READY. The ECC block 4105 is also supplied from the ECC codec with ERROR and LOCATION to output a signal INIT, commanding the initialization, a signal PARITY, commanding the generation of parity, a signal SYNDROME, commanding the syndrome calculation, a signal CORRECT, commanding error correction, and a codec enable signal CODECE.

An address generator 4104 of the BIST block 4101 outputs an internal address signal IXA. The command generator 4103 outputs the read signal BITSR, write signal BISTW, initialization signal EINT, clock signal ACLK, DCLK and ECLK to the error rate calculating circuit (ERATE MONITOR).

The error rate check circuit (ERATE CHECKER) 4102 receives EBIT and OVER from the error rate calculating circuit (ERATE MONITOR) to output UP, DOWN and KEEP to the self-refresh control circuit (SELF REFRESH CONTROL).

Figure 42:
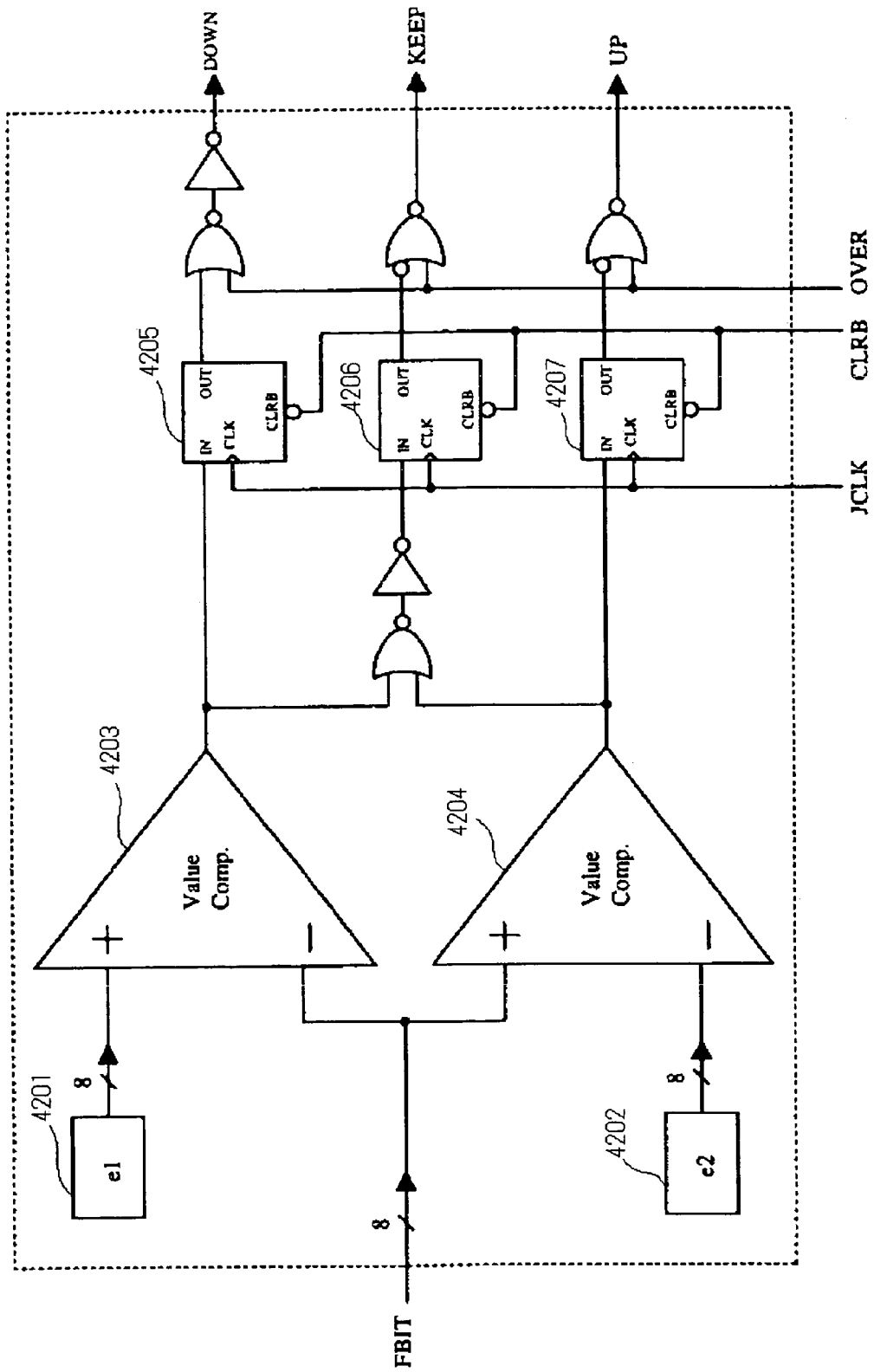
FIG. 42 is a diagram showing the configuration of an error rate check circuit (see FIG. 41).

FIG. 42 shows an illustrative configuration of the error rate check circuit (ERATE CHECKER) 4102 of FIG. 41. An actual circuit for implementing this circuit configuration is shown in FIGS. 43 to 48. The upper limit set value e1 and the lower limit set value e2 are supplied to comparators 4203 and 4204, respectively, which compose a window comparator. When the value of EBIT is between e1 and e2, outputs of the comparators 4203, 4204 are both low to supply a high level to a data register 4206. When OVER (output of the adder of FIG. 18) is at a low level (not overflowing), KEEP is at a high level.

When EBIT is not larger than e2, an output of the comparator 4204 is high and is sampled by a register 4207. When OVER is at a low level, UP is at a high level.

When EBIT is not less than e1, an output of the comparator 4203 is at a high level and is sampled by a register 4205. The signal DOWN is at a high level. When an overflow signal OVER is at a high level, the signal DOWN is at a high level, and the refresh period is shortened.

Figure 43:
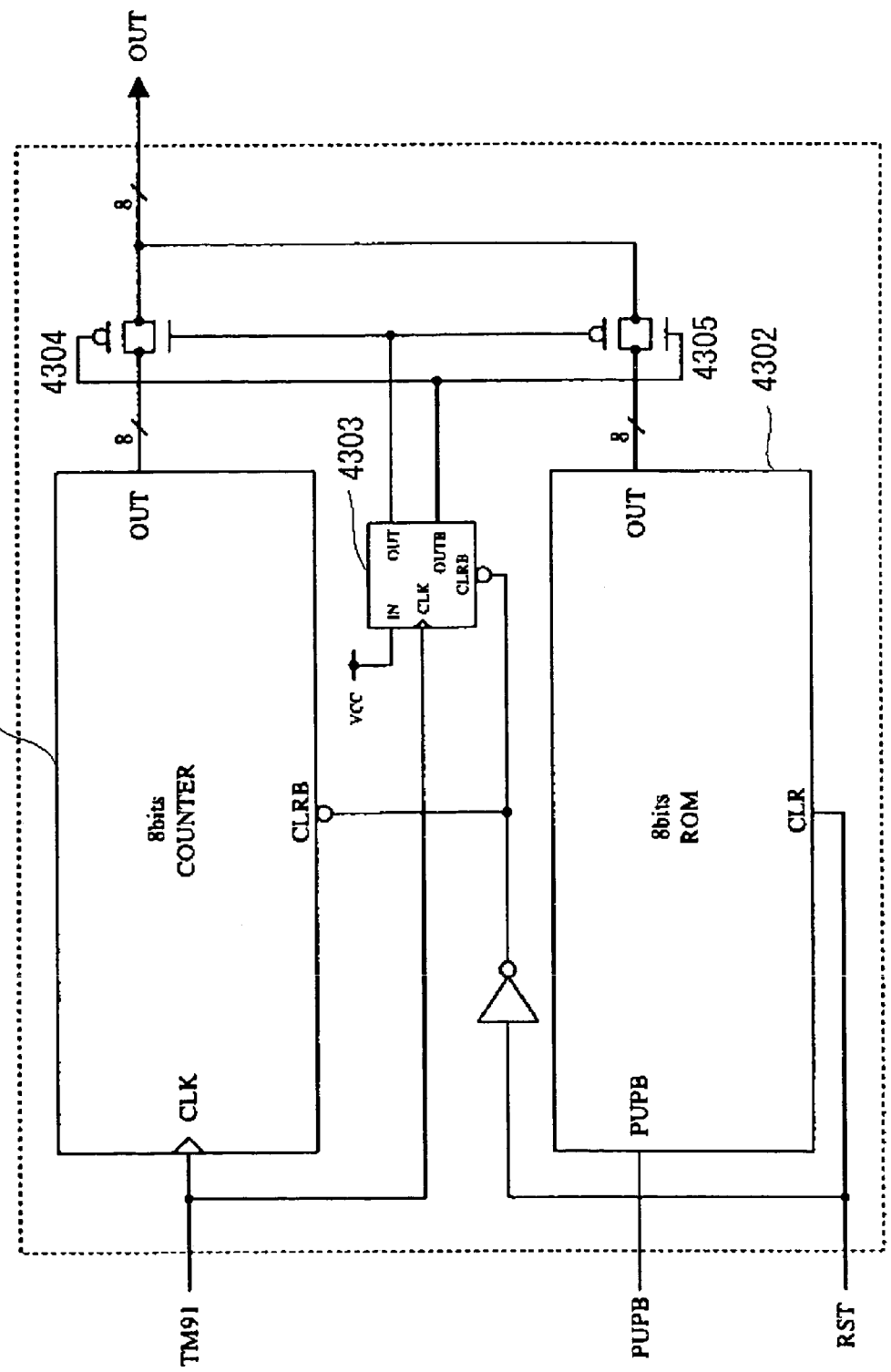
FIG. 43 is a diagram showing the configuration of an error set value storage circuit (4101 or 4102 of FIG. 42).

FIG. 43 shows the configuration of error set value storage circuits 4201 and 4202. The configuration includes an 8-bit fuse ROM 4302, an 8-bit counter 4301, and selector circuits 4304 and 4305 for selecting one of the outputs OUT of the 8-bit fuse ROM 4302 and an 8-bit counter 4301. The selectors 4304 and 4305 are supplied as a clock signal with a test mode signal TM91 and are selected by an output of a data register 4303 to an input terminal of which is supplied the power supply voltage VCC. A signal PUPB of an 8-bit fuse ROM goes high when the power supply voltage exceeds a predetermined voltage on power up. On power up and resetting, an output of the 8-bit fuse ROM is used as e1 and e2. During the test mode, the counter 4301 is set by TM91 to a desired count value.

Figure 44:
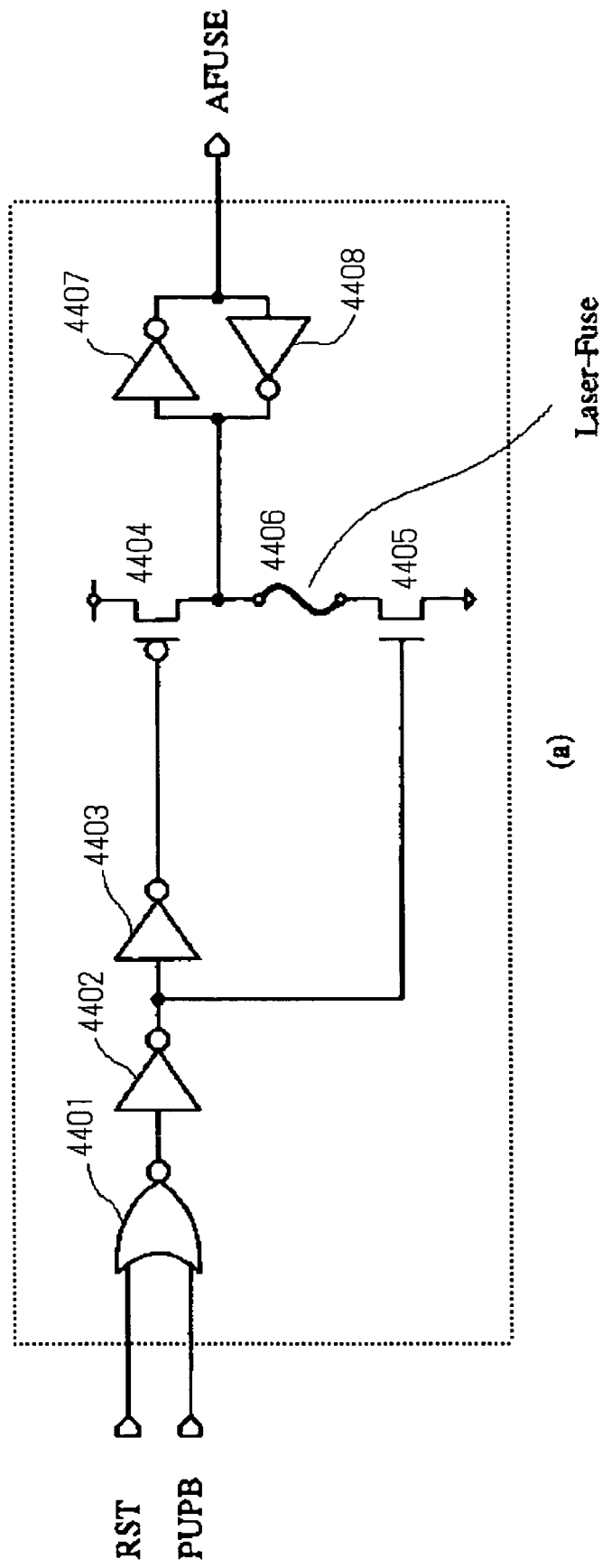
FIG. 44 is a diagram showing the configuration of a fuse ROM circuit (prior to severing).
Figure 45:
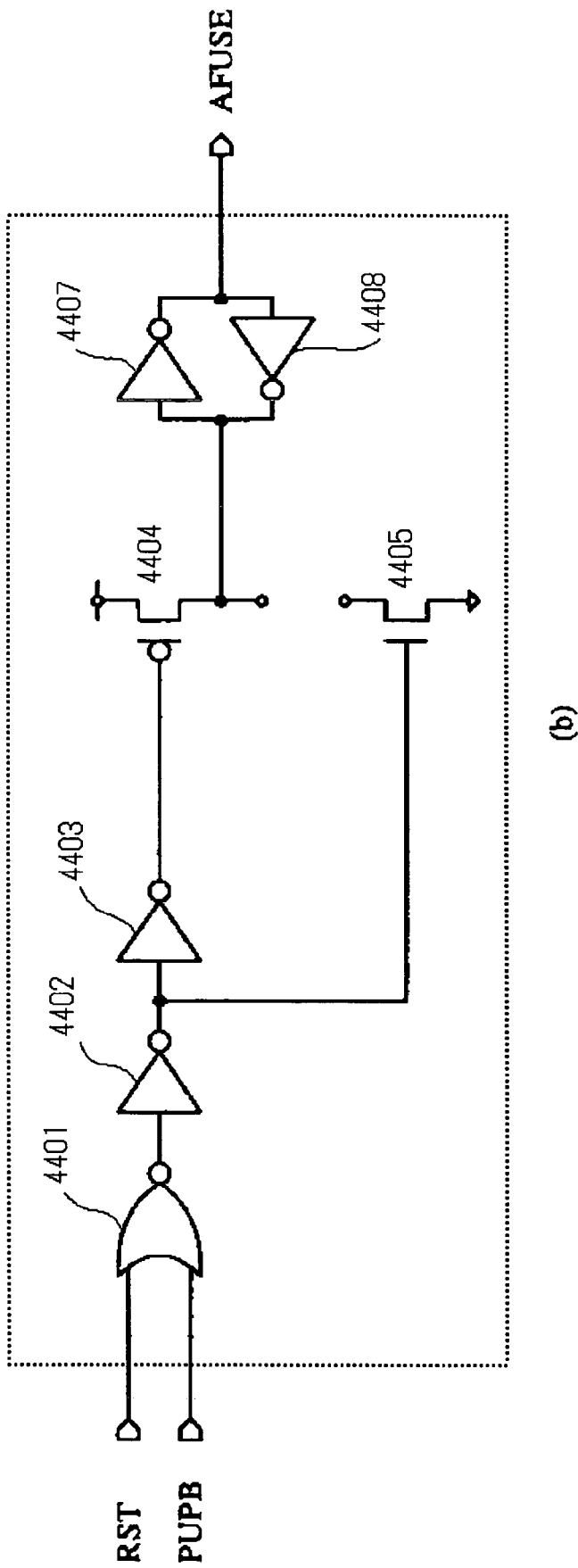
FIG. 45 is a diagram showing the configuration of the fuse ROM circuit (after severing).

FIGS. 44 and 45 depict a fuse ROM circuit and specifically show the circuit state before and after cutting off. Referring to FIG. 44, the circuit includes a NOR circuit 4401, supplied with a reset signal RST and a power-up signal PUPB, inverters 4402 and 4403, an nMOSFET 4405, which has a gate supplied with an output of the inverter 4402, a source grounded and a drain connected to one end of a fuse 4406, a pMOSFET 4404, which has a gate supplied with an output of the inverter 4403, a source connected to the power supply, and a drain connected to the other end of the fuse 4406, and a flip-flop (an inverter 4407 and an inverter 4408 having inputs and outputs cross-connected) supplied with a drain voltage of the pMOSFET 4404 and outputting an output signal AFUSE. In FIG. 44, when the reset signal RST and the power up signal PUPB are both low, the output of the NOR circuit 4401 is high, outputs of the inverters 4402, 4403 are low and high, respectively, and both the pMOSFET 4404 and the nMOSFET 4405 are turned off. When the power up signal PUPB or the reset signal RST are at a high level, an output of the NOR circuit 4401 is low, outputs of the inverters 4402, 4403 are high and low, respectively, and both the pMOSFET 4404 and the nMOSFET 4405 are turned on (it is noted that the drain voltage of the pMOSFET 4404 is a voltage corresponding to voltage division of the power supply voltage VCC by the sum of an on-resistance of the pMOSFET 4404, resistance of the fuse 4406 and the on-resistance of the nMOSFET 4405). In the present embodiment, the output AFUSE of the flip-flop is at a high level.

FIG. 45 shows the configuration of an cut-off fuse ROM. If, in FIG. 45, the reset signal RST and the power up signal PUPB are both low, an output of the NOR 4401 and an output of the inverter 4402 are at a high level, with the pMOSFET 4404 being turned off. When the power-up signal PUPB or the signal RST are at a high level, an output of the NOR 4401 is low and an output of the inverter 4403 is low, whilst the pMOSFET 4404 is turned on, the drain node of the pMOSFET 4404 is the power supply voltage and an output AFUSE of the flip-flop is at a low level. When the signal RST is at a high level, the outputs of the NOR 4401 and the inverter 4403 are at low levels, the nMOSFET 4404 is turned on and the flip-flop outputs a low level as the signal AFUSE.

Figure 46:
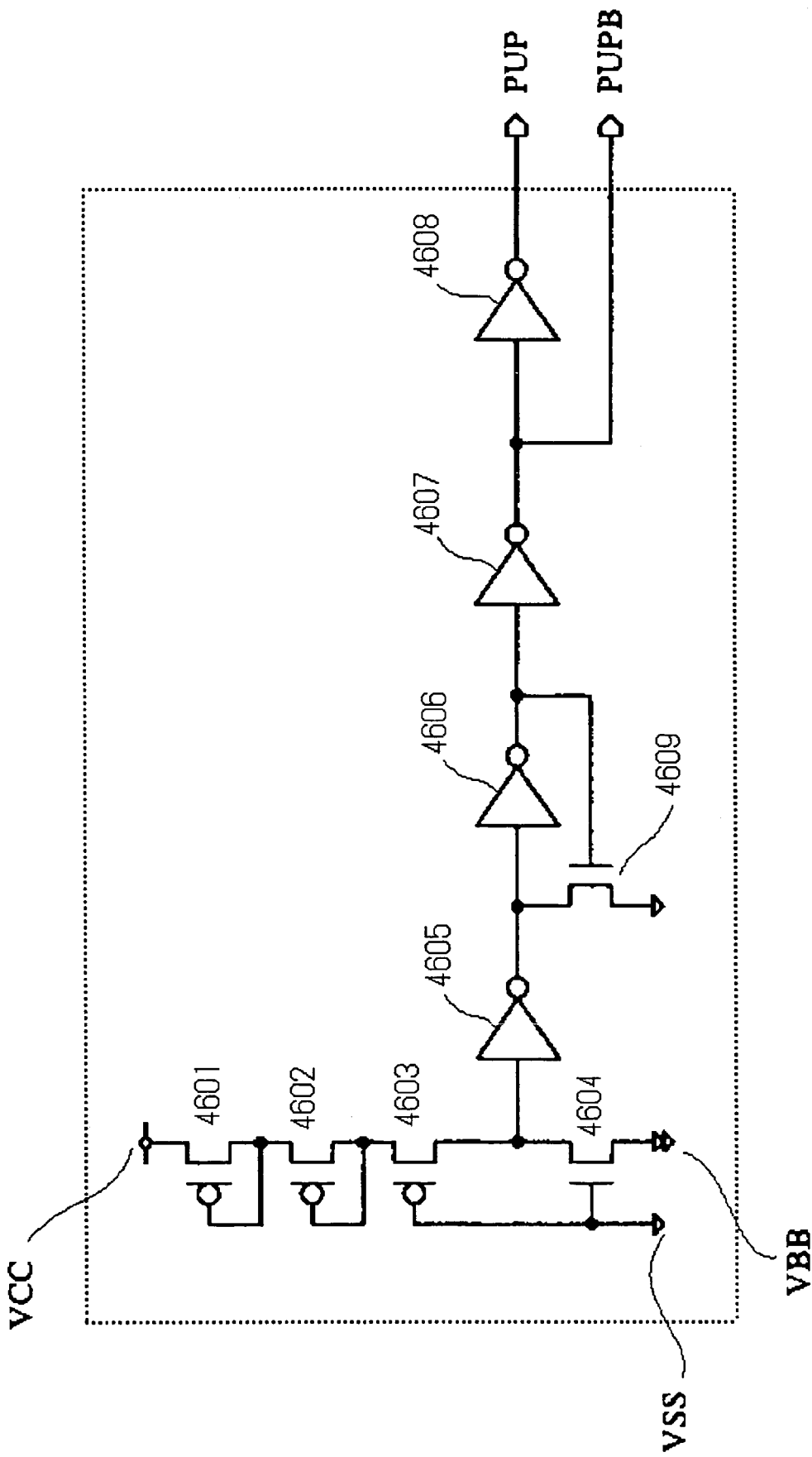
FIG. 46 is a diagram showing the configuration of an embodiment of a power-up circuit (supplying PUPB to FIGS. 44 and 45).
Figure 47:
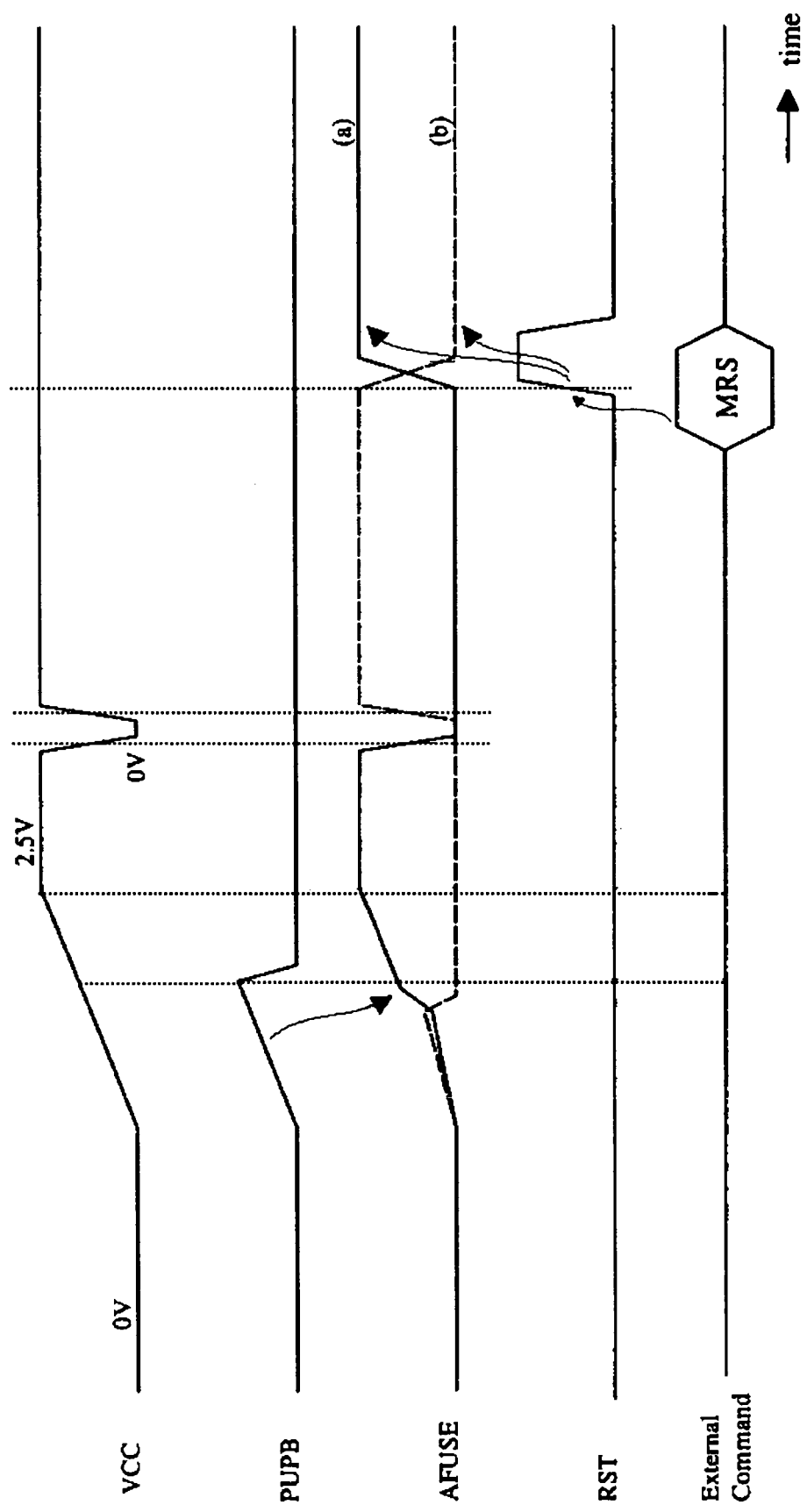
FIG. 47 is a diagram showing a typical operating waveform of a fuse circuit.

FIG. 46 depicts an illustrative configuration of a power-up detection circuit outputting the power up signals PUPB and PUP. The power-up detection circuit, shown in FIG. 46, outputs, as PUPB, a signal waveform (PUPB), shown in FIG. 47, when the power supply voltage VCC rises on power up to a predetermined voltage. FIG. 47 shows signal waveforms of PUPB and AFUSE when on power up (VCC) the status is established by internal reset (RST). In FIG. 47, a signal AFUSE output from the circuit of FIG. 44 is indicated by a solid line (AFUSE(b)), and a signal AFUSE output from the circuit of FIG. 45 is indicated by a broken line (AFUSE(b)). In FIG. 46, cascode-connected pMOSFETs 4601 and 4602, each of which has a gate and a drain interconnected in a diode configuration, and a pMOSFET 4603 and an n-MOSFET 4604, each of which has a gate connected to the low potential side power supply voltage (ground potential) VSS, are connected in series between the VCC and the substrate bias VBB. The drains of the pMOSFET 4603 and the n-MOSFET 4604 are connected in common to a buffer string of a string of inverters 4605 to 4608. A signal PUP is delivered from an output of the inverter 4608 and an inverted signal PUPB is delivered from an output of the inverter 4607. There is provided an nMOSFET 4609, connected across an output of the inverter 4605 and VSS, and an output of the inverter 4606 is entered to the gate of the nMOSFET 4609, Referring to FIGS. 46 and 47, at a time point when on power up the power supply voltage VCC has begun to rise from 0V, the nMOSFETs 4601 and 4602 are turned off. The memory array substrate voltage VBB descends from 0 to a negative voltage. When the gate-source voltage of the nMOSFET 4604 exceeds the threshold voltage, the nMOSFET 4604 is turned on and the input voltage of the inverter 4605 is at a low level. The output of the inverter 4605 rises slightly and the signal PUP transiently begins to rise. When the power supply voltage VCC is further increased, the pMOSFETs 4601 to 4603 are turned on. The input voltage of the inverter 4605 is the voltage corresponding to the power supply voltage VCC divided by the on-resistance of the pMOSFETs 4601 to 4603 and the on-resistance of the nMOSFET 4604. The output of the inverter 4605 and the signal PUPB falls.

Also, in the fuse ROM of FIG. 44, as the power supply voltage VCC on power up is increased, the signal AFUSE is of a waveform shown by a solid line of FIG. 47. The signal RST is at a low level, the output of the NOR 4401 is at a low level with changes in the rise of the signal PUPB, and the outputs of the inverters 4402 and 4403 are at a high level and at a low level, respectively. The input voltage of the inverter 4407 is a voltage corresponding to the power supply voltage VCC divided by the sum of the resistance of the pMOSFET 4404 and the fuse 4406 and the on-resistance of the nMOSFET 4405. As the power up signal PUPB falls, and the output of the NOR 4401 is at a high level, the outputs of the inverters 4402 and 4403 are at a low level and at a high level, respectively. The pMOSFETs 4404 and 4405 are both turned off and the output signal AFUSE rises to follow the rise of the power supply voltage VCC of the inverter 4407. If, after power off (VCC=0V), the power supply is turned on, the output signal AFUSE of the inverter 4407 remains low and a reset pulse signal RST is output by a mode resister setting command (MRS) entered to a memory (SDRAM). The signal AFUSE is set to a high level (see solid line (a) of FIG. 47).

On the other hand, in the fuse ROM of FIG. 45, the signal AFUSE becomes of a waveform as shown by a broken line in FIG. 47, as the power supply voltage VCC on power up rises. As the signal PUPB rises, with the signal RST at a low level, the output of the NOR 4401 (see FIG. 45) is at a low level, the output of the inverter 4403 is at a high level, the pMOSFET 4404 is turned on and an output signal AFUSE of the inverter 4407 outputs a low level. As the signal PUPB falls to a low level, the output of the NOR 4401 is at a high level, the outputs of the inverters 4402 and 4403 are at low and high levels, respectively, the pMOSFET 4404 is turned off and the signal AFUSE is at a low level. If, after momentary power down, the power supply is turned on, the output signal AFUSE of the inverter 4407 goes high. As a mode register setting command (MRS) is entered to an SDRAM (synchronous DRAM), forming a memory of the present embodiment, a reset pulse signal RST is output. The signal AFUSE is set to a low level (see broken line (b) of FIG. 47).

Figure 48:
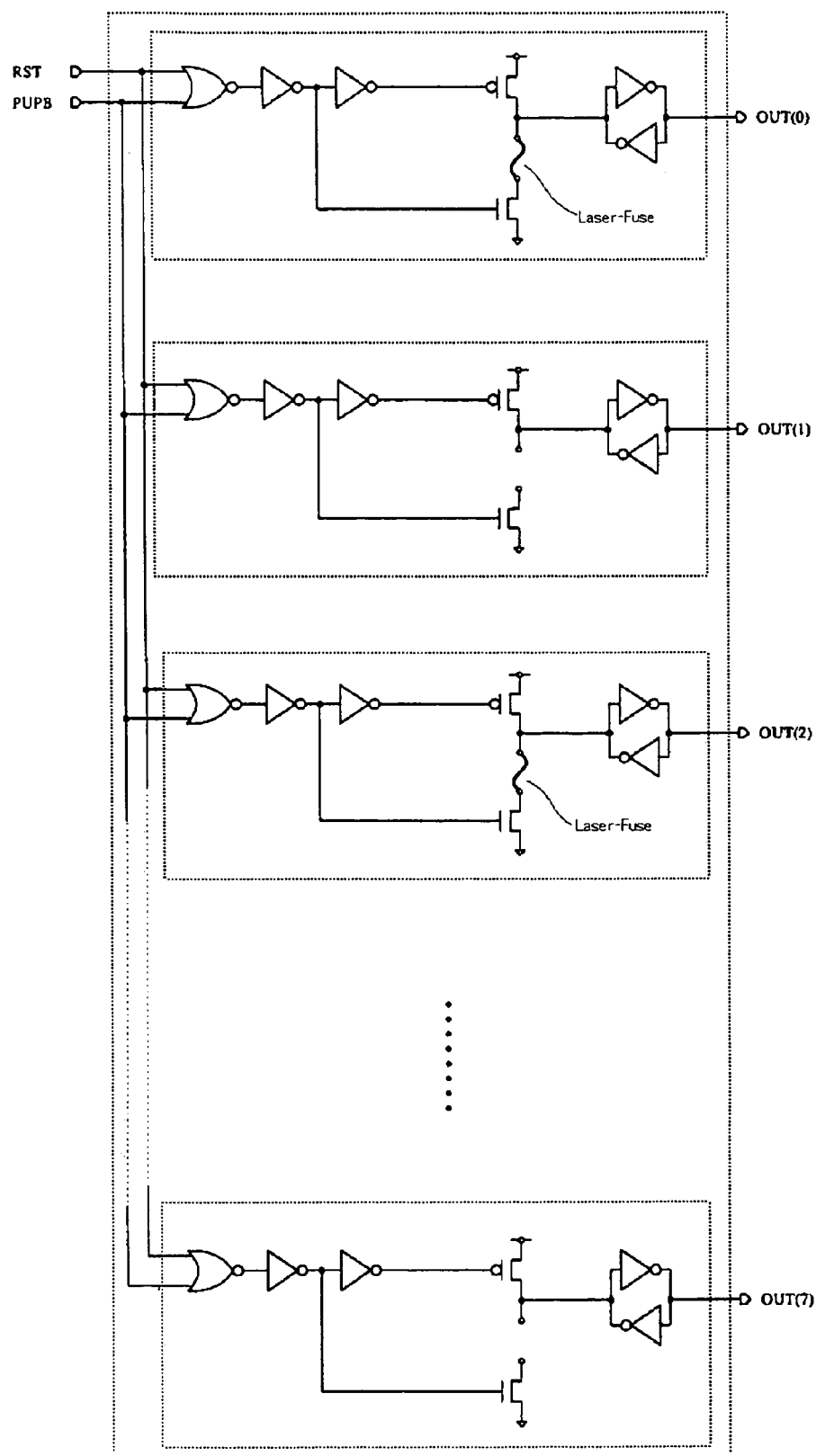
FIG. 48 is a diagram showing the configuration of an 8-bit fuse ROM circuit of FIG. 43.

FIG. 48 shows an illustrative configuration of an 8-bit fuse ROM of FIG. 43. This 8-bit fuse ROM includes a parallel connection of eight 1-bit fuse ROMs, described with reference to FIGS. 44 and 45, and outputs OUT(0) to OUT(7).

Figure 49:
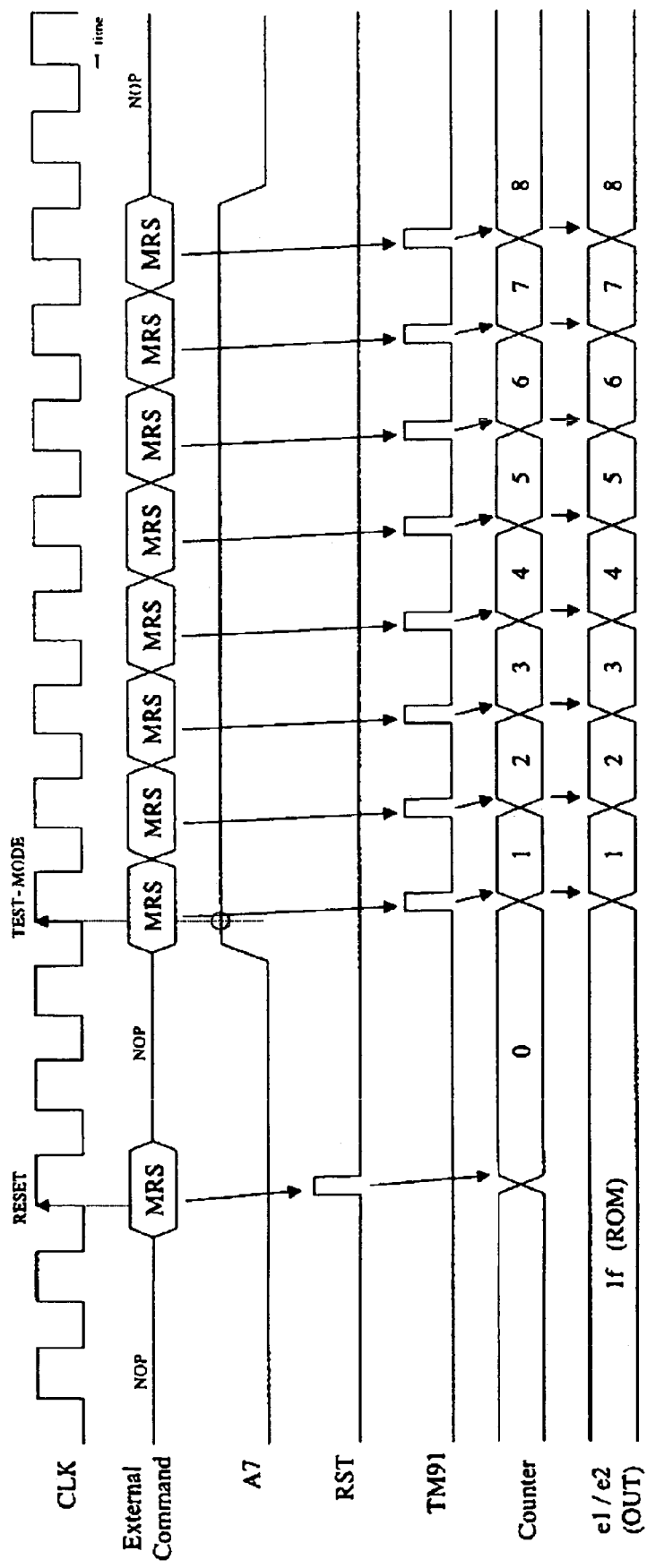
FIG. 49 shows a typical operating waveform of a test mode of an error set value storage circuit of FIG. 43.

FIG. 49 shows an operating waveform during the test mode of the error set value storage circuit of FIG. 43. An MRS command with A7=high level is operated as a test mode command. When a test mode command is entered, an output of an error set value storage circuit is switched from an output signal of the fuse ROM to a counter output. That is, an MRS command is entered first with A7=low level. A one-shot pulse of the reset signal RST is output and the value of the counter 4301 is reset to 0. e1/e2 is an output of the fuse ROM 4302 and is in this case 1f. Then, A7 is set to a high level and a signal TM91 (one-shot pulse) is output each time the MRS command is entered. The count value of the counter 4301 is incremented by one each time. By entering a test mode command (the MRS command at A7=high level) in succession, the count value of the counter 4301 is counted up so that it may be set to a desired test value.

Figure 50:
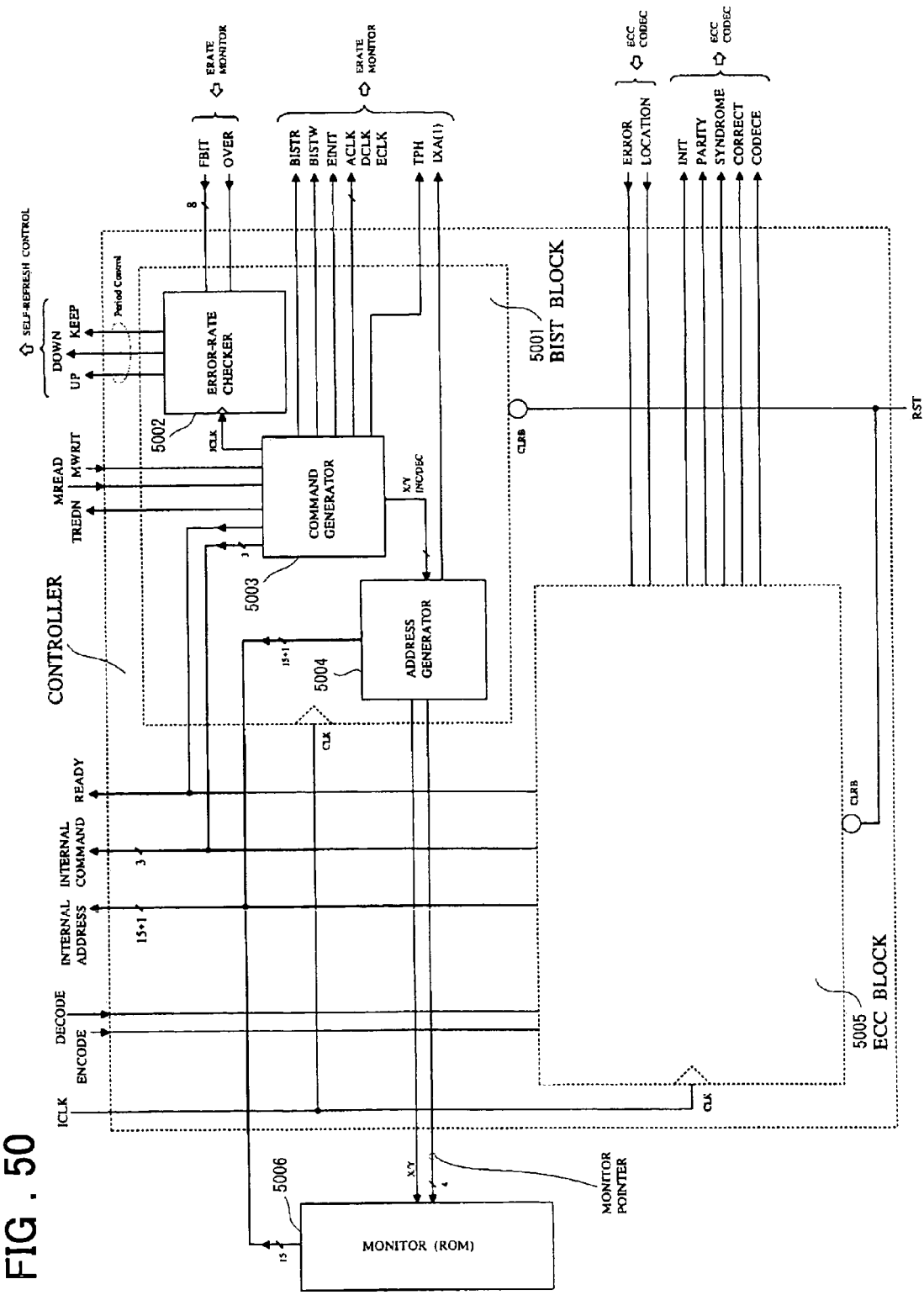
FIG. 50 is a diagram showing the configuration of an ECC controller carrying the self refresh period error rate monitor control function (6 of FIG. 16).

FIG. 50 shows the configuration of an ECC controller (6 of FIG. 16) provided with a self refresh period error rate monitor control function. The circuit shown in FIG. 50 corresponds to the circuit structure of FIG. 41 added by a monitor M5006 adapted for generating a monitor bit internal address. The X/Y information from an address generator 5004 (4-bit output) is supplied to a monitor ROM 5006. The internal address output from the monitor ROM 5006 is entered to an address register 213 (FIG. 16).

Figure 51:
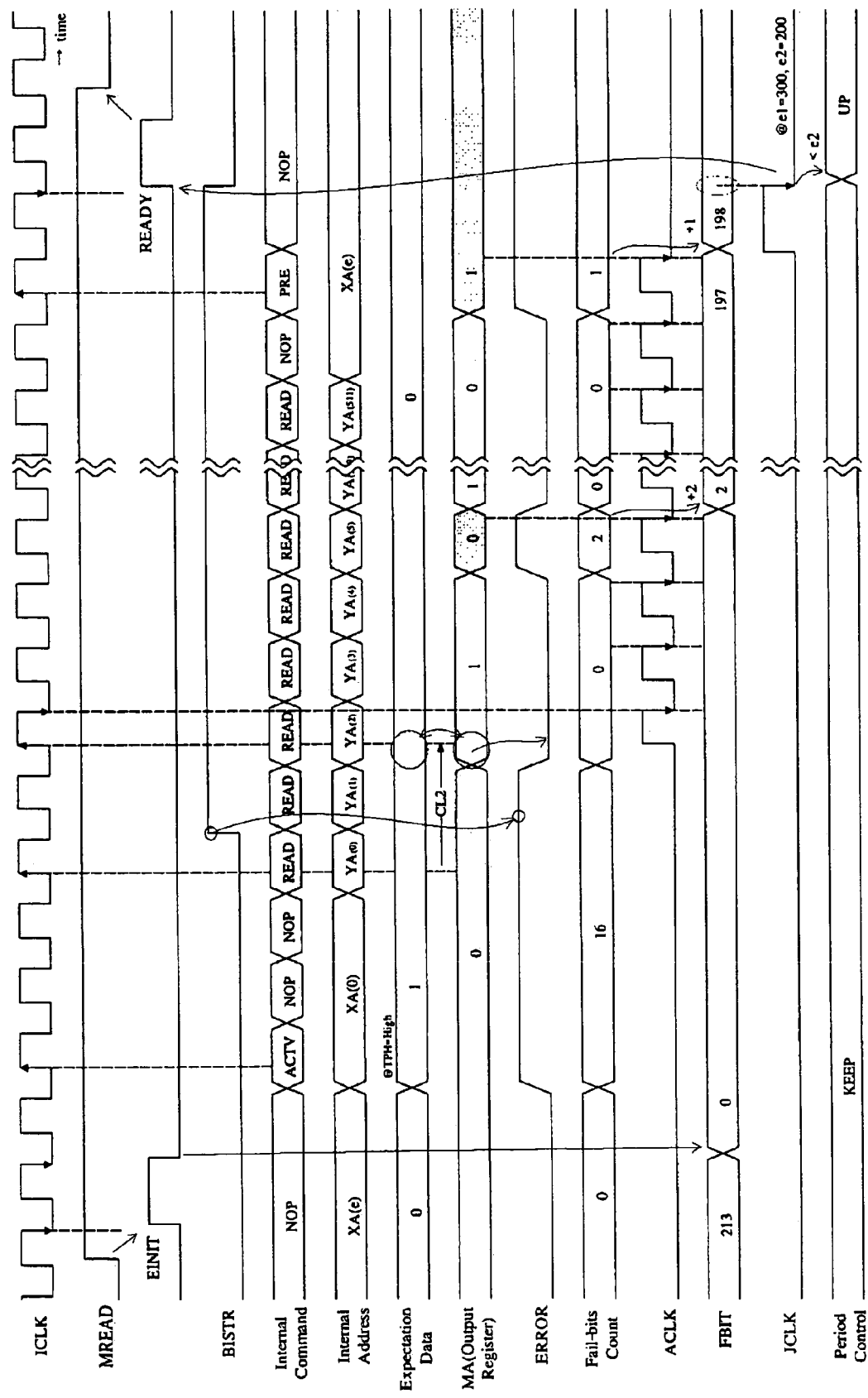
FIG. 51 shows a typical operating waveform of an ECC controller carrying an error rate monitor control function (READ operation from the monitor memory and error count).

FIG. 51 shows a typical operating waveform of an ECC controller carrying out the error rate monitor control function. There are shown the read operation and the error count operation from a monitor memory. The configuration of FIG. 18 is used for the error rate calculating circuit 11, and the burst read is used for the read operation.

By the MREAD (MONITOR READ), the initializing signal EINIT goes high, error count is cleared and EBIT is cleared to 0, as shown in FIG. 51.

An ACT command and an internal address XA(0) are supplied, a monitor cell is read by a READ command and YA(0) (CAS latency CL=2) and the signal BISTR is set to a high level. An output 1 of MA (OUTPUT REGISTER) is propagated to a comparator circuit (1802 of FIG. 18) and compared with an expected value 1 at TPH=high level, while ERROR is set to a low level (pass).

The read data of the internal address YA(1) is set to 1, which differs from the expected value 1, so that the ERROR is at a high level, and FBIT at 16 I/O, which is 2 (output of the adder 1804), is output to the BIST controller. When the reading of address data of YA (511) comes to a close, a precharge command is entered. 198 of FBIT is compared with the clock signal JCLK with e1 and e2. Since FBIT is smaller than e2, an UP signal is output and control is carried out for elongating the timer period. When reading from the monitor bit has come to a close, READY (one-shot) is output and MREAD is set to a low level.

Figure 52:
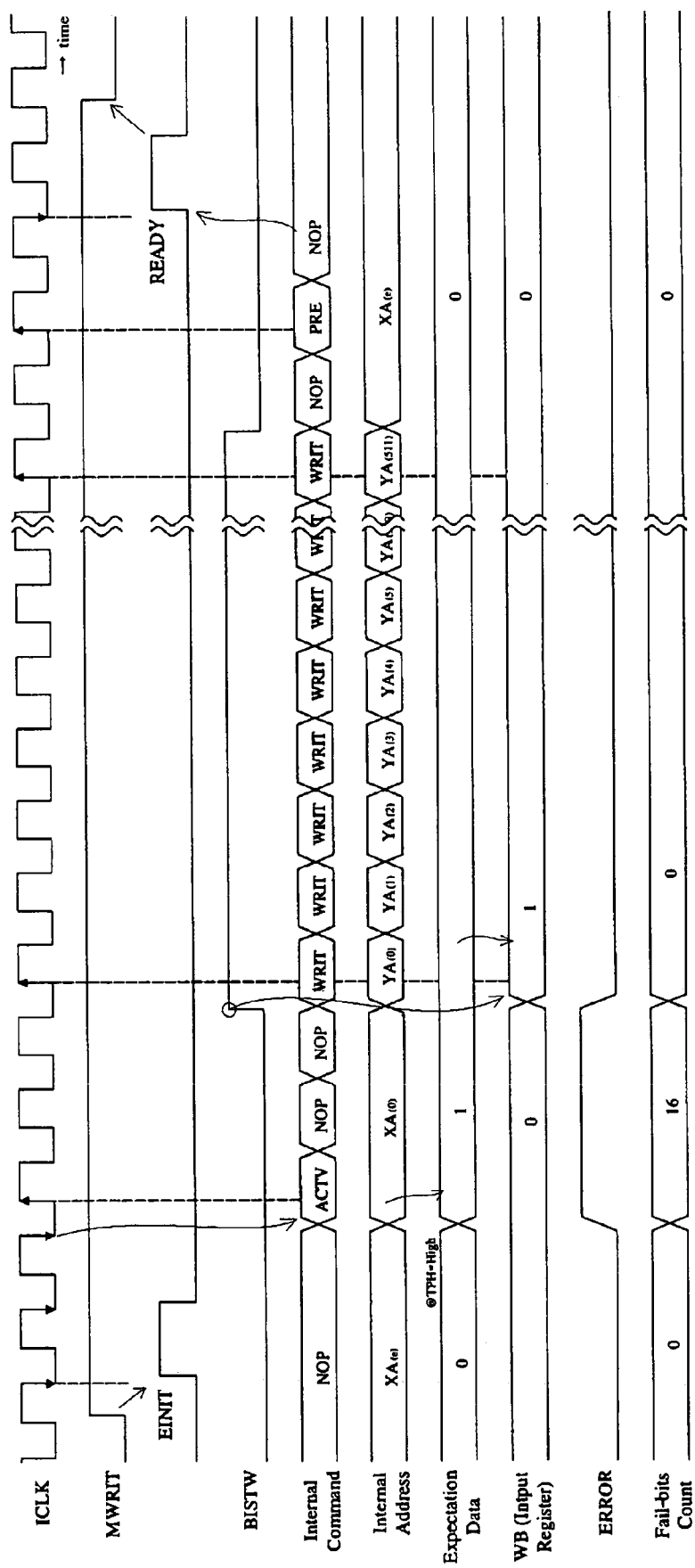
FIG. 52 shows a typical operating waveform of an ECC controller carrying an error rate monitor control function (WRITE operation to the monitor memory and error count).

FIG. 52 shows an example of an operating waveform of the ECC controller 6 carrying out the error rate monitor control function, and specifically shows a write operation for a monitor cell. A row address XA(0) is entered by an ACTV command, a Y address is supplied with a WRITE command, and expected value data is supplied by the high level of the signal BISTW to a WB (input register) so as to be written in the monitor bit.

Figure 53:
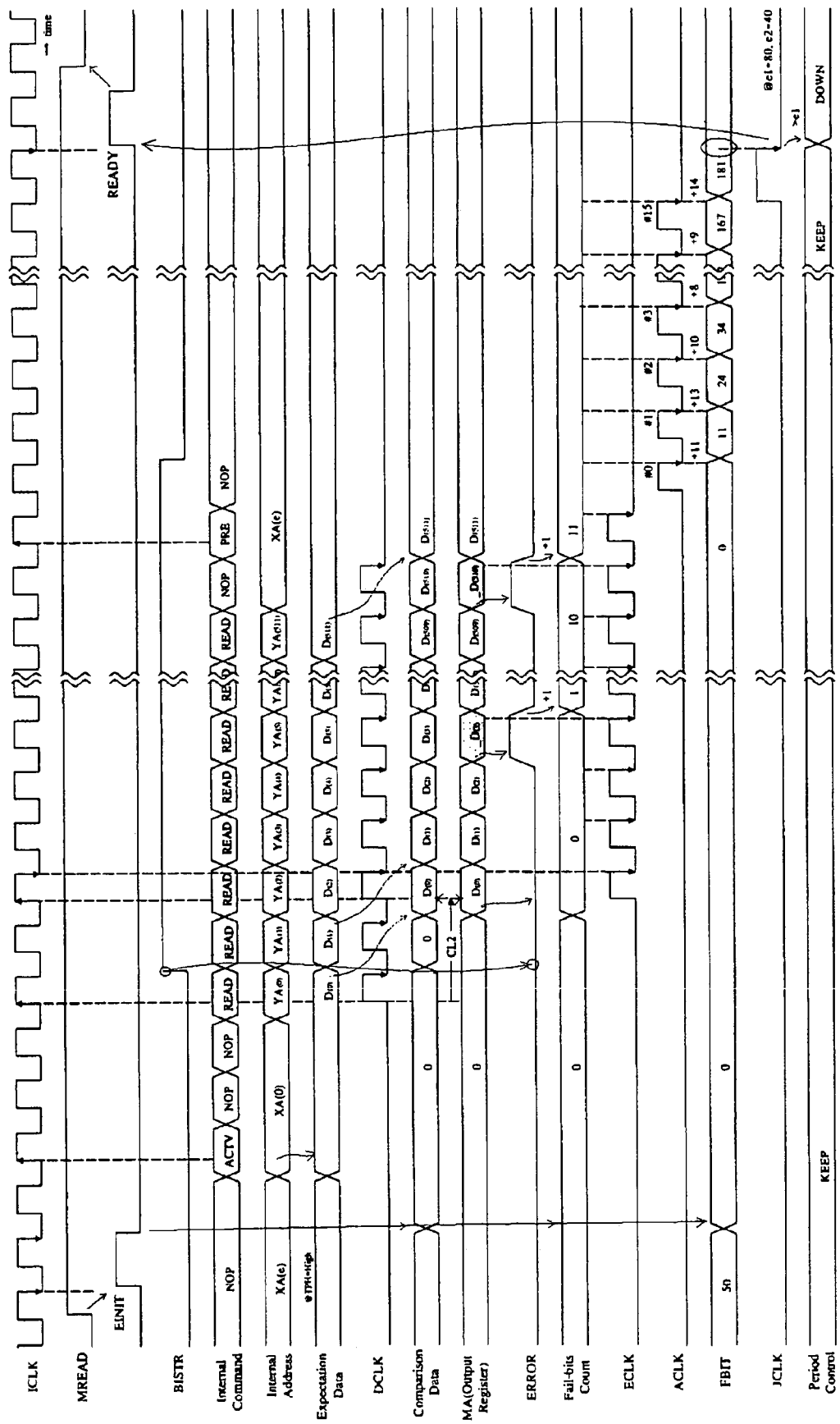
FIG. 53 shows a typical operating waveform of an ECC controller carrying an error rate monitor control function (READ operation from the monitor memory and error count).

FIG. 53 shows another example of the operating waveform of the ECC controller 6 carrying out the error rate monitor control function. There is shown the operation when FIG. 17 is used as the error rate calculating circuit and burst read is used as the read operation. After the reading of the monitor bit is finished, error counts of adders of I/O (#0 to #15, totaling at 16 I/O) are summed together. The FBIT is cleared with the initializing signal EINIT, X(A) is entered with the ACTV command, a READ command and a Y address YA(0) are entered, and read data from the monitor bit of YA(0) is supplied at the CAS latency CL2 to a comparator circuit (BISTR being at a high level) and compared with the expected value. Then, YA(1) to YA(511) are sequentially read. The ERROR signals are summed together by the counter from one I/O to the next. After READ operation of XA(0) and YA(511), a precharge command is entered, BISTR goes low, 16 ACKs are supplied and error count values for #0 to #15 are summed together as FBIT. In the present embodiment, FBIT is 181 which is larger than e1 for e1=80, e2=40. Hence, the DOWN signal is activated and the period of the refresh timer is shortened.

Figure 54:
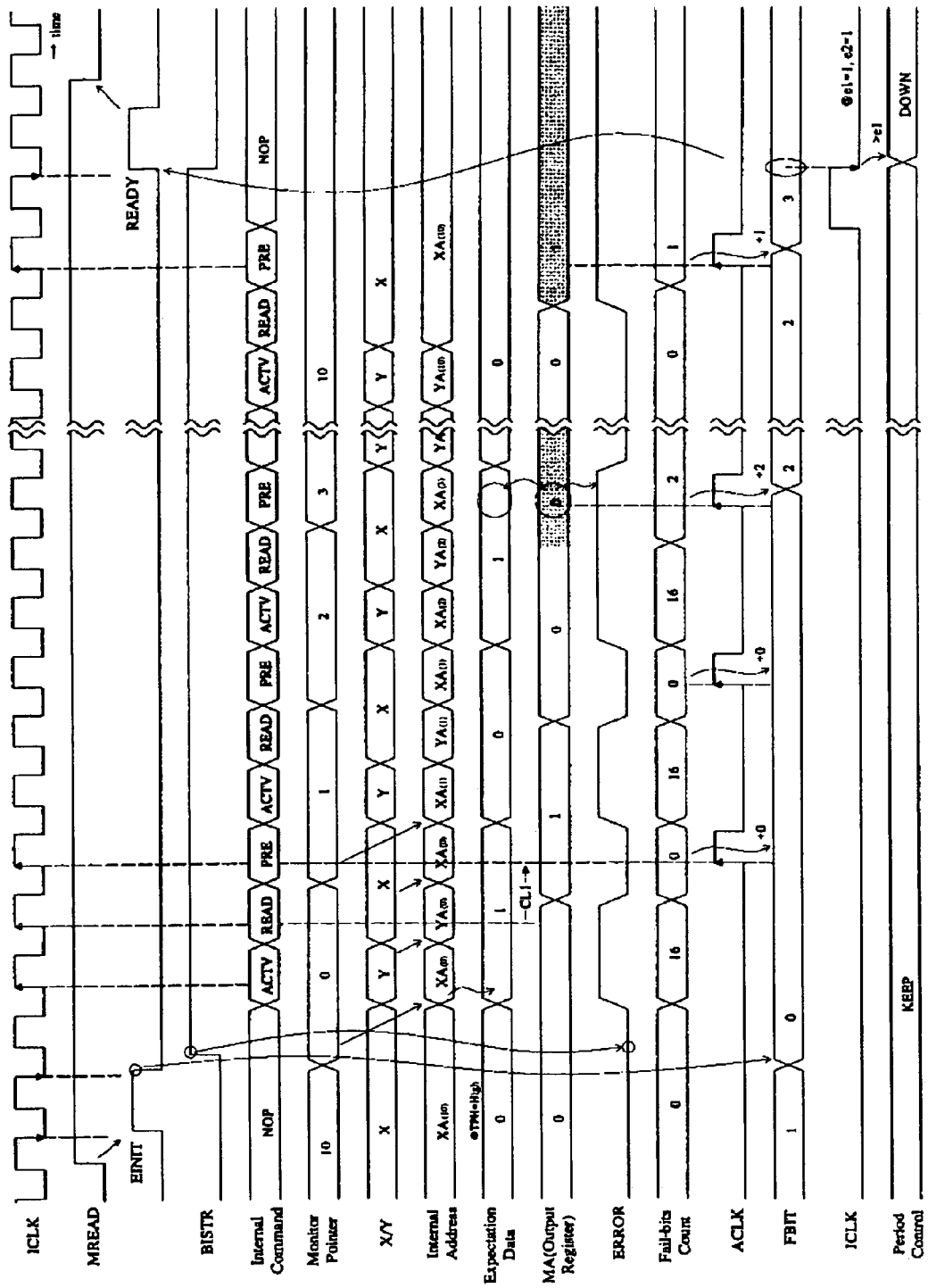
FIG. 54 shows a typical operating waveform of an ECC controller carrying a self refresh period error rate monitor control function.

FIG. 54 shows a typical operating waveform of the ECC controller 6 carrying out the error rate monitor control function of the self refresh period. The error rate counter circuit is configured as shown in FIG. 18 and, as the monitor bit address storage ROM (214 of FIG. 16 and 5006 of FIG. 50) is accessed, the internal command of the one-bit READ is repeated to give an error count. The FBIT is cleared to 0 by the initializing signal EINIT. The monitor pointer is an address pointer of the monitor bit address storage ROM. XY is a signal indicating whether the internal address is an X address or a Y address. With the command ACTV, XA(0), indicated by a monitor pointer of a monitor bit address storage ROM, is entered, and YA(0) of the monitor bit address storage ROM is provided by the command READ. The monitor bit data (MA), read at the latency CL1, is compared with the expected value (in this case, ERROR=0). A command PRE then is entered to pre-charge the bit line.

An X-address XA(1), associated with the monitor point 1, is entered by an ACTV command, a Y address YA(1) is entered with the READ command and the data (MA) of the monitor bit, read at the latency CL1, is compared with the expected value (in this case, ERROR=0). In this manner, the monitor bit of address (random) stored in a monitor bit address storage ROM (14 of FIG. 16 and 5006 of FIG. 50) is sequentially read from monitor point 0 to monitor point 10, by repeating a sequence of operations of ACTV, READ and PRE. After reading out 11 monitor pointers, FBIT is compared with e1 and e2. Since the FBIT of 3 is not less than e1, the DOWN signal is activated and the refresh timer period is shortened.

Figure 55:
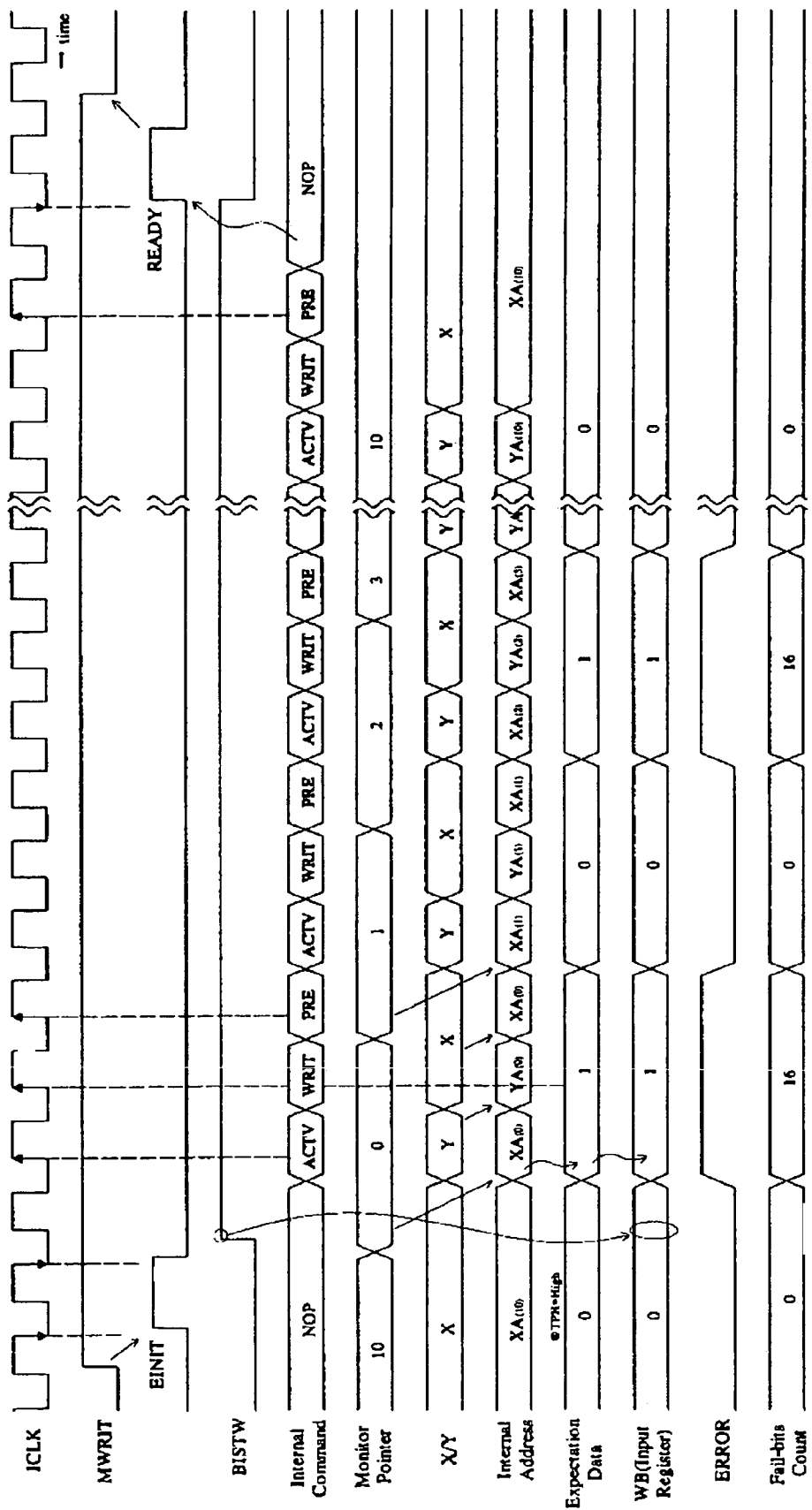
FIG. 55 shows a typical operating waveform of an ECC controller carrying a self refresh period error rate monitor control function.

FIG. 55 shows an example of an operating waveform of the ECC controller 6 carrying the control function for monitoring the error rate of the self refresh period, and shows the write operation to the monitor bits. As the monitor bit address storage ROM is accessed, the internal command of the 1-bit WRITE is repeatedly activated. The error rate calculating circuit is configured as shown in FIG. 18. An expected value is written in each monitor bit as the cycle of ACTV, WRIT and PRE is repeated for the address stored in the monitor bit address storage ROM 214.

Figure 56:
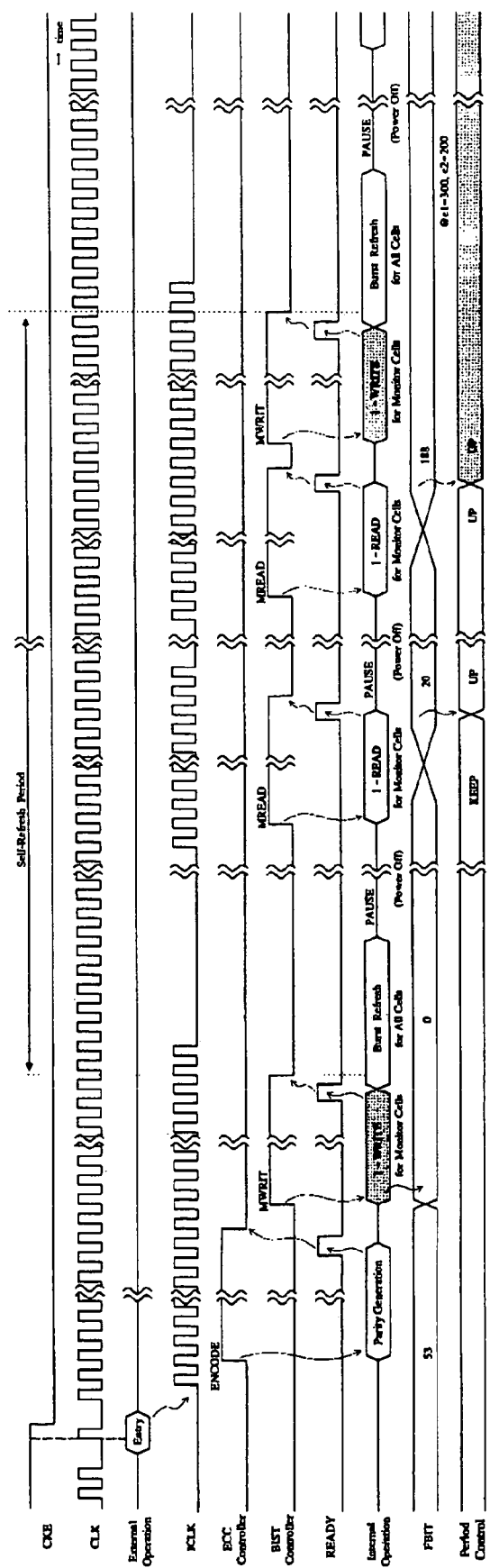
FIG. 56 shows a typical operating waveform (from entry to an SSR mode).

FIG. 56 shows a typical operating waveform for error rate monitor control and shows the SSR mode from entry. When the SSR entry command is entered, the signal ENCODE supplied to the ECC controller goes high to cause the ECC controller to initiate the ECC encoding operation. When the ECC encoding operation has come to a close, a JOB end signal (READY signal) is output as a pulse.

The MWRITE signal then goes high and the operation of writing '1' to the monitor bit area of, for example, 32 Kbits, starts.

After the end of the 11WRITE operation, an end signal (READY signal) is output, as in the encoding operation, and the operation of the ECC controller ceases.

The state of the chip changes in succession to all bit refresh pause period (internal power supply in cessation, power-off period).

After the pause period has come to a close, the MREAD signal supplied to the ECC controller goes high to cause the ECC controller to carry out IREAD operation and error count operation for the monitor bit area.

Since the error monitor period is one-half the refresh period, error count occurs twice during all bit refresh.

After the error count operation has come to a close, an end signal (READY signal) is output as a pulse to halt the operation.

Responsive to the result of the error rate count, the period control signal is changed UP/DOWN/KEEP.

In the present embodiment, the decision is for UP.

Then, transition is made 1WRITE operation all bit refresh pause period for the monitor bit area, in order to repeat the error monitor operation.

Figure 57:
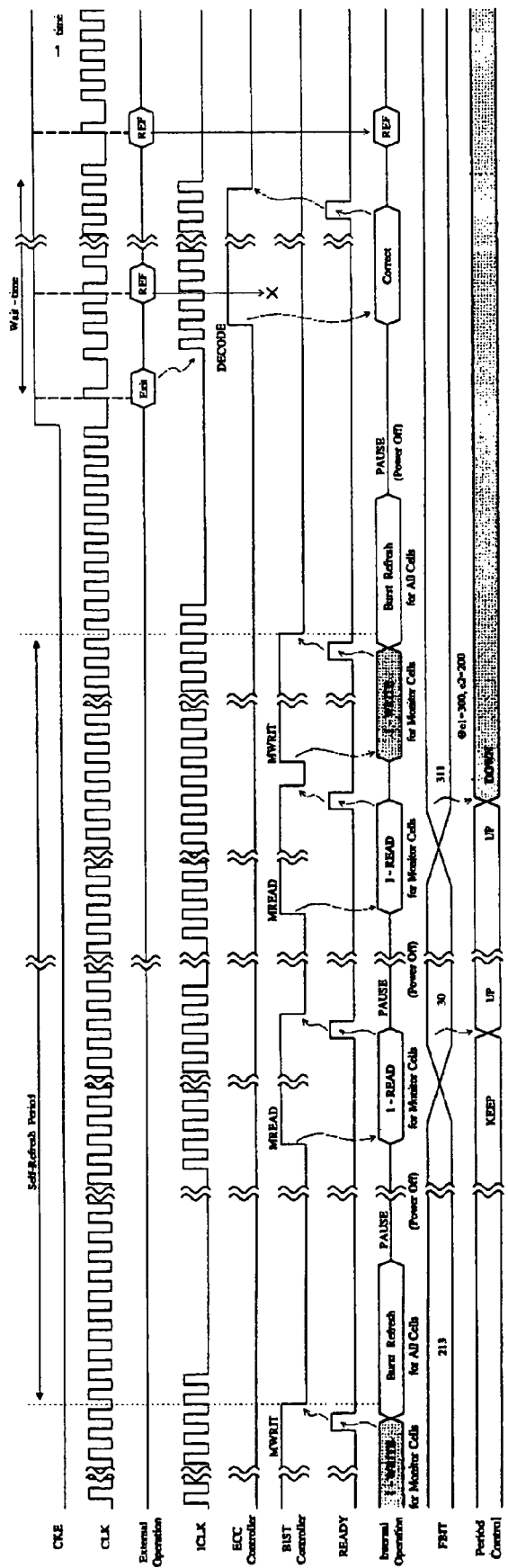
FIG. 57, continuing from FIG. 56, shows a typical operating waveform (from the SSR mode to exit)

FIG. 57 shows a typical operating waveform for error rate monitor control and specifically shows the operation at the time of exiting from the SSR mode (FIG. 57 continues from FIG. 56).

When an SSR exit command is entered, the operation is interrupted to transfer to the decoding operation (error correcting operation). The signal DECODE goes high with respect to the ECC controller. The error correction is carried out as the internal command and the internal address are controlled.

When the error correction has come to a close, an end signal (READY signal) is output as a pulse to go back to an Idle state (normal state) and to an external command accepting state.

The technique of the present invention is not limited to entry to the SSR mode, parity generation/storage by the ECC, refresh, pause, power on, exit or error correction and may naturally be applied to usual self-refresh not performing parity generation or error correction by the ECC circuit.

As pause refresh restoration bits, approximately 100 bits are provided. About 10 bits with the worst capability are used as monitor bits and the addresses thereof are recorded in a ROM circuit, such as a fuse circuit which is cut off by a laser. During the self refresh cycle, it is sufficient to carry out the control algorithm of the present embodiment (see FIGS. 7 to 10) for these ten monitor bits. Since the self refresh is the normal self refresh, the process of coding/decoding is unnecessary. Moreover, since there is no marked difference between the pause capability of the chip itself and the capability of the monitor bit, and usual bits are not in error, the setting of the error rate decision is e2=e1=1 bit failure (see FIG. 53). That is, if the FBIT is not less than 1, the refresh period is shortened. However, when the capability of the worst bit is monitored, such a chip in which the '0' failure becomes the worst bit is encountered with a non-negligible probability. It is therefore not advisable to simply extend the refresh period.

Meanwhile, in the case of usual self-refresh, the d.c. components cannot be decreased by power down of the internal power supply. Hence, the effect on low power dissipation tends to be saturated in approximately one second. Thus, when the period has reached e.g. 2 seconds, the period is no longer extended but is fixed.

With the present embodiment, the data retention current in the SSR mode dependent on ambient temperatures may be realized as the capability in a high temperature range as before is maintained, by ideal temperature compensation of the refresh period, such that the data retention current may be reduced to as low as 10 µA at ambient temperature. Although the present invention has been described with reference to the above-described embodiments, it is noted that the present invention is not limited to the configuration of these embodiments and may naturally comprise various changes or corrections that may occur to those skilled in the art within the scope of the invention. It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned.

What is claimed is:

1. A semiconductor memory device comprising:
    a memory array including a plurality of memory cells, each of said memory cells being in need of a refresh operation for retention of data;
    a circuit for writing preset data in predetermined plural memory cells, referred to as monitor cells, provided in said memory array;
    a circuit for performing control for reading data from said plural monitor cells, in which said preset data have been written, with the lapse of time equal to or shorter than a refresh period; and
    a circuit for comparing the data read from said monitor cell with said preset data to measure an error count or an error rate and for variably controlling the refresh period based on a measured result of said error count or the error rate,
    wherein
    preset data are written in a plurality of said monitor cells before or after the refreshing of said memory array; and
    data are read from said monitor cells after lapse of a predetermined time equal to or shorter than said refresh period;
    wherein said semiconductor memory device further comprises:
    a circuit for comparing said read data with said predetermined data to check the presence or absence of an error;
    a counter for counting said error; and
    a decision circuit for deciding, based on an output of said counter, whether the refresh period is to be elongated, shortened or maintained,
    wherein said decision circuit includes:
    a set value storage circuit for holding an upper limit value and a lower limit value of an error; and
    a comparator circuit outputting a keep-signal for maintaining the refresh period when the sum of said error counts for said monitor cells is intermediate between said upper and lower limit values;
    said comparator circuit outputting an up-signal for increasing said refresh period when the sum of said error counts exceeds said upper limit value,
    said comparator circuit outputting a down-signal for performing control to lower said refresh period when the sum of said error count is lower than said lower limit value,
    wherein said set value storage circuit includes:
    a non-volatile storage circuit for holding each of an upper limit value and a lower limit value;
    a counter for counting a test signal entered thereto; and
    a selector for selecting outputs of said counter and the non-volatile storage circuit; said selector outputting the value of said non-volatile storage circuit at the time of resetting.

2. The semiconductor memory device according to claim 1, wherein
    the period of measuring said error count or the error rate is set so as to be shorter than said refresh period; wherein
    error measurement is carried out by said circuit for comparing the data read from said monitor cell with said preset data a plural number of times during one refresh period and an error count is summed to a previous sum every time an error count is measured; and wherein
    said decision circuit gives a decision on whether or not said sum is within a desired predetermined setting range.

3. A semiconductor memory device comprising:
    a memory array including a plurality of memory cells, each of said memory cells being in need of a refresh operation for retention of data;
    a circuit for writing preset data in predetermined plural memory cells, referred to as monitor cells, provided in said memory array;
    a circuit for performing control for reading data from said plural monitor cells, in which said preset data have been written, with the lapse of time equal to or shorter than a refresh period;
    a circuit for comparing the data read from said monitor cell with said preset data to measure an error count or an error rate and for variably controlling the refresh period based on a measured result of said error count or the error rate,
    wherein
    said circuit for variably controlling the refresh period includes a timer circuit;
    said timer circuit including:
    a counter for counting a basic period supplied thereto;
    an adder for subtracting a preset value from a current output value on receipt of a command for shortening the refresh period and for adding a preset value to the current output value on receipt of a command for elongating the refresh period; and
    a comparator for receiving an output of said counter and an output value of said adder as a limit value;
    said comparator activating a monitor signal and outputting the activated monitor signal in case the counter output exceeds said limit value.

4. A method for controlling a refresh period for a semiconductor memory device, said method comprising:
    writing preset data in predetermined plural memory cells, referred to as monitor cells, provided in a memory array including a plurality of memory cells, each of said memory cells being in need of a refresh operation for retention of data;

reading data from said plural monitor cells, in which said preset data have been written, with the lapse of time equal to or shorter than a refresh period;

comparing said read data with said preset data to measure an error count or an error rate; and variably controlling the refresh period based on the measured result of said error count or error rate, wherein said semiconductor memory device include an ECC (error-checking and correction) encoding/decoding circuit; and wherein said method comprises the steps of:

(A0) reading data of said memory array at the time of entry to a data retention mode and generating check bits for error detection and correction by said ECC encoding decoding circuit for storage in a check area;

(A1) writing an expected value data '1' in said monitor cell;

(A2) refreshing all cells of said memory array;

(A3) making a pause during the refresh time;

(A4) reading data from said monitor cell and comparing the read data to the expected value data '1' to measure an error; and (A5) shortening the refresh period when said error rate is larger than a preset upper limit value, elongating the refresh period when said error rate is not larger than a preset lower limit value, and not changing the refresh period when said error rate is intermediate between said preset upper and lower limit values;

repeating the operations from (A1) to (A5) until exiting from said data retention mode; and (A6) carrying out error correction in said error detection correction encoding/decoding circuit, when exiting from the data retention mode, before proceeding to the normal operation.

5. The method according to claim 4, further comprising:

writing preset data in a plurality of said monitor cells before or after refresh of said memory array;

reading data from said monitor cells after lapse of preset time equal to or shorter than the refresh period;

comparing the read data with said preset data to judge the presence or absence of an error;

counting said error; and determining, based on the results of said error count, whether said refresh period is to be elongated, shortened or maintained.

6. A method for controlling a refresh period for a semiconductor memory device, said method comprising:

writing preset data in predetermined plural memory cells, referred to as monitor cells, provided in a memory array including a plurality of memory cells, each of said memory cells being in need of a refresh operation for retention of data;

reading data from said plural monitor cells, in which said preset data have been written, with the lapse of time equal to or shorter than a refresh period;

comparing said read data with said preset data to measure an error count or an error rate; and variably controlling the refresh period based on the measured result of said error count or error rate, wherein said semiconductor memory device include an ECC (error-checking and correction) encoding/decoding circuit; and wherein said method comprises the steps of:

(A0) reading data of said memory array at the time of entry to a data retention mode and generating check bits for error detection and correction by said ECC encoding/decoding circuit for storage in a check area;

(A1) writing an expected value data '1' in said monitor cell;

(A2) refreshing all cells of said memory array;

carrying out error check a number of times not larger than a preset number (m), with the pause period shorter than a refresh period;

(A3) making a pause during the refresh time;

(A4) reading data from said monitor cell and comparing said data to the expected value data '1' to measure an error; and (A5) shortening the refresh period when said error rate is larger than a preset upper limit value and not changing the refresh period and starting the processing as from (A1) when said error rate is intermediate between a preset upper limit value and a preset lower limit value;

(A6) elongating the refresh period if, after the end of m times of the error check operations, said error rate is not larger than a preset lower limit value;

repeating the operations of (A1) to (A6) until exiting said data retention mode; and (A7) carrying out error correction when exiting from the data retention mode, in said error detection correction encoding/decoding circuit, before proceeding to the normal operation.

7. A method for controlling a refresh period for a semiconductor memory device, said method comprising:

writing preset data in predetermined plural memory cells, referred to as monitor cells, provided in a memory array including a plurality of memory cells, each of said memory cells being in need of a refresh operation for retention of data;

reading data from said plural monitor cells, in which said preset data have been written, with the lapse of time equal to or shorter than a refresh period;

comparing said read data with said preset data to measure an error count or an error rate; and variably controlling the refresh period based on the measured result of said error count or error rate, wherein said semiconductor memory device include an ECC (error-checking and correction) encoding/decoding circuit; and wherein said method comprises the steps of:

(A0) reading data of said memory array at the time of entry to a data retention mode and generating check bits for error detection and correction by said ECC encoding/decoding circuit for storage in a check area;

(A1) refreshing all memory cells of said memory array;

shortening the pause period as compared with the refresh period;

(A2) judging whether or not an error check was carried out a preset number of times (m times);

(A3) writing '1' in the monitor cell;

(A4) pausing the operation for a preset pause period;

(A5) reading data from said monitor cell and comparing the read data to '1' to measure an error;

(A6) shortening the refresh period when said error rate is larger than a preset upper limit value, not changing the refresh period when said error rate is intermediate between said preset upper and lower values, and elongating said refresh period when said error rate is not larger than a preset lower limit value, for commencing the processing as from (A2) above;

(A7) carrying out the processing as from (A1) above on termination of m times of the error check operations;

repeating the operations from (A1) up to (A7) until exiting from the data retention mode; and (A8) carrying out error correction when exiting from the data retention mode, in said error detection correction encoding/decoding circuit, before proceeding to the normal operation.

8. A method for controlling a refresh period for a semiconductor memory device, said method comprising:
writing preset data in predetermined plural memory cells, referred to as monitor cells, provided in a memory array including a plurality of memory cells, each of said memory cells being in need of a refresh operation for retention of data;
reading data from said plural monitor cells, in which said preset data have been written, with the lapse of time equal to or shorter than a refresh period;
comparing said read data with said preset data to measure an error count or an error rate; and
variably controlling the refresh period based on the measured result of said error count or error rate,
wherein said semiconductor memory device include an ECC (error-checking and correction) encoding/decoding circuit; and wherein
said method comprises the steps of:
(A0) reading data of said memory array at the time of entry to a data retention mode and generating check bits for error detection and correction by said ECC encoding/decoding circuit for storage in a check area;
(A1) writing an expected value data '1' in said monitor cell;
(A2) refreshing all cells of said memory array;
shortening the pause period as compared with the refresh period;
(A3) judging whether or not error check has been carried out m times; in case the number of times of the error check is less than m,
(A4) making a pause during a pause period;
(A5) reading data from said monitor cell and comparing the read data to '1' to measure errors;
(A6) shortening the refresh period when said error rate is larger than a preset upper limit value, not changing the refresh period when said error rate is intermediate between said preset upper and lower values and elongating said refresh period when said error rate is not larger than a preset lower limit value, for commencing the processing as from (A2) above;
(A7) carrying out the processing as from (A1) above on termination of m times of the error check operations;
repeating the operations from (A1) up to (A7) until exiting from the data retention mode; and
(A8) carrying out said error detection correction encoding/decoding circuit, before proceeding to the normal operation.

* * * * *